United States Patent
Shafer et al.

(10) Patent No.: US 8,908,269 B2
(45) Date of Patent: *Dec. 9, 2014

(54) IMMERSION CATADIOPTRIC PROJECTION OBJECTIVE HAVING TWO INTERMEDIATE IMAGES

(71) Applicant: Carl Zeiss SMT GmbH, Oberkochen (DE)

(72) Inventors: David R. Shafer, Fairfield, CT (US); Wilhelm Ulrich, Aalen (DE); Aurelian Dodoc, Heidenheim (DE); Rudolf M. von Buenau, Jena (DE); Hans-Juergen Mann, Oberkochen (DE); Alexander Epple, Aalen (DE); Susanne Beder, Aalen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/143,060

(22) Filed: Dec. 30, 2013

(65) Prior Publication Data

US 2014/0111787 A1  Apr. 24, 2014

Related U.S. Application Data

(63) Continuation of application No. 13/470,956, filed on May 14, 2012, now Pat. No. 8,730,572, which is a
(Continued)

(51) Int. Cl.
*G02B 17/08* (2006.01)
(Continued)

(52) U.S. Cl.
CPC ........ *G02B 17/0804* (2013.01); *G02B 17/0812* (2013.01); *G03F 7/70958* (2013.01);
(Continued)

(58) Field of Classification Search
CPC ........... G02B 17/0812; G02B 17/0828; G02B 17/0896; G02B 13/143; G02B 13/18; G03B 27/68; G03B 27/70
USPC ......... 359/351, 355–357, 364, 365, 649, 651, 359/730, 858; 250/492.2; 355/66, 67, 71
See application file for complete search history.

(56) References Cited

U.S. PATENT DOCUMENTS

| | | | |
|---|---|---|---|
| 2,380,887 | A | 7/1945 | Warmisham |
| 3,244,073 | A | 4/1966 | Bouwers et al. |

(Continued)

FOREIGN PATENT DOCUMENTS

| | | |
|---|---|---|
| CN | 1452015 | 10/2003 |
| DE | 1064734 B | 9/1959 |

(Continued)

OTHER PUBLICATIONS

Petition for Inter Partes Review (IPR2013-00362) of Claims 1-3, 8-12, 16-20, 23-26, and 29-33 of United States Patent No. 7,348,575 Pursuant to 35 U.S.C. §§ 311-319, 37 C.F.R. § 42, filed Jun. 17, 2013.

(Continued)

*Primary Examiner* — Frank Font
(74) *Attorney, Agent, or Firm* — Fish & Richardson P.C.

(57) ABSTRACT

A catadioptric projection objective for imaging a pattern provided in an object plane of the projection objective onto an image plane of the projection objective has a first, refractive objective part for imaging the pattern provided in the object plane into a first intermediate image; a second objective part including at least one concave mirror for imaging the first Intermediate imaging into a second intermediate image; and a third, refractive objective part for imaging the second intermediate imaging onto the image plane; wherein the projection objective has a maximum lens diameter $D_{max}$, a maximum image field height Y', and an image side numerical aperture NA; wherein $COMP1=D_{max}/(Y'\cdot NA^2)$ and wherein the condition $COMP1<10$ holds.

30 Claims, 16 Drawing Sheets

Related U.S. Application Data continuation of application No. 11/653,366, filed on Jan. 16, 2007, now Pat. No. 8,208,198, which is a continuation-in-part of application No. PCT/EP2005/007431, filed on Jul. 8, 2005, said application No. 11/653,366 is a continuation-in-part of application No. 11/035,103, filed on Jan. 14, 2005, now Pat. No. 7,385,756.

(60) Provisional application No. 60/587,504, filed on Jul. 14, 2004, provisional application No. 60/591,775, filed on Jul. 27, 2004, provisional application No. 60/612,823, filed on Sep. 24, 2004, provisional application No. 60/617,674, filed on Oct. 13, 2004, provisional application No. 60/654,950, filed on Feb. 23, 2005, provisional application No. 60/536,248, filed on Jan. 14, 2004

(51) Int. Cl.
*G03F 7/20* (2006.01)
*G02B 21/02* (2006.01)
*G02B 21/33* (2006.01)
*G02B 13/22* (2006.01).

(52) U.S. Cl.
CPC ............ *G02B 21/02* (2013.01); *G03F 7/70225* (2013.01); *G02B 13/22* (2013.01); *G02B 17/08* (2013.01); *G03F 7/70275* (2013.01); *G02B 21/33* (2013.01); *G03F 7/70966* (2013.01); *G03F 7/70341* (2013.01); *G02B 17/0892* (2013.01); *G02B 17/0816* (2013.01)
USPC ........... 359/364; 359/365; 359/649; 359/730; 359/858; 250/492.2; 355/66

(56) References Cited

U.S. PATENT DOCUMENTS

| | | |
|---|---|---|
| 3,762,801 A | 10/1973 | Baker |
| 4,103,990 A | 8/1978 | Yamada |
| 4,171,871 A | 10/1979 | Dill et al. |
| 4,232,969 A | 11/1980 | Wilczynski |
| 4,241,390 A | 12/1980 | Markle et al. |
| 4,293,186 A | 10/1981 | Offner |
| 4,346,164 A | 8/1982 | Tabarelli et al. |
| 4,391,494 A | 7/1983 | Hershel |
| 4,398,809 A | 8/1983 | Canzek |
| 4,443,068 A | 4/1984 | Itoh |
| 4,469,414 A | 9/1984 | Shafer |
| 4,482,219 A | 11/1984 | Canzek |
| 4,595,295 A | 6/1986 | Wilczynski |
| 4,666,259 A | 5/1987 | Iizuka |
| 4,685,777 A | 8/1987 | Hirose |
| 4,701,035 A | 10/1987 | Hirose |
| 4,711,535 A | 12/1987 | Shafer |
| 4,757,354 A | 7/1988 | Sato et al. |
| 4,779,966 A | 10/1988 | Friedman |
| 4,812,028 A | 3/1989 | Matsumoto |
| 4,834,515 A | 5/1989 | Mercado |
| 4,861,148 A | 8/1989 | Sato et al. |
| 4,871,237 A | 10/1989 | Anzai et al. |
| 4,883,345 A | 11/1989 | Anzai et al. |
| 4,891,663 A | 1/1990 | Hirose |
| 4,951,078 A | 8/1990 | Okada |
| 4,953,960 A | 9/1990 | Williamson |
| 5,004,331 A | 4/1991 | Haseltine et al. |
| 5,031,976 A | 7/1991 | Shafer |
| 5,031,977 A | 7/1991 | Gibson |
| 5,052,763 A | 10/1991 | Singh et al. |
| 5,063,586 A | 11/1991 | Jewell et al. |
| 5,071,240 A | 12/1991 | Ichihara et al. |
| 5,078,502 A | 1/1992 | Cook |
| 5,089,913 A | 2/1992 | Singh et al. |
| 5,105,075 A | 4/1992 | Ohta et al. |
| 5,114,238 A | 5/1992 | Sigler |
| 5,153,898 A | 10/1992 | Suzuki et al. |
| 5,159,172 A | 10/1992 | Goodman et al. |
| 5,170,207 A | 12/1992 | Tezuka et al. |
| 5,212,588 A | 5/1993 | Viswanathan et al. |
| 5,212,593 A | 5/1993 | Williamson |
| 5,220,590 A | 6/1993 | Bruning et al. |
| 5,241,423 A | 8/1993 | Chiu et al. |
| 5,260,832 A | 11/1993 | Togino et al. |
| 5,289,312 A | 2/1994 | Hashimoto et al. |
| 5,315,629 A | 5/1994 | Jewell et al. |
| 5,323,263 A | 6/1994 | Schoenmakers |
| 5,353,322 A | 10/1994 | Bruning et al. |
| 5,401,934 A | 3/1995 | Ainsworth et al. |
| 5,410,434 A | 4/1995 | Shafer |
| 5,477,304 A | 12/1995 | Nishi |
| 5,488,229 A | 1/1996 | Elliott et al. |
| 5,515,207 A | 5/1996 | Foo |
| 5,537,260 A | 7/1996 | Williamson et al. |
| 5,575,207 A | 11/1996 | Shimizu |
| 5,592,329 A | 1/1997 | Ishiyama et al. |
| 5,608,526 A | 3/1997 | Piwonka-Corle et al. |
| 5,623,365 A | 4/1997 | Kuba |
| 5,636,066 A | 6/1997 | Takahashi |
| 5,650,877 A | 7/1997 | Phillips, Jr. et al. |
| 5,652,679 A | 7/1997 | Freeman |
| 5,684,636 A | 11/1997 | Chow et al. |
| 5,686,728 A | 11/1997 | Shafer |
| 5,691,802 A | 11/1997 | Takahashi |
| 5,694,241 A | 12/1997 | Ishiyama et al. |
| 5,717,518 A | 2/1998 | Shafer et al. |
| 5,729,376 A | 3/1998 | Hall et al. |
| 5,734,496 A | 3/1998 | Beach |
| 5,742,436 A | 4/1998 | Furter |
| 5,757,469 A | 5/1998 | Allen |
| 5,781,278 A | 7/1998 | Matsuzawa et al. |
| 5,793,473 A | 8/1998 | Koyama et al. |
| 5,802,335 A | 9/1998 | Sturlesi et al. |
| 5,805,346 A | 9/1998 | Tomimatsu |
| 5,805,357 A | 9/1998 | Omura et al. |
| 5,805,365 A | 9/1998 | Sweatt |
| 5,808,805 A | 9/1998 | Takahashi |
| 5,808,814 A | 9/1998 | Kudo |
| 5,815,310 A | 9/1998 | Williamson |
| 5,825,043 A | 10/1998 | Suwa |
| 5,831,770 A | 11/1998 | Matsuzawa et al. |
| 5,831,776 A | 11/1998 | Sasaya et al. |
| 5,835,275 A | 11/1998 | Takahashi et al. |
| 5,835,285 A | 11/1998 | Matsuzawa et al. |
| 5,856,884 A | 1/1999 | Mercado |
| 5,861,997 A | 1/1999 | Takahashi |
| 5,903,400 A | 5/1999 | Endo |
| 5,917,879 A | 6/1999 | Mashima |
| 5,930,049 A | 7/1999 | Suenaga et al. |
| 5,940,222 A | 8/1999 | Sinclair et al. |
| 5,943,172 A | 8/1999 | Sasaya et al. |
| 5,956,182 A | 9/1999 | Takahashi |
| 5,956,192 A | 9/1999 | Williamson |
| 5,969,803 A | 10/1999 | Mercado |
| 5,969,882 A | 10/1999 | Takahashi |
| 5,990,926 A | 11/1999 | Mercado |
| 5,999,310 A | 12/1999 | Shafer et al. |
| 6,008,884 A | 12/1999 | Yamaguchi et al. |
| 6,008,885 A | 12/1999 | Takashi et al. |
| 6,014,252 A | 1/2000 | Shafer |
| 6,014,455 A | 1/2000 | Sumiyoshi et al. |
| 6,033,079 A | 3/2000 | Hudyma |
| 6,084,724 A | 7/2000 | Wiegand et al. |
| 6,088,171 A | 7/2000 | Kudo |
| 6,097,537 A | 8/2000 | Takahashi et al. |
| 6,104,544 A | 8/2000 | Matsuzawa et al. |
| 6,142,641 A | 11/2000 | Cohen et al. |
| 6,157,497 A | 12/2000 | Kumazawa |
| 6,157,498 A | 12/2000 | Takahashi |
| 6,169,627 B1 | 1/2001 | Schuster |
| 6,169,637 B1 | 1/2001 | Tsunashima |
| 6,172,825 B1 | 1/2001 | Takahashi |
| 6,185,049 B1 | 2/2001 | Terada et al. |

(56) References Cited

U.S. PATENT DOCUMENTS

| | | |
|---|---|---|
| 6,188,513 B1 | 2/2001 | Hudyma et al. |
| 6,195,213 B1 | 2/2001 | Omura et al. |
| 6,198,576 B1 | 3/2001 | Matsuyama |
| 6,199,991 B1 | 3/2001 | Braat |
| 6,213,610 B1 | 4/2001 | Takahashi et al. |
| 6,229,595 B1 | 5/2001 | McKinley et al. |
| 6,244,717 B1 | 6/2001 | Dinger |
| 6,255,661 B1 | 7/2001 | Braat et al. |
| 6,259,508 B1 | 7/2001 | Shigematsu |
| 6,259,510 B1 | 7/2001 | Suzuki |
| 6,262,845 B1 | 7/2001 | Sweatt |
| 6,285,737 B1 | 9/2001 | Sweatt et al. |
| 6,349,005 B1 | 2/2002 | Schuster |
| 6,353,470 B1 | 3/2002 | Dinger |
| 6,361,176 B1 | 3/2002 | Mashima |
| 6,381,077 B1 | 4/2002 | Jeong et al. |
| 6,392,822 B1 | 5/2002 | Takahashi |
| 6,396,067 B1 | 5/2002 | Braat |
| 6,411,426 B1 | 6/2002 | Meehan et al. |
| 6,424,471 B1 | 7/2002 | Ulrich et al. |
| 6,426,506 B1 | 7/2002 | Hudyma |
| 6,451,507 B1 | 9/2002 | Suengaga et al. |
| 6,473,243 B1 | 10/2002 | Omura |
| 6,496,306 B1 | 12/2002 | Shafer et al. |
| 6,512,641 B2 | 1/2003 | Omura |
| 6,522,484 B1 | 2/2003 | Schuster |
| 6,538,821 B2 | 3/2003 | Takahashi |
| 6,556,648 B1 | 4/2003 | Bal et al. |
| 6,590,715 B2 | 7/2003 | Shafer et al. |
| 6,590,718 B2 | 7/2003 | Fuerter et al. |
| 6,600,550 B1 | 7/2003 | Shigematsu |
| 6,600,608 B1 | 7/2003 | Shafer et al. |
| 6,606,144 B1 | 8/2003 | Omura |
| 6,621,557 B2 | 9/2003 | Takahashi |
| 6,631,036 B2 | 10/2003 | Schuster |
| 6,636,350 B2 | 10/2003 | Shafer et al. |
| 6,639,734 B2 | 10/2003 | Omura |
| 6,646,718 B2 | 11/2003 | Schuster et al. |
| 6,665,126 B2 | 12/2003 | Shafer et al. |
| 6,707,616 B1 | 3/2004 | Takahashi et al. |
| 6,728,036 B2 | 4/2004 | Kleemann et al. |
| 6,731,374 B1 | 5/2004 | Sewell |
| 6,750,948 B2 | 6/2004 | Omura |
| 6,757,051 B2 | 6/2004 | Takahashi et al. |
| 6,765,729 B2 | 7/2004 | Perrin |
| 6,784,977 B2 | 8/2004 | Von Bünau et al. |
| 6,788,471 B2 | 9/2004 | Wagner et al. |
| 6,791,761 B2 | 9/2004 | Shafer et al. |
| 6,801,364 B2 | 10/2004 | Schuster |
| 6,806,942 B2 | 10/2004 | Schuster et al. |
| 6,813,098 B2 | 11/2004 | Mercado |
| 6,821,794 B2 | 11/2004 | Laursen et al. |
| 6,822,727 B2 | 11/2004 | Shima |
| 6,829,099 B2 | 12/2004 | Kato et al. |
| 6,842,277 B2 | 1/2005 | Watson |
| 6,842,298 B1 | 1/2005 | Shafer et al. |
| 6,863,403 B2 | 3/2005 | Mercado |
| 6,873,476 B2 | 3/2005 | Shafer et al. |
| 6,879,383 B2 | 4/2005 | Mercado |
| 6,891,596 B2 | 5/2005 | Rostalski et al. |
| 6,891,683 B2 | 5/2005 | Schuster |
| 6,894,834 B2 | 5/2005 | Mann et al. |
| 6,903,803 B2 | 6/2005 | Omura |
| 6,906,866 B2 | 6/2005 | Hudyma et al. |
| 6,909,492 B2 | 6/2005 | Omura |
| 6,912,042 B2 | 6/2005 | Shafer |
| 6,954,316 B2 | 10/2005 | Schuster |
| 6,995,833 B2 | 2/2006 | Kato et al. |
| 6,995,886 B2 | 2/2006 | Hendriks et al. |
| 6,995,918 B2 | 2/2006 | Terasawa |
| 6,995,930 B2 | 2/2006 | Shafer et al. |
| 7,006,304 B2 | 2/2006 | Epple et al. |
| 7,030,965 B2 | 4/2006 | Takahashi |
| 7,046,459 B1 | 5/2006 | Shafer et al. |
| 7,075,726 B2 | 7/2006 | Terasawa et al. |
| 7,079,314 B1 | 7/2006 | Suenaga et al. |
| 7,085,075 B2 | 8/2006 | Mann et al. |
| 7,092,168 B2 | 8/2006 | Terasawa et al. |
| 7,112,772 B2 | 9/2006 | Wagner et al. |
| 7,136,220 B2 | 11/2006 | Ulrich et al. |
| 7,187,503 B2 | 3/2007 | Rostalski et al. |
| 7,190,527 B2 | 3/2007 | Rostalski et al. |
| 7,190,530 B2 | 3/2007 | Mann et al. |
| 7,203,007 B2 | 4/2007 | Schuster |
| 7,203,010 B2 | 4/2007 | Epple et al. |
| 7,209,292 B2 | 4/2007 | Epple et al. |
| 7,218,445 B2 | 5/2007 | Shafer et al. |
| 7,218,453 B2 | 5/2007 | Shafer |
| 7,224,520 B2 | 5/2007 | Mitchell |
| 7,237,915 B2 | 7/2007 | Hudyma et al. |
| 7,239,450 B2 | 7/2007 | Kamenov et al. |
| 7,239,453 B2 | 7/2007 | Terasawa et al. |
| 7,256,932 B2 | 8/2007 | Epple et al. |
| 7,283,206 B2 | 10/2007 | Takahashi |
| 7,294,814 B2 | 11/2007 | Wagner et al. |
| 7,301,707 B2 | 11/2007 | Shafer et al. |
| 7,309,870 B2 | 12/2007 | Omura |
| 7,312,463 B2 | 12/2007 | Omura |
| 7,317,583 B2 | 1/2008 | Oskotsky et al. |
| 7,348,575 B2 | 3/2008 | Omura |
| 7,359,036 B2 | 4/2008 | Dodoc |
| 7,362,508 B2 | 4/2008 | Omura et al. |
| 7,385,756 B2 | 6/2008 | Shafer et al. |
| 7,385,764 B2 | 6/2008 | Shafer et al. |
| 7,426,082 B2 | 9/2008 | Shafer et al. |
| 7,428,105 B2 | 9/2008 | Shafer et al. |
| 7,463,422 B2 | 12/2008 | Kamenow |
| RE40,743 E | 6/2009 | Fuerter et al. |
| 7,697,198 B2 | 4/2010 | Shafer et al. |
| 8,107,162 B2 | 1/2012 | Dodoc et al. |
| 8,208,198 B2 | 6/2012 | Shafer et al. |
| 8,208,199 B2 | 6/2012 | Shafer et al. |
| 2001/0038446 A1 | 11/2001 | Takahashi |
| 2002/0019946 A1 | 2/2002 | Iwamura |
| 2002/0024741 A1 | 2/2002 | Terasawa et al. |
| 2002/0044260 A1 | 4/2002 | Takahashi et al. |
| 2002/0163629 A1 | 11/2002 | Switkes et al. |
| 2002/0176063 A1 | 11/2002 | Omura |
| 2002/0186359 A1 | 12/2002 | Meisburger et al. |
| 2003/0011755 A1 | 1/2003 | Omura et al. |
| 2003/0011894 A1 | 1/2003 | Schuster |
| 2003/0011896 A1 | 1/2003 | Shiraishi |
| 2003/0021040 A1 | 1/2003 | Epple et al. |
| 2003/0030916 A1 | 2/2003 | Suenaga |
| 2003/0058494 A1 | 3/2003 | Roberts et al. |
| 2003/0063268 A1 | 4/2003 | Kneer et al. |
| 2003/0174408 A1 | 9/2003 | Rostalski et al. |
| 2003/0197922 A1 | 10/2003 | Hudyma |
| 2003/0197945 A1 | 10/2003 | Kurata |
| 2003/0197946 A1 | 10/2003 | Omura |
| 2003/0206282 A1 | 11/2003 | Omura |
| 2003/0234912 A1 | 12/2003 | Omura |
| 2003/0234992 A1 | 12/2003 | Shafer |
| 2004/0009415 A1 | 1/2004 | Shigematsu et al. |
| 2004/0012866 A1 | 1/2004 | Mann et al. |
| 2004/0075894 A1 | 4/2004 | Shafer et al. |
| 2004/0125353 A1 | 7/2004 | Takahashi |
| 2004/0130805 A1 | 7/2004 | Mercado |
| 2004/0130806 A1 | 7/2004 | Takahashi |
| 2004/0160677 A1 | 8/2004 | Epple et al. |
| 2004/0165257 A1 | 8/2004 | Shafer et al. |
| 2004/0189956 A1 | 9/2004 | Kanayama et al. |
| 2004/0233405 A1 | 11/2004 | Kato et al. |
| 2004/0240047 A1 | 12/2004 | Shafer et al. |
| 2004/0263955 A1 | 12/2004 | Ulrich et al. |
| 2005/0036213 A1 | 2/2005 | Mann et al. |
| 2005/0117224 A1 | 6/2005 | Shafer et al. |
| 2005/0179994 A1 | 8/2005 | Webb |
| 2005/0185269 A1 | 8/2005 | Epple et al. |
| 2005/0190435 A1 | 9/2005 | Shafer et al. |
| 2005/0225737 A1 | 10/2005 | Weissenrieder et al. |
| 2005/0248856 A1 | 11/2005 | Omura et al. |
| 2006/0012885 A1 | 1/2006 | Beder et al. |
| 2006/0028715 A1 | 2/2006 | Kato et al. |

(56) References Cited

U.S. PATENT DOCUMENTS

| | | | |
|---|---|---|---|
| 2006/0056064 A1 | 3/2006 | Shafer et al. | |
| 2006/0066962 A1 | 3/2006 | Totzeck et al. | |
| 2006/0077366 A1 | 4/2006 | Shafer | |
| 2006/0082904 A1 | 4/2006 | Kato et al. | |
| 2006/0082905 A1 | 4/2006 | Shafer et al. | |
| 2006/0088320 A1 | 4/2006 | Katashiba et al. | |
| 2006/0092395 A1 | 5/2006 | Mercado | |
| 2006/0098298 A1 | 5/2006 | Kato et al. | |
| 2006/0109559 A1 | 5/2006 | Hudyma et al. | |
| 2006/0119750 A1 | 6/2006 | Epple et al. | |
| 2006/0121364 A1 | 6/2006 | Omura | |
| 2006/0126048 A1 | 6/2006 | Sumiyoshi | |
| 2006/0132931 A1 | 6/2006 | Epple et al. | |
| 2006/0158615 A1 | 7/2006 | Williamson | |
| 2006/0171040 A1 | 8/2006 | Mann et al. | |
| 2006/0198018 A1 | 9/2006 | Shafer et al. | |
| 2006/0198029 A1 | 9/2006 | Schuster | |
| 2006/0221456 A1 | 10/2006 | Shafer et al. | |
| 2006/0238732 A1 | 10/2006 | Mercado | |
| 2006/0244938 A1 | 11/2006 | Schuster | |
| 2006/0256447 A1 | 11/2006 | Dodoc | |
| 2006/0268253 A1 | 11/2006 | Dodoc | |
| 2007/0013882 A1 | 1/2007 | Dodoc et al. | |
| 2007/0019170 A1 | 1/2007 | Rostalski et al. | |
| 2007/0024960 A1 | 2/2007 | Omura | |
| 2007/0037079 A1 | 2/2007 | Omura | |
| 2007/0037080 A1 | 2/2007 | Omura | |
| 2007/0091451 A1 | 4/2007 | Schuster | |
| 2007/0109659 A1 | 5/2007 | Rostalski et al. | |
| 2007/0165198 A1 | 7/2007 | Kneer et al. | |
| 2007/0171547 A1 | 7/2007 | Shafer et al. | |
| 2007/0195423 A1 | 8/2007 | Kamenov et al. | |
| 2007/0236674 A1 | 10/2007 | Shafer et al. | |
| 2007/0252094 A1 | 11/2007 | Ulrich et al. | |
| 2007/0258152 A1 | 11/2007 | Rostalski et al. | |
| 2007/0268594 A1 | 11/2007 | Dodoc et al. | |
| 2007/0297047 A1 | 12/2007 | Yuuki et al. | |
| 2007/0297072 A1 | 12/2007 | Omura | |
| 2008/0002265 A1 | 1/2008 | Epple | |
| 2008/0007822 A1 | 1/2008 | Dodoc | |
| 2008/0037111 A1 | 2/2008 | Shafer et al. | |
| 2008/0037112 A1 | 2/2008 | Ulrich et al. | |
| 2008/0055740 A1 | 3/2008 | Wagner et al. | |
| 2008/0080067 A1 | 4/2008 | Omura | |
| 2008/0117400 A1 | 5/2008 | Rostalski et al. | |
| 2008/0118849 A1 | 5/2008 | Chandhok et al. | |
| 2008/0151364 A1 | 6/2008 | Shafer et al. | |
| 2008/0151365 A1 | 6/2008 | Shafer et al. | |
| 2008/0186567 A1 | 8/2008 | Shafer et al. | |
| 2008/0212170 A1 | 9/2008 | Shafer et al. | |
| 2008/0285121 A1 | 11/2008 | Shafer et al. | |
| 2008/0297889 A1 | 12/2008 | Shafer et al. | |
| 2009/0021712 A1 | 1/2009 | Kumazawa et al. | |
| 2009/0080068 A1 | 3/2009 | Ozawa | |
| 2011/0002032 A1* | 1/2011 | Omura | 359/364 |
| 2012/0092760 A1* | 4/2012 | Omura | 359/365 |

FOREIGN PATENT DOCUMENTS

| | | |
|---|---|---|
| DE | 1 447 207 | 12/1968 |
| DE | 196 36 586 | 7/1997 |
| DE | 197 26 058 | 1/1998 |
| DE | 197 43 236 | 4/1998 |
| DE | 198 22 510 | 11/1999 |
| DE | 198 55 108 | 5/2000 |
| DE | 199 42 281 | 11/2000 |
| DE | 103 04 599 | 11/2003 |
| DE | 103 32 112 | 1/2005 |
| DE | 10 2006 021 161 | 11/2006 |
| DE | 102005056721 | 11/2006 |
| DE | 10 2006 028 242 | 1/2007 |
| DE | 10 2005 033 564 | 2/2007 |
| DE | 10 2006 028 222 | 12/2007 |
| EP | 98043 | 1/1984 |
| EP | 200011 | 11/1986 |
| EP | 203251 | 12/1986 |
| EP | 203397 | 12/1986 |
| EP | 203408 | 12/1986 |
| EP | 204029 | 12/1986 |
| EP | 204086 | 12/1986 |
| EP | 205006 | 12/1986 |
| EP | 205021 | 12/1986 |
| EP | 0267766 | 5/1988 |
| EP | 269868 | 7/1992 |
| EP | 0 523 303 | 1/1993 |
| EP | 0 332 201 | 6/1994 |
| EP | 0 604 093 | 6/1994 |
| EP | 0 712 019 | 5/1996 |
| EP | 0 717 299 | 6/1996 |
| EP | 0 732 605 | 9/1996 |
| EP | 0 736 789 | 10/1996 |
| EP | 0 779 528 | 6/1997 |
| EP | 0 816 892 | 1/1998 |
| EP | 0 828 172 | 3/1998 |
| EP | 0 869 383 | 10/1998 |
| EP | 0951054 | 10/1999 |
| EP | 0962830 | 12/1999 |
| EP | 0 989 434 | 3/2000 |
| EP | 1 037 267 | 9/2000 |
| EP | 1 061 396 | 12/2000 |
| EP | 1059550 | 12/2000 |
| EP | 1 067 448 | 1/2001 |
| EP | 1 069 448 | 1/2001 |
| EP | 1098215 | 5/2001 |
| EP | 1 141 781 | 10/2001 |
| EP | 1 191 378 | 3/2002 |
| EP | 1 227 354 | 7/2002 |
| EP | 1 235 091 | 8/2002 |
| EP | 1 235 092 | 8/2002 |
| EP | 1 237 043 | 9/2002 |
| EP | 1 245 984 | 10/2002 |
| EP | 1 279 984 | 1/2003 |
| EP | 1318425 | 6/2003 |
| EP | 1336887 | 8/2003 |
| EP | 1 434 093 | 6/2004 |
| EP | 1 450 196 | 8/2004 |
| EP | 1 450 209 | 8/2004 |
| EP | 1 480 065 | 11/2004 |
| EP | 1 720 069 | 11/2006 |
| EP | 1 751 601 | 2/2007 |
| EP | 1 927 891 | 6/2008 |
| EP | 1 936 421 | 6/2008 |
| EP | 2 189 848 | 5/2010 |
| GB | 2 428 491 | 1/2007 |
| JP | 5-175098 | 7/1993 |
| JP | 6-188169 | 7/1994 |
| JP | 8-166542 | 6/1995 |
| JP | 8-330220 | 12/1996 |
| JP | 9-148241 | 6/1997 |
| JP | 9-246179 | 9/1997 |
| JP | 10-39208 | 2/1998 |
| JP | 10-163099 | 6/1998 |
| JP | 10-214783 | 8/1998 |
| JP | 10-284408 | 10/1998 |
| JP | 10-303114 | 11/1998 |
| JP | 10-325922 | 12/1998 |
| JP | 2000-058436 | 2/2000 |
| JP | 2000-505958 | 5/2000 |
| JP | 2001-166210 | 6/2001 |
| JP | 2001-228401 | 8/2001 |
| JP | 3246615 | 11/2001 |
| JP | 2002-072080 | 3/2002 |
| JP | 2002-116382 | 4/2002 |
| JP | 2002-208551 | 7/2002 |
| JP | 2002-277742 | 9/2002 |
| JP | 2002-372668 | 12/2002 |
| JP | 2003-015040 | 1/2003 |
| JP | 2003-114387 | 4/2003 |
| JP | 2003-233001 | 8/2003 |
| JP | 2003-233009 | 8/2003 |
| JP | 2003-241099 | 8/2003 |
| JP | 2003-307680 | 10/2003 |
| JP | 2003-532138 | 10/2003 |

(56) References Cited

FOREIGN PATENT DOCUMENTS

| | | |
|---|---|---|
| JP | 2004-004415 | 1/2004 |
| JP | 2004-023020 | 1/2004 |
| JP | 2004-029458 | 1/2004 |
| JP | 2004-029625 | 1/2004 |
| JP | 2004-170869 | 6/2004 |
| JP | 2004-205698 | 7/2004 |
| JP | 2004-219501 | 8/2004 |
| JP | 2004-235666 | 8/2004 |
| JP | 2004-252119 | 9/2004 |
| JP | 2004-252362 | 9/2004 |
| JP | 2004-259844 | 9/2004 |
| JP | 2004-317534 | 11/2004 |
| JP | 2004-333761 | 11/2004 |
| JP | 2004-335746 | 11/2004 |
| JP | 2004-354555 | 12/2004 |
| JP | 2005-003982 | 1/2005 |
| JP | 2005-107362 | 4/2005 |
| JP | 2005-114881 | 4/2005 |
| JP | 2005-195713 | 7/2005 |
| JP | 2005-257740 | 9/2005 |
| JP | 2006-019563 | 1/2006 |
| JP | 2006-086141 | 3/2006 |
| JP | 2006-184709 | 7/2006 |
| JP | 2006-267383 | 10/2006 |
| JP | 2007-027438 | 2/2007 |
| JP | 2007-079015 | 3/2007 |
| JP | 2007-206319 | 8/2007 |
| JP | 2007-305821 | 11/2007 |
| JP | 2009-025737 | 2/2009 |
| JP | 2009-145724 | 7/2009 |
| SU | 124665 | 11/1959 |
| TW | 340189 | 9/1998 |
| TW | 529080 | 4/2003 |
| TW | 559674 | 11/2003 |
| WO | WO 92/05462 | 4/1992 |
| WO | WO 94/06047 | 3/1994 |
| WO | WO 98/28665 | 7/1998 |
| WO | WO 99/26097 | 5/1999 |
| WO | WO 99/42905 | 8/1999 |
| WO | WO 99/57596 | 11/1999 |
| WO | WO 01/04682 | 1/2001 |
| WO | WO 01/51979 | 7/2001 |
| WO | WO 01/55767 | 8/2001 |
| WO | WO 01/59502 | 8/2001 |
| WO | WO 01/65296 | 9/2001 |
| WO | WO 02/35273 | 5/2002 |
| WO | WO 02/082159 | 10/2002 |
| WO | WO 02/103431 | 12/2002 |
| WO | WO 03/003636 | 1/2003 |
| WO | WO 03/036361 | 5/2003 |
| WO | WO 03/052462 | 6/2003 |
| WO | WO 03/052482 | 6/2003 |
| WO | WO 03/075096 | 9/2003 |
| WO | WO 03/088330 | 10/2003 |
| WO | WO 2004/010200 | 1/2004 |
| WO | WO 2004/019128 | 3/2004 |
| WO | WO 2004/053534 | 6/2004 |
| WO | WO 2004/084281 | 9/2004 |
| WO | WO 2004/092801 | 10/2004 |
| WO | WO 2004/097911 | 11/2004 |
| WO | WO 2004/107011 | 12/2004 |
| WO | WO 2005/001543 | 1/2005 |
| WO | WO 2005/001544 | 1/2005 |
| WO | WO 2005/015316 | 2/2005 |
| WO | WO 2005/040890 | 5/2005 |
| WO | WO 2005/050321 | 6/2005 |
| WO | WO 2005/054956 | 6/2005 |
| WO | WO 2005/059654 | 6/2005 |
| WO | WO 2005/059055 | 7/2005 |
| WO | WO 2005/069055 | 7/2005 |
| WO | WO 2005/096098 | 10/2005 |
| WO | WO 2005/098504 | 10/2005 |
| WO | WO 2005/098505 | 10/2005 |
| WO | WO 2005/098506 | 10/2005 |
| WO | WO 2005/111689 | 11/2005 |
| WO | WO 2006/005547 | 1/2006 |
| WO | WO 2006/013734 | 2/2006 |
| WO | WO 2006/043457 | 4/2006 |
| WO | WO 2006/051689 | 5/2006 |
| WO | WO 2006/064728 | 6/2006 |
| WO | WO 2006/069795 | 7/2006 |
| WO | WO 2006/080212 | 8/2006 |
| WO | WO 2006/121008 | 11/2006 |
| WO | WO 2006/121009 | 11/2006 |
| WO | WO 2006/131242 | 12/2006 |
| WO | WO 2006/131258 | 12/2006 |
| WO | WO 2007/020004 | 2/2007 |
| WO | WO 2007/025643 | 3/2007 |
| WO | WO 2007/031544 | 3/2007 |
| WO | WO 2007/071565 | 6/2007 |
| WO | WO 2007/071569 | 6/2007 |
| WO | WO 2007/086220 | 8/2007 |
| WO | WO 2007/091463 | 8/2007 |
| WO | WO 2007/094198 | 8/2007 |
| WO | WO 2007/114024 | 10/2007 |
| WO | WO 2007/119292 | 10/2007 |
| WO | WO 2007/131161 | 11/2007 |
| WO | WO 2007/140663 | 12/2007 |
| WO | WO 2008/006265 | 1/2008 |
| WO | WO 2008/019803 | 2/2008 |
| WO | WO 2008/064845 | 6/2008 |
| WO | WO 2008/087827 | 7/2008 |
| WO | WO 2008/130044 | 10/2008 |

OTHER PUBLICATIONS

Expert report from IPR of US 7,348,575 (IPR2013-00362), Expert Declaration of Richard C. Juergens, filed Jun. 17, 2013.

Zeiss Exhibit 1001 from IPR of US 7,348,575 (IPR2013-00362), filed Jun. 17, 2013, U.S. Patent No. 7,348,575 ("the Omura Patent").

Zeiss Exhibit 1002 from IPR of US 7,348,575 (IPR2013-00362), filed Jun. 17, 2013, U.S. Patent No. 7,309,870 ("the Omura '870 Patent").

Zeiss Exhibit 1003 from IPR of US 7,348,575 (IPR2013-00362), filed Jun. 17, 2013, Judgment, Paper No. 49, Interference No. 105,678 ("the '678 Judgment").

Zeiss Exhibit 1004 from IPR of US 7,348,575 (IPR2013-00362), filed Jun. 17, 2013, Judgment, Paper No. 157, Interference No. 105,749 ("the '749 Judgment").

Zeiss Exhibit 1005 from IPR of US 7,348,575 (IPR2013-00362), filed Jun. 17, 2013, Judgment, Paper No. 41, Interference No. 105,753 ("the '753 Judgment").

Zeiss Exhibit 1006 from IPR of US 7,348,575 (IPR2013-00362), filed Jun. 17, 2013, Judgment, Paper No. 291, Interference No. 105,834 ("the '834 Judgment").

Zeiss Exhibit 1007 from IPR of US 7,348,575 (IPR2013-00362), filed Jun. 17, 2013, PCT Patent Publication WO 02/035273 ("Takahashi PCT").

Zeiss Exhibit 1008 from IPR of US 7,348,575 (IPR2013-00362), filed Jun. 17, 2013, US Patent Application Publication No. US 2002/0024741 A1 ("Terasawa").

Zeiss Exhibit 1009 from IPR of US 7,348,575 (IPR2013-00362), filed Jun. 17, 2013, US Patent No. 5,825,043 ("Suwa").

Zeiss Exhibit 1010 from IPR of US 7,348,575 (IPR2013-00362), filed Jun. 17, 2013, M. Switkes and M. Rothschild, "Resolution Enhancement of 157 nm Lithography by Liquid Immersion," Proc. SPIE vol. 4691, pp. 460-465 (2002) ("Switkes").

Zeiss Exhibit 1011 from IPR of US 7,348,575 (IPR2013-00362), filed Jun. 17, 2013, Willi Ulrich et al., "The Development of Dioptric Projection Lenses for DUV Lithography," Proc. SPIE vol. 4832, pp. 158-169 (2002) ("Ulrich").

Zeiss Exhibit 1012 from IPR of US 7,348,575 (IPR2013-00362), filed Jun. 17, 2013, PCT Patent Publication WO 99/49504 ("Fukami JP").

Zeiss Exhibit 1013 from IPR of US 7,348,575 (IPR2013-00362), filed Jun. 17, 2013, Satori Asai et al., "Resolution Limit for Optical Lithography Using Polarized Light Illumination," Jpn. J. Appl. Phys. vol. 32, pp. 5863-5866 (1993) ("Asai").

Zeiss Exhibit 1014 from IPR of US 7,348,575 (IPR2013-00362), filed Jun. 17, 2013, European Patent Application Publication No. EP 1 336 887 A1 ("Takahashi").

(56) References Cited

OTHER PUBLICATIONS

Zeiss Exhibit 1015 from IPR of US 7,348,575 (IPR2013-00362), filed Jun. 17, 2013, Certified English translation of PCT Patent Publication WO 99/49504 ("Fukami").
Zeiss Exhibit 1016 from IPR of US 7,348,575 (IPR2013-00362), filed Jun. 17, 2013, Expert Declaration of Richard C. Juergens.
Zeiss Exhibit 1017 from IPR of US 7,348,575 (IPR2013-00362), filed Jun. 17, 2013,Wikipedia, "Optical Power," https://en.wikipedia.org/wiki/Optical_power (downloaded May 20, 2013).
Zeiss Exhibit 1018 from IPR of US 7,348,575 (IPR2013-00362), filed Jun. 17, 2013,Willi Ulrich et al., "Trends in Optical Design of Projection Lenses for UV- and EUV-Lithography," Proc. SPIE vol. 4146, pp. 13-24 (2000) ("Ulrich 2000").
Zeiss Exhibit 1019 from IPR of US 7,348,575 (IPR2013-00362), filed Jun. 17, 2013, Eugene Hecht, Optics ($4^{th}$ ed.), Addison Wesley (2002), pp. 171-173.
Zeiss Exhibit 1020 from IPR of US 7,348,575 (IPR2013-00362), filed Jun. 17, 2013,Wikipedia, "Optical Axis," https://en.wikipedia.org/wiki/Optical_axis (downloaded May 20, 2013).
Zeiss Exhibit 1021 from IPR of US 7,348,575 (IPR2013-00362), filed Jun. 17, 2013,File History Excerpts from U.S. Appl. No. 11/266,288 ("the Omura Application").
Zeiss Exhibit 1022 from IPR of US 7,348,575 (IPR2013-00362), filed Jun. 17, 2013, File History Excerpts from U.S. Appl. No. 11/513,160 ("the Omura Continuation Application").
Zeiss Exhibit 1023 from IPR of US 7,348,575 (IPR2013-00362), filed Jun. 17, 2013, Decision, Paper No. 40, Interference No. 105,753 (the "753 Decision").
Zeiss Exhibit 1024 from IPR of US 7,348,575 (IPR2013-00362), filed Jun. 17, 2013,Wikipedia, "Refractive Index," http://en.wikipedia.org/wiki/Refractive_index (downloaded May 20, 2013).
Zeiss Exhibit 1025 from IPR of US 7,348,575 (IPR2013-00362), filed Jun. 17, 2013, U.S. Patent No. 4,346,164 ("Tabarelli").
Zeiss Exhibit 1026 from IPR of US 7,348,575 (IPR2013-00362), filed Jun. 17, 2013,Omura Reply 1, Paper No. 200, Interference No. 105,834.
Zeiss Exhibit 1027 from IPR of US 7,348,575 (IPR2013-00362), filed Jun. 17, 2013, European Patent Application Publication No. EP 1 069 448 B1 ("Suenaga").
Zeiss Exhibit 1028 from IPR of US 7,348,575 (IPR2013-00362), filed Jun. 17, 2013, Curriculum Vitae of Richard C. Juergens.
Zeiss Exhibit 1029 from IPR of US 7,348,575 (IPR2013-00362), Code V sequence data, filed Jun. 17, 2013.
Petition for Inter Partes Review (IPR2013-00363) of Claims 55-67 of United States Patent No. 7,348,575 Pursuant to 35 U.S.C. §§ 311-319, 37 C.F.R. § 42, filed Jun. 17, 2013.
Expert report from IPR of US 7,348,575 (IPR2013-00363), Expert Declaration of Richard C. Juergens, filed Jun. 17, 2013.
Zeiss Exhibit 1101 from IPR of US 7,348,575 (IPR2013-00363), filed Jun. 17, 2013, U.S. Patent No. 7,348,575 ("the Omura Patent").
Zeiss Exhibit 1102 from IPR of US 7,348,575 (IPR2013-00363), filed Jun. 17, 2013, U.S. Patent No. 7,309,870 ("the Omura '870 Patent").
Zeiss Exhibit 1103 from IPR of US 7,348,575 (IPR2013-00363), filed Jun. 17, 2013, Judgment, Paper No. 49, Interference No. 105,678 ("the '678 Judgment").
Zeiss Exhibit 1104 from IPR of US 7,348,575 (IPR2013-00363), filed Jun. 17, 2013, Judgment, Paper No. 157, Interference No. 105,749 ("the '749 Judgment").
Zeiss Exhibit 1105 from IPR of US 7,348,575 (IPR2013-00363), filed Jun. 17, 2013, Judgment, Paper No. 41, Interference No. 105,753 ("the '753 Judgment").
Zeiss Exhibit 1106 from IPR of US 7,348,575 (IPR2013-00363), filed Jun. 17, 2013, Judgment, Paper No. 291, Interference No. 105,834 ("the '834 Judgment").
Zeiss Exhibit 1107 from IPR of US 7,348,575 (IPR2013-00363), filed Jun. 17, 2013, Certified English Translation of Japanese Unexamined Patent Publication No. JP 2003-128154.
Zeiss Exhibit 1108 from IPR of US 7,348,575 (IPR2013-00363), filed Jun. 17, 2013, Certified English Translation of Japanese Unexamined Patent Publication JP 2003-350647.
Zeiss Exhibit 1109 from IPR of US 7,348,575 (IPR2013-00363), filed Jun. 17, 2013, Certified English Translation of Japanese Unexamined Patent Publication JP 2003-364596.
Zeiss Exhibit 1110 from IPR of US 7,348,575 (IPR2013-00363), filed Jun. 17, 2013, US Patent Application Publication No. US 2005/0036213 ("Mann").
Zeiss Exhibit 1111 from IPR of US 7,348,575 (IPR2013-00363), filed Jun. 17, 2013, JP Patent Application Publication No. JP 2003-114387.
Zeiss Exhibit 1112 from IPR of US 7,348,575 (IPR2013-00363), filed Jun. 17, 2013, Certified English Translation of JP Patent Application Publication No. JP 2003-114387 ("Omura '387").
Zeiss Exhibit 1113 from IPR of US 7,348,575 (IPR2013-00363), filed Jun. 17, 2013, PCT Patent Publication WO 02/035273 ("Takahashi PCT").
Zeiss Exhibit 1114 from IPR of US 7,348,575 (IPR2013-00363), filed Jun. 17, 2013, European Patent Application Publication No. EP 1 336 887 A1 ("Takahashi").
Zeiss Exhibit 1115 from IPR of US 7,348,575 (IPR2013-00363), filed Jun. 17, 2013, Satori Asai et al., "Resolution Limit for Optical Lithography Using Polarized Light Illumination," Jpn. J. Appl. Phys. vol. 32, pp. 5863-5866 (1993) ("Asai").
Zeiss Exhibit 1116 from IPR of US 7,348,575 (IPR2013-00363), filed Jun. 17, 2013, Expert Declaration of Richard C. Juergens.
Zeiss Exhibit 1117 from IPR of US 7,348,575 (IPR2013-00363), filed Jun. 17, 2013, Wikipedia, "Optical Power," https://en.wikipedia.org/wiki/Optical_power (downloaded May 20, 2013).
Zeiss Exhibit 1118 from IPR of US 7,348,575 (IPR2013-00363), filed Jun. 17, 2013, Willi Ulrich et al., "The Development of Dioptric Projection Lenses for DUV Lithography," Proc. SPIE vol. 4832, pp. 158-169 (2002) ("Ulrich").
Zeiss Exhibit 1119 from IPR of US 7,348,575 (IPR2013-00363), filed Jun. 17, 2013, Eugene Hecht, Optics ($4^{th}$ ed.), Addison Wesley (2002), pp. 171-173.
Zeiss Exhibit 1120 from IPR of US 7,348,575 (IPR2013-00363), filed Jun. 17, 2013, Wikipedia, "Optical Axis," https://en.wikipedia.org/wiki/Optical_axis (downloaded May 20, 2013).
Zeiss Exhibit 1121 from IPR of US 7,348,575 (IPR2013-00363), filed Jun. 17, 2013, New World Dictionary of the American Language, Second College Edition, p. 1552, Simon and Schuster (1980).
Zeiss Exhibit 1122 from IPR of US 7,348,575 (IPR2013-00363), filed Jun. 17, 2013, File History Excerpts from U.S. Appl. No. 11/266,288 ("Omura Application").
Zeiss Exhibit 1123 from IPR of US 7,348,575 (IPR2013-00363), filed Jun. 17, 2013, filed Jun. 17, 2013, US Patent No. 5,825,043 ("Suwa").
Zeiss Exhibit 1124 from IPR of US 7,348,575 (IPR2013-00363), filed Jun. 17, 2013, Wikipedia, "Refractive Index," http://en.wikipedia.org/wiki/Refractive_index (downloaded May 20, 2013).
Zeiss Exhibit 1125 from IPR of US 7,348,575 (IPR2013-00363), filed Jun. 17, 2013, U.S. Patent No. 4,346,164 ("Tabarelli").
Zeiss Exhibit 1126 from IPR of US 7,348,575 (IPR2013-00363), filed Jun. 17, 2013 File History Excerpts from U.S. Appl. No. 11/513,160 ("Omura Continuation Application").
Zeiss Exhibit 1127 from IPR of US 7,348,575 (IPR2013-00363), , filed Jun. 17, 2013 J.R. Sheats and B.W. Smith, *Microlithography: Science and Technology*, Marcel Dekker, Inc. (1998), Chapter 1, pp. 1-43.
Zeiss Exhibit 1128 from IPR of US 7,348,575 (IPR2013-00363), filed Jun. 17, 2013 Omura Reply 1, Paper No. 200, Interference No. 105,834.
Zeiss Exhibit 1129 from IPR of US 7,348,575 (IPR2013-00363), filed Jun. 17, 2013, Curriculum Vitae of Richard C. Juergens.
Zeiss Exhibit 1130 from IPR of US 7,348,575 (IPR2013-00363), filed Jun. 17, 2013Code V Sequence Data.
Zeiss Exhibit 1131 from IPR of US 7,348,575 (IPR2013-00363), filed Jun. 17, 2013, Code V Sub-routines.
Supplemental European Search Report for Application No. EP 04 73 1484, mailed Jun. 14, 2010.

(56) References Cited

OTHER PUBLICATIONS

European Search Report for Application No. EP 09 01 5829, dated Apr. 30, 2010.
Owa et al., "Immersion lithography; its potential performance and issues," Optical Microlithography XVI, Proceedings of SPIE vol. 5040, Feb. 25-28, 2003.
M.H. Freeman, "Innovative Wide-Field Binocular Design", OSA Proceedings of the International Optical Design Conference (OSA) 1994, vol. 22, pp. 389-393.
Kang et al., "Optical lithography at a 126nm wavelength," Emerging Lithographic Technologies V, Proceedings of SPIE vol. 4343, Feb. 27-Mar. 1, 2001.
Ulrich et al., "The Development of Dioptric Projection Lenses for DUV Lithography," J. Microlithogr. Microfabrication, Microsyst., vol. 3, 87 (2004).
J.J. Shaffer et al., "Effect of thermanl cycling on dimensional stability of Zerodur and ULE," Rapid Communication, Applied Optics, vol. 23, No. 17, Sep. 1, 1984.
J. Morgan, Introduction to Geometrical and Physical Optics, McGraw-Hill, 1953. p. 2.
Donald Dejager, "Camera Viewfinder Using Tilted Concave Mirror Erecting Elements", SPIE vol. 237, 1980 International Lens Design Conference (OSA) pp. 292-298.
Sworn Translation of International Patent Application No. PCT/JP2004/006417, filed May 6, 2004.
Certified copy of Japanese Application No. 2003-364596, filed Oct. 24, 2003.
Sworn Translation of Japanese Application No. 2003-364596, filed Oct. 24, 2003.
Claim Chart Showing Omura's Entitlement to Benefit.
Declaration of Mitchell C. Ruda, Ph.D.
Curriculum vitae of Mitchell C. Ruda, Ph.D.
Warren Smith, "Modern Optical Engineering," 123-25 (McGraw Hill 1966).
File history for U.S. Appl. No. 11/266,288, filed Nov. 4, 2005. (submitted in 4 separate documents due to size).
Declaration of Richard C. Juergens dated Jun. 1, 2009.
Curriculum Vitae of Richard C. Juergens.
U.S. Appl. No. 60/654,950 to David Shafer, filed Feb. 23, 2005.
Office communication mailed on Jan. 6, 2009, in Shafer's Involved Application, U.S. Appl. No. 11/653,366.
Filing Receipt mailed Feb. 12, 2007, in Shafer's Involved Application, U.S. Appl. No. 11/653,366.
Information Disclosure Statement filed on Oct. 20, 2006, in Omura's '934 Application, U.S. Appl. No. 11/583,934.
Combined Declaration and Power of Attorney submitted on Oct. 20, 2006, in Omura's '934 Application, U.S. Appl. No. 11/583,934.
Combined Declaration and Power of Attorney submitted on Feb. 7, 2006, in Omura's Parent Application.
Notice of allowance mailed on Aug. 14, 2007, in Omura's '934 Application, U.S. Appl. No. 11/583,934.
Issue Fee Payment mailed on Nov. 2, 2007, in Omura's '934 Application, U.S. Appl. No. 11/583,934.
Claims marked to show differences between: (1) Omura's '934 Application, U.S. Appl. No. 11/583,934, filed on Oct. 20, 2006 and (2) Shafer's Published PCT Application, WO 2006/005547 to Shafer et al., published on Jan. 19, 2006.
Requirement for Restriction/Election mailed on Apr. 4, 2007, in Omura's Sister Application, U.S. Appl. No. 11/513,160.
Reply to Election of Species Requirement filed on Apr. 27, 2007, in Omura's Sister Application, U.S. Appl. No. 11/513,160.
Office Communication mailed on Jul. 5, 2007, in Omura's Sister Application, U.S. Appl. No. 11/513,160.
Supplemental Reply to Election of Species Requirement filed on Oct. 3, 2007, in Omura's Sister Application, U.S. Appl. No. 11/513,160.
Non-Final Rejection mailed on Dec. 12, 2007, in Omura's Sister Application, U.S. Appl. No. 11/513,160.
Amendment filed on Apr. 9, 2008, in Omura's Sister Application, U.S. Appl. No. 11/513,160.
Final Rejection mailed on Jul. 14, 2008, in Omura's Sister Application, U.S. Appl. No. 11/513,160.
Notice of Appeal filed on Jan. 14, 2009, in Omura's Sister Application, U.S. Appl. No. 11/513,160.
Omura et al., *Catadioptric lens development for DUV and VUV projection optics*, Optical Microlithography XVI, Proc. SPIE vol. 5040, pp. 781-788 (2003).
Omura, Office Action in U.S. Appl. No. 11/513,160, dated Oct. 27, 2009.
Optical Prescription Data cited in Declaration of Richard C. Juergens dated Jun. 1, 2009.
Claim Chart Showing Exemplary Common Disclosure in Shafer Involved Application, Shafer's PCT Application, and Shafer's '950 Provisional Relevant to the Count.
Threshold issue, 68 Fed. Reg. 66,648; 66,664; and 66,689 (Nov. 26, 2003).
Threshold issue, 69 Fed. Reg. 49,960; 49,969; 49,991; and 50,019 (Aug. 12, 2004) (to be codified at 37 C.F.R. § 41.201).
Harry J. Levinson, "Principles of Lithography," SPIE, 2001, pp. 150-167.
Warren J. Smith, "Modern Optical Engineering: The Design of Optical Systems," $3^{rd}$ Edition, McGraw-Hill, New York, 2000, pp. 487-492.
James R. Sheats et al., "Microlithography: Science and Technology," Marcel Dekker, Inc. New York, 1998, pp. 261-270.
P. Rai-Choudhury, "Handbook of Microlithography, Micromachining, and Microfabrication: vol. 1: Microlithogtaphy," SPIE, 1997, pp. 82-126.
U.S Court of Appeals for the Federal Circuit 2008-1466, *Agilent Technologies, Inc*. v. *Affymetrix, Inc*., copy of the Appeal from the US District Court for Northern California District of California in Case No. 06-CV-05958, Judge James Ware, dated Jun. 4, 2009 (26 pages).
Translation of PCT/JP01/09266, filed Oct. 23, 2003, publication No. WO 2002/35273, published May 2, 2002.
Matsuyama et al., "Nikon Projection Lens Update," Optical Microlithography XVII, Proceeding of SPIE, vol. 5377, pp. 730-741.
Warren Smith, "Modern Optical Engineering," $3^{rd}$ edition, Chapter 13, pp. 439-502 (2000).
Tomoyuki Matsuyama et al., "Microlithographic Lens for DUV Scanner," SPIE vol. 4832, Dec. 2003, Conference Jun. 3-7, 2002, pp. 170-174.
Tomoyuki Matsuyama et al., "High NA and Low Residual Aberration Projection Lens for DUV Scanner," PSIE, vol. 4691 (2002, pp. 687-695.
Tomoyuki Matsuyama et al., "Nikon Projection Lens Update", in Optical Microlithography XVII, Proc. of SPIE, vol. 5377.65 (2004).
Ulrich, W. et al., "Trends in Optical Design of Projection Lenses for UV-and EUV-Lithography," Proc. of SPIE, vol. 4146 (2000).
Glatzel, E., "New Lenses for Microlithography," SPIE vol. 237 (1980), pp. 310-320.
M. Switkes et al., "Resolution Enhancement of 157-nm Lithography by Liquid Immersion," Proc. SPIE vol. 4691, Optical Microlithography XV, pp. 459-465, Jul. 2002.
Jacobs et al., "Expansion hysteresis upon thermal cycling of Zerodur," Applied Optics, 23(17), Sep. 1, 1984.
Lindig et al., Applied Optics, 24(2), Oct. 15, 1985.
Deposition of Mitchell C. Ruda, Ph.D., Jul. 23, 2009.
Deposition of Richard C. Juergens, Jul. 17, 2009.
BPAI Interference No. 105,753, *Omura* v. *Shafer*, Omura Status Report, filed Mar. 23, 2011.
BPAI Interference No. 105,753, *Omura* v. *Shafer*, Omura Status Report on the Federal Curcuit Appel of Interference No. 105,678 , filed Jan. 26, 2011.
BPAI Interference No. 105,753, *Omura* v. *Shafer*, Omura Status Report on the Federal Circuit Appeal of Interference No. 105,678, filed Nov. 18, 2010.
BPAI Interference No. 105,753, *Omura* v. *Shafer*, Omura Status Report on the Federal Circuit Appeal of Interference No. 105678, filed Nov. 3, 2010.
BPAI Interference No. 105,753, *Omura* v. *Shafer*, Omura Status Report on the Federal Circuit Appeal of Interference No. 105678, filed Oct. 6, 2010.

(56) References Cited

OTHER PUBLICATIONS

BPAI Interference No. 105,753, *Omura* v. *Shafer*, Brief of Appellant Omura, filed Sep. 8, 2010.
BPAI Interference No. 105,753, *Omura* v. *Shafer*, Omura Status Report on the Federal Circuit Appeal of Interference No. 105,678, filed Sep. 8, 2010.
BPAI Interference No. 105,753, *Omura* v. *Shafer*, Omura Status Report on the Federal Circuit Appeal of Interference 105678, filed Aug. 25, 2010.
BPAI Interference No. 105,753, *Omura* v. *Shafer*, Order Bd.R. 104(c), filed Aug. 11, 2010.
BPAI Interference No. 105,753, *Omura* v. *Shafer*, Omura Annotated Copy of Claim, filed Jul. 27, 2010.
BPAI Interference No. 105,753, *Omura* v. *Shafer*, Shafer Annotated Copy of Claim, filed Jul. 27, 2010.
BPAI Interference No. 105,753, *Omura* v. *Shafer*, Omura First Exhibit List, filed Jul. 20, 2010.
BPAI Interference No. 105,753, *Omura* v. *Shafer*, Omura Response to Order to Show Cause, filed Jul. 20, 2010.
BPAI Interference No. 105,753, *Omura* v. *Shafer*, Order Bd.R. 109(b)Authorizing Copies of Office Records, filed Jul. 14, 2010.
BPAI Interference No. 105,753, *Omura* v. *Shafer*, Shafer Request for File Copies, filed Jul. 13, 2010.
BPAI Interference No. 105,753, *Omura* v. *Shafer*, Shafer Clean Copy of Claim, filed Jul. 13, 2010.
BPAI Interference No. 105,753, *Omura* v. *Shafer*, Shafer Notice of Real Party in Interest, filed Jul. 13, 2010.
BPAI Interference No. 105,753, *Omura* v. *Shafer*, Shafer Notice of Related Proceedings, filed Jul. 13, 2010.
BPAI Interference No. 105,753, *Omura* v. *Shafer*, Shafer Submission of Appointment of Additional Attorney, filed Jul. 13, 2010.
BPAI Interference No. 105,753, *Omura* v. *Shafer*, Shafer Designation of Lead and Backup Lead Counsel, filed Jul. 13, 2010.
BPAI Interference No. 105,753, *Omura* v. *Shafer*, Omura Request for File Copies, filed Jul. 13, 2010.
BPAI Interference No. 105,753, *Omura* v. *Shafer*, Omura Clean Copy of Claims, filed Jul. 13, 2010.
BPAI Interference No. 105,753, *Omura* v. *Shafer*, Omura Notice of Relatred Proceedings, filed Jul. 13, 2010.
BPAI Interference No. 105,753, *Omura* v. *Shafer*, Omura Notice of Real Party in Interest, filed Jul. 13, 2010.
BPAI Interference No. 105,753, *Omura* v. *Shafer*, Omura Designation of Lead and Backup Attorneys, filed Jul. 13, 2010.
BPAI Interference No. 105,753, *Omura* v. *Shafer*, Order to Show Cause Bd.R. 104(a), filed Jun. 29, 2010.
BPAI Interference No. 105,753, *Omura* v. *Shafer*, Stanidng Order, filed Jun. 29, 2010.
BPAI Interference No. 105,753, *Omura* v. *Shafer*, Declaration Bd.R. 203(b), filed Jun. 29, 2010.
BPAI Interference No. 105,753, *Omura* v. *Shafer*, Omura Exhibit #1001, Interference No. 105,678, Paper No. 74 (Feb. 5, 2010)—Decision—Request for Rehearing—Bd.R. 127(d), dated Jul. 20, 2010.
BPAI Interference No. 105,753, *Omura* v. *Shafer*, Omura Exhibit #1002, Interference No. 105,678, Paper No. 1 (Jan. 30, 2009)—Declaration Bd.R. 203(b), dated Jul. 20, 2010.
BPAI Interference No. 105,753, *Omura* v. *Shafer*, Omura Exhibit #1003, Interference No. 105,678, Paper No. 47 (Aug. 26, 2009)—Omura Response 1, filed Jul. 20, 2010, dated Jul. 20, 2010.
BPAI Interference No. 105,753, *Omura* v. *Shafer*, Omura Exhibit #1004, US Patent No. 7,309,870, issued Dec. 18, 2007, dated Jul. 20, 2010.
BPAI Interference No. 105,749, *Shafer* v. *Omura*, Index of Shafer'S Exhibits for the Record, filed Feb. 11, 2011.
BPAI Interference No. 105,749, *Shafer* v. *Omura*, Shafer'S Submission of the Record, filed Feb. 11, 2011.
BPAI Interference No. 105,749, *Shafer* v. *Omura*, Omura Notice of Time Period 8 Filings, filed Feb. 11, 2011.
BPAI Interference No. 105,749, *Shafer* v. *Omura*, Order Miscellaneous Bd.R. 104(a), filed Jan. 21, 2011.
BPAI Interference No. 105,749, *Shafer* v. *Omura*, Omura Notice re Oral Argument, filed Jan. 3, 2011.
BPAI Interference No. 105,749, *Shafer* v. *Omura*, Shafer Request for Oral Hearing, filed Jan. 3, 2011.
BPAI Interference No. 105,749, *Shafer* v. *Omura*, Shafer Updated List of Exhibits, filed Jan. 3, 2011.
BPAI Interference No. 105,749, *Shafer* v. *Omura*, Order Miscellaneous BD.R. 104(a), filed Dec. 15, 2010.
BPAI Interference No. 105,749, *Shafer* v. *Omura*, E-Mail Communication, filed Dec. 13, 2010.
BPAI Interference No. 105,749, *Shafer* v. *Omura*, Omura Third Exhibit List, filed Dec. 3, 2010.
BPAI Interference No. 105,749, *Shafer* v. *Omura*, Omura Reply 5, filed Dec. 3, 2010.
BPAI Interference No. 105,749, *Shafer* v. *Omura*, Omura Reply 4, filed Dec. 3, 2010.
BPAI Interference No. 105,749, *Shafer* v. *Omura*, Omura Reply 3, filed Dec. 3, 2010.
BPAI Interference No. 105,749, *Shafer* v. *Omura*, Omura Reply 2, filed Dec. 3, 2010.
BPAI Interference No. 105,749, *Shafer* v. *Omura*, Omura Reply 1, filed Dec. 3, 2010.
BPAI Interference No. 105,749, *Shafer* v. *Omura*, Shafer Reply 3, filed Dec. 3, 2010.
BPAI Interference No. 105,749, *Shafer* v. *Omura*, Shafer Reply 2, filed Dec. 3, 2010.
BPAI Interference No. 105,749, *Shafer* v. *Omura*, Shafer Reply 1, filed Dec. 3, 2010.
BPAI Interference No. 105,749, *Shafer* v. *Omura*, Shafer Updated List of Exhibits, filed Dec. 3, 2010.
BPAI Interference No. 105,749, *Shafer* v. *Omura*, Omura Notice of Action Issued in Omura Continuation, filed Nov. 16, 2010.
BPAI Interference No. 105,749, *Shafer* v. *Omura*, Shafer Updated List of Exhibits, filed Nov. 5, 2010.
BPAI Interference No. 105,749, *Shafer* v. *Omura*, Omura Opposition 3, filed Nov. 5, 2010.
BPAI Interference No. 105,749, *Shafer* v. *Omura*, Omura Opposition 2, filed Nov. 5, 2010.
BPAI Interference No. 105,749, *Shafer* v. *Omura*, Shafer Opposition 5, filed Nov. 5, 2010.
BPAI Interference No. 105,749, *Shafer* v. *Omura*, Shafer Opposition 4, filed Nov. 5, 2010.
BPAI Interference No. 105,749, *Shafer* v. *Omura*, Shafer Opposition 3, filed Nov. 5, 2010.
BPAI Interference No. 105,749, *Shafer* v. *Omura*, Shafer Opposition 2, filed Nov. 5, 2010.
BPAI Interference No. 105,749, *Shafer* v. *Omura*, Shafer Opposition 1, filed Nov. 5, 2010.
BPAI Interference No. 105,749, *Shafer* v. *Omura*, Omura Opposition 1, filed Nov. 5, 2010.
BPAI Interference No. 105,749, *Shafer* v. *Omura*, Shafer Notice of Change of Real Party-In-Interest, filed Nov. 3, 2010.
BPAI Interference No. 105,749, *Shafer* v. *Omura*, Shafer Notice of Change of Counsel Contact Information, filed Nov. 3, 2010.
BPAI Interference No. 105,749, *Shafer* v. *Omura*, Notice of Stipulation to Extend Time Period 3, filed Oct. 8, 2010.
BPAI Interference No. 105,749, *Shafer* v. *Omura*, Shafer Updated List of Exhibits, filed Sep. 17, 2010.
BPAI Interference No. 105,749, *Shafer* v. *Omura*, Shafer Responsive Motion 3, filed Sep. 17, 2010.
BPAI Interference No. 105,749, *Shafer* v. *Omura*, Omura Second Exhibit List, filed Sep. 17, 2010.
BPAI Interference No. 105,749, *Shafer* v. *Omura*, Omura Responsive Motion 5, filed Sep. 17, 2010.
BPAI Interference No. 105,749, *Shafer* v. *Omura*, Omura Responsive Motion 4, filed Sep. 17, 2010.
BPAI Interference No. 105,749, *Shafer* v. *Omura*, Omura Responsive Motion 3, filed Sep. 17, 2010.
BPAI Interference No. 105,749, *Shafer* v. *Omura*, Notice of Stipulation to Extend Time Period 2, filed Sep. 10, 2010.
BPAI Interference No. 105,749, *Shafer* v. *Omura*, Order—Miscellaneous—Bd.R. 104(C), filed Sep. 2, 2010.

(56) References Cited

OTHER PUBLICATIONS

BPAI Interference No. 105,749, *Shafer v. Omura*, Notice of Filing of Shafer Priority Statement, filed Aug. 20, 2010.
BPAI Interference No. 105,749, *Shafer v. Omura*, Shafer List of Exhibits As of August 20, 2010, filed Aug. 20, 2010.
BPAI Interference No. 105,749, *Shafer v. Omura*, Shafer Substantive Motion 2, filed Aug. 20, 2010.
BPAI Interference No. 105,749, *Shafer v. Omura*, Shafer Substantive Motion 1, filed Aug. 20, 2010.
BPAI Interference No. 105,749, *Shafer v. Omura*, Omura First Exhibit List, filed Aug. 20, 2010.
BPAI Interference No. 105,749, *Shafer v. Omura*, Omura Notice of Filing Priority Statement, filed Aug. 20, 2010.
BPAI Interference No. 105,749, *Shafer v. Omura*, Omura Motion 2, filed Aug. 20, 2010.
BPAI Interference No. 105,749, *Shafer v. Omura*, Omura Motion 1, filed Aug. 20, 2010.
BPAI Interference No. 105,749, *Shafer v. Omura*, Joint Stipulation to Extend Time Periods 1 to 4, filed Aug. 6, 2010.
BPAI Interference No. 105,749, *Shafer v. Omura*, Omura Report of Parties Re Settlement Jul. 28, 2010.
BPAI Interference No. 105,749, *Shafer v. Omura*, Order Motion Times Bd.R. 104(c), filed Jun. 25, 2010.
BPAI Interference No. 105,749, *Shafer v. Omura*, Shafer Supplemental Notice of Related Proceedings, filed Jun. 25, 2010.
BPAI Interference No. 105,749, *Shafer v. Omura*, Omura Motions List, filed Jun. 18, 2010.
BPAI Interference No. 105,749, *Shafer v. Omura*, Shafer Motions List, filed Jun. 18, 2010.
BPAI Interference No. 105,749, *Shafer v. Omura*, Shafer Annotated Copy of Claims, filed May 26, 2010.
BPAI Interference No. 105,749, *Shafer v. Omura*, Omura Annotated Copy of Claims, filed May 26, 2010.
BPAI Interference No. 105,749, *Shafer v. Omura*, Order Bd.R. 109(c)Authorizing Copies of Office Records, filed May 14, 2010.
BPAI Interference No. 105,749, *Shafer v. Omura*, Shafer File Copy Request, filed May 12, 2010.
BPAI Interference No. 105,749, *Shafer v. Omura*, Shafer Clean Copy of Claims, filed May 12, 2010.
BPAI Interference No. 105,749, *Shafer v. Omura*, Shafer Notice of Related Proceedings, filed May 12, 2010.
BPAI Interference No. 105,749, *Shafer v. Omura*, Shafer Notice of Real Party in Interest, filed May 12, 2010.
BPAI Interference No. 105,749, *Shafer v. Omura*, Shafer Submission of Appointment of Additional Attorney, filed May 12, 2010.
BPAI Interference No. 105,749, *Shafer v. Omura*, Shafer Designation of Lead Attorney, filed May 12, 2010.
BPAI Interference No. 105,749, *Shafer v. Omura*, Omura Request for File Copies, filed May 12, 2010.
BPAI Interference No. 105,749, *Shafer v. Omura*, Omura Clean Copy of Claims, filed May 12, 2010.
BPAI Interference No. 105,749, *Shafer v. Omura*, Omura Notice of Related Proceedings, filed May 12, 2010.
BPAI Interference No. 105,749, *Shafer v. Omura*, Omura Notice of Real Party in Interest, filed May 12, 2010.
BPAI Interference No. 105,749, *Shafer v. Omura*, Omura Designation of Lead and Backup Attorney, filed May 12, 2010.
BPAI Interference No. 105,749, *Shafer v. Omura*, Standing Order, filed Apr. 28, 2010.
BPAI Interference No. 105,749, *Shafer v. Omura*, Declaration Bd.R. 203(b), filed Apr. 28, 2010.
BPAI Interference No. 105,749, *Shafer v. Omura*, Shafer Exhibit #2001, Declaration of Richard C. Juergens dated Aug. 19, 2010.
BPAI Interference No. 105,749, *Shafer v. Omura*, Shafer Exhibit #2002, Curriculum Vitae of Richard C. Juergens.
BPAI Interference No. 105,749, *Shafer v. Omura*, Shafer Exhibit #2003, U.S. Appl. No. 12/409,394 to Shafer et al., filed Mar. 23, 2009 ("Shafer's Involved Application").
BPAI Interference No. 105,749, *Shafer v. Omura*, Shafer Exhibit #2004, U.S. Appl. No. 11/653,366 to Shafer et al., filed Jan. 16, 2007 ("Shafer's Parent Application").
BPAI Interference No. 105,749, *Shafer v. Omura*, Shafer Exhibit #2005, WO 2006/005547 to Shafer et al., published on Jan. 19, 2006 ("Shafer's Published PCT Application"); publication of PCT/EP2005/007431, filed Jul. 8, 2005 ("Shafer's PCT Application").
BPAI Interference No. 105,749, *Shafer v. Omura*, Shafer Exhibit #2006, U.S. Appl. No. 60/654,950 to Shafer, filed Feb. 23, 2005 ("Shafer's '950 Provisional").
BPAI Interference No. 105,749, *Shafer v. Omura*, Shafer Exhibit #2007, U.S. Appl. No. 11/035,103 to Shafer et al., filed Jan. 14, 2005 ("Shafer's '103 Application").
BPAI Interference No. 105,749, *Shafer v. Omura*, Shafer Exhibit #2008, U.S. Appl. No. 60/617,674 to Shafer et al., filed Oct. 13, 2004 ("Shafer's '674 Provisional").
BPAI Interference No. 105,749, *Shafer v. Omura*, Shafer Exhibit #2009, Filing Receipt mailed Apr. 20, 2009, in Shafer's Involved Application, U.S. Appl. No. 12/409,394.
BPAI Interference No. 105,749, *Shafer v. Omura*, Shafer Exhibit #2010, Preliminary Amendment filed Mar. 23, 2009, in Shafer's Involved Application, U.S. Appl. No. 12/409,394.
BPAI Interference No. 105,749, *Shafer v. Omura*, Shafer Exhibit #2011, Office communication mailed on Apr. 23, 2010, in Shafer's Involved Application, U.S. Appl. No. 12/409,394.
BPAI Interference No. 105,749, *Shafer v. Omura*, Shafer Exhibit #2012, Filing Receipt mailed on Feb. 12, 2007, in Shafer's Parent Application, U.S. Appl. No. 11/653,366.
BPAI Interference No. 105,749, *Shafer v. Omura*, Shafer Exhibit #2013, Notice to File Missing Parts mailed on Mar. 15, 2005, in Shafer's '103 Application, U.S. Appl. No. 11/035,103.
BPAI Interference No. 105,749, *Shafer v. Omura*, Shafer Exhibit #2014, U.S. Appl. No. 11/583,934 to Omura, filed Oct. 20, 2006 ("Omura's '934 Application").
BPAI Interference No. 105,749, *Shafer v. Omura*, Shafer Exhibit #2015, U.S. Patent No. 7,385,756 to Shafer et al., issued on Jun. 10, 2008.
BPAI Interference No. 105,749, *Shafer v. Omura*, Shafer Exhibit #2016, Information Disclosure Statement filed on Oct. 20, 2006, in Omura's '934 Application, U.S. Appl. No. 11/583,934.
BPAI Interference No. 105,749, *Shafer v. Omura*, Shafer Exhibit #2017, U.S. Patent No. 7,309,870 to Yasuhiro Omura ("Omura's Involved Patent"), issued on Dec. 18, 2007, from Omura's '934 Application, U.S. Appl. No. 11/583,934.
BPAI Interference No. 105,749, *Shafer v. Omura*, Shafer Exhibit #2018, U.S. Appl. No. 11/266,288 to Yasuhiro Omura, filed Nov. 4, 2005 ("Omura's Parent Application").
BPAI Interference No. 105,749, *Shafer v. Omura*, Shafer Exhibit #2019, WO 2004/107011 to Yasuhiro Omura, published on Sep. 12, 2004; publication of PCT/JP2004/006417, filed May 6, 2004 ("Omura's PCT Application").
BPAI Interference No. 105,749, *Shafer v. Omura*, Shafer Exhibit #2020, English Translation of JP2003-128154 to Omura, filed May 6, 2003.
BPAI Interference No. 105,749, *Shafer v. Omura*, Shafer Exhibit #2021, English Translation of JP2003-350647 to Omura, filed Oct. 9, 2003.
BPAI Interference No. 105,749, *Shafer v. Omura*, Shafer Exhibit #2022, English Translation of JP2003-364596 to Omura, filed Oct. 24, 2003.
BPAI Interference No. 105,749, *Shafer v. Omura*, Shafer Exhibit #2023, Microlithography: Science and Technology, ed. James R. Sheats and Bruce W. Smith, Marcel Dekker, Inc., pp. 261-270 (1998).
BPAI Interference No. 105,749, *Shafer v. Omura*, Shafer Exhibit #2024, U.S. 2003/0234912 to Yasuhiro Omura, published on Dec. 25, 2003 ("Omura's '912 Publication").
BPAI Interference No. 105,749, *Shafer v. Omura*, Shafer Exhibit #2025, Omura et al., Catadioptric lens development for DUV and VUV projection optics, Optical Microlithography XVI, *Proc. SPIE*, vol. 5040, pp. 781-788 (2003) ("Omura's SPIE Paper").
BPAI Interference No. 105,749, *Shafer v. Omura*, Shafer Exhibit #2026, U.S. Appl. No. 60/591,775 to Beder et al., filed Jul. 26 or 27, 2004 ("the '775 Provisional").

(56) References Cited

OTHER PUBLICATIONS

BPAI Interference No. 105,749, *Shafer v. Omura*, Shafer Exhibit #2027, Amendment adding claim 52 to U.S. Appl. No. 12/409,394.
BPAI Interference No. 105,749, *Shafer v. Omura*, Shafer Exhibit #2028, U.S. Appl. No. 12/561,019 to Shafer et al., filed Sep. 16, 2009.
BPAI Interference No. 105,749, *Shafer v. Omura*, Shafer Exhibit #2029, U.S. Appl. No. 12/816,863 to Shafer et al., filed Jun. 16, 2010.
BPAI Interference No. 105,749, *Shafer v. Omura*, Shafer Exhibit #2030, Non-final Office Action mailed Nov. 5, 2010, in U.S. Appl. No. 12/884,332 to Yasuhiro Omura.
BPAI Interference No. 105,749, *Shafer v. Omura*, Shafer Exhibit #2031, Notice of Proposed Rules on Wednesday, Nov. 26, 2003, in 68 Fed. Reg. (No. 228) at 66648 et seq.
BPAI Interference No. 105,749, *Shafer v. Omura*, Shafer Exhibit #2032, Final Rules on Thursday, Aug. 12, 2004, in 69 Fed. Reg. (No. 155) at 49960 et seq.
BPAI Interference No. 105,749, *Shafer v. Omura*, Shafer Exhibit #2033, Official Filing receipt mailed on Sep. 27, 2004, in the '775 Provisional, U.S. Appl. No. 60/591,775.
BPAI Interference No. 105,749, *Shafer v. Omura*, Shafer Exhibit #2034, English Translation of the '775 Provisional, U.S. Appl. No. 60/591,775.
BPAI Interference No. 105,749, *Shafer v. Omura*, Shafer Exhibit #2035, Claim Chart Showing Exemplary Common Disclosure in Shafer Involved Application, Shafer's Parent Application, Shafer's PCT Application, and Shafer's '950 Provisional Relevant to the Count.
BPAI Interference No. 105,749, *Shafer v. Omura*, Shafer Exhibit #2036, Claim Chart Showing Exemplary Common Disclosure in Shafer Involved Application, Shafer's Parent Application, Shafer's PCT Application, Shafer's '103 Application and Shafer's '674 Provisional Relevant to the Count.
BPAI Interference No. 105,749, *Shafer v. Omura*, Shafer Exhibit #2037, Claim Chart Showing Exemplary Common Disclosure in Shafer Involved Application, Shafer's Parent Application, Shafer's PCT Application, and Shafer's '775 Provisional Relevant to the Count.
BPAI Interference No. 105,749, *Shafer v. Omura*, Shafer Exhibit #2038, Code V sequence for the embodiment shown in Fig. 11 of Shafer's Involved Application.
BPAI Interference No. 105,749, *Shafer v. Omura*, Shafer Exhibit #2039, Code V sequence for the embodiment shown in Fig. 28 of Shafer's '674 Provisional.
BPAI Interference No. 105,749, *Shafer v. Omura*, Shafer Exhibit #2040, Code V sequence for the embodiment shown in Fig. 1 of Shafer's '775 Provisional.
BPAI Interference No. 105,749, *Shafer v. Omura*, Shafer Exhibit #2041, Code V sequence for the embodiment shown in Fig. 5 of Omura's Involved Patent.
BPAI Interference No. 105,749, *Shafer v. Omura*, Shafer Exhibit #2042, Code V sequence for the embodiment shown in Fig. 7 of Omura's Involved Patent.
BPAI Interference No. 105,749, *Shafer v. Omura*, Shafer Exhibit #2043, Code V sequence for the embodiment shown in Fig. 9 of Omura's Involved Patent.
BPAI Interference No. 105,749, *Shafer v. Omura*, Shafer Exhibit #2044, Code V sequence for the embodiment shown in Fig. 10 of Omura's Involved Patent.
BPAI Interference No. 105,749, *Shafer v. Omura*, Shafer Exhibit #2045, Code V sequence for the embodiment shown in Fig. 14 of Omura's Involved Patent.
BPAI Interference No. 105,749, *Shafer v. Omura*, Shafer Exhibit #2046, Code V sequence for the embodiment shown in Fig. 15 of Omura's Involved Patent.
BPAI Interference No. 105,749, *Shafer v. Omura*, Shafer Exhibit #2047, Code V sequence for the embodiment shown in Fig. 16 of Omura's Involved Patent.
BPAI Interference No. 105,749, *Shafer v. Omura*, Shafer Exhibit #2048, Code V macro for determining COMP1, COMP2, and COMP3.
BPAI Interference No. 105,749, *Shafer v. Omura*, Shafer Exhibit #2049, Zemax—Optical Design Program—User's Guide, Version 10.0, published in Apr. 2001.
BPAI Interference No. 105,749, *Shafer v. Omura*, Shafer Exhibit #2050, U.S. Patent No. 7,688,517 to Omura et al., issued on Mar. 30, 2010.
BPAI Interference No. 105,749, *Shafer v. Omura*, Shafer Exhibit #2051, U.S. Patent No. 7,688,422 to Ikezawa et al., issued Mar. 30, 2010.
BPAI Interference No. 105,749, *Shafer v. Omura*, Shafer Exhibit #2052, PCT Patent Publication No. WO 2004/019128, published on Mar. 4, 2004 ("Nikon's PCT Application").
BPAI Interference No. 105,749, *Shafer v. Omura*, Shafer Exhibit #2053, Great Britain Patent Application GB 0311470.9, filed May 19, 2003 ("the Williamson application").
BPAI Interference No. 105,749, *Shafer v. Omura*, Shafer Exhibit #2054, Combined Declaration and Power of Attorney dated Nov. 29, 2005, filed in U.S. Appl. No. 11/266,288.
BPAI Interference No. 105,749, *Shafer v. Omura*, Shafer Exhibit #2055, E-mail dated Nov. 4, 2010, from Jonathan Bockman to Marc Wefers regarding stipulation.
BPAI Interference No. 105,749, *Shafer v. Omura*, Shafer Exhibit #2056, E-mail dated Aug. 27, 2010, from Christopher Bowley to Jonathan Bockman and Barry Bretschneider regarding service of Shafer Priority Statement.
BPAI Interference No. 105,749, *Shafer v. Omura*, Omura Exhibit #1001—U.S. Appl. No. 12/409,394 to Shafer et al.
BPAI Interference No. 105,749, *Shafer v. Omura*, Omura Exhibit # 1002 — Declaration of Mitchell C. Ruda, Ph.D.
BPAI Interference No. 105,749, *Shafer v. Omura*, Omura Exhibit #1003—Curriculum vitae of Mitchell C. Ruda, Ph.D.
BPAI Interference No. 105,749, *Shafer v. Omura*, Omura Exhibit #1004—MPEP 2163.
BPAI Interference No. 105,749, *Shafer v. Omura*, Omura Exhibit #1005—Reply to Action of Jan. 13, 2010, in U.S. Appl. No. 12/409,394 to Shafer et al.
BPAI Interference No. 105,749, *Shafer v. Omura*, Omura Exhibit #1006—Aurelian Dodoc, "Toward the Global Optimum in Lithographic Lens Design," in International Optical Design Conference, OSA Technical Digest (CD) (Optical Society of America, 2010), paper IWD3.
BPAI Interference No. 105,749, *Shafer v. Omura*, Omura Exhibit #1007—U.S. Appl. No. 12/884,332 "Projection Optical Systems, Apparatus, and Exposure Method," to Omura, filed Sep. 17, 2010 (Omura's Continuation Application).
BPAI Interference No. 105,749, *Shafer v. Omura*, Omura Exhibit #1008—EP 1336887 A1 ("Takahashi").
BPAI Interference No. 105,749, *Shafer v. Omura*, Omura Exhibit #1009—Second Declaration of Mitchell C. Ruda, Ph.D.
BPAI Interference No. 105,749, *Shafer v. Omura*, Omura Exhibit #1010—Action dated Jan. 13, 2010, in U.S. Appl. No. 12/409,394 to Shafer et al.
BPAI Interference No. 105,749, *Shafer v. Omura*, Omura Exhibit #1011—U.S. Appl. No. 11/513,160, filed Aug. 31, 2006.
BPAI Interference No. 105,749, *Shafer v. Omura*, Omura Exhibit #1012—File history for U.S. Appl. No. 11/513,160, filed Aug. 31, 2006.
BPAI Interference No. 105,749, *Shafer v. Omura*, Omura Exhibit #1013—U.S. Appl. No. 11/266,288, filed Nov. 4, 2005.
BPAI Interference No. 105,749, *Shafer v. Omura*, Omura Exhibit #1014—File history for U.S. Appl. No. 11/266,288, filed Nov. 4, 2005.
BPAI Interference No. 105,749, *Shafer v. Omura*, Omura Exhibit #1015—International Patent Application No. PCT/JP2004/006417, filed May 6, 2004.
BPAI Interference No. 105,749, *Shafer v. Omura*, Omura Exhibit #1016—Sworn translation of International Patent Application No. PCT/JP2004/006417, filed May 6, 2004.
BPAI Interference No. 105,749, *Shafer v. Omura*, Omura Exhibit #1017—Certified Copy of Japanese Patent Application No. 2003-364596, filed Oct. 24, 2003.

(56) References Cited

OTHER PUBLICATIONS

BPAI Interference No. 105,749, *Shafer v. Omura*, Omura Exhibit #1018—Sworn translation of Japanese Patent Application No. 2003-364596, filed Oct. 24, 2003.
BPAI Interference No. 105,749, *Shafer v. Omura*, Omura Exhibit #1019—U.S. Appl. No. 11/653,366, filed Jan. 16, 2007.
BPAI Interference No. 105,749, *Shafer v. Omura*, Omura Exhibit #1020—Claim Chart Showing Omura's Entitlement to Benefit.
BPAI Interference No. 105,749, *Shafer v. Omura*, Omura Exhibit #1021—Zemax lens data for Omura Figure 14.
BPAI Interference No. 105,749, *Shafer v. Omura*, Omura Exhibit #1022—Zemax lens data for Omura Figure 15.
BPAI Interference No. 105,749, *Shafer v. Omura*, Omura Exhibit #1023—Zemax lens data for Omura Figure 16.
BPAI Interference No. 105,749, *Shafer v. Omura*, Omura Exhibit #1024—File history for U.S. Patent No. 7,309,870, issued Dec. 18, 2007.
BPAI Interference No. 105,749, *Shafer v. Omura*, Omura Exhibit #1025—Declaration of Yasuhiro Omura.
BPAI Interference No. 105,678, Notice of Appeal filed Apr. 5, 2010; 20 pages.
BPAI Interference No. 105,678, Brief of Appellant Omura filed Aug. 30, 2010.
BPAI Interference No. 105,678, Corrected Appellees Brief dated Oct. 25, 2010.
BPAI Interference No. 105,678, Reply Brief of Appellant Omura filed Nov. 29, 2010; 36 pages.
Federal Circuit opinion in Interference No. 105,678, Decided: Apr. 8, 2011.
Levinson. "Chapter 5: Wafer Steppers." *Principles of Lithography*. Bellingham, WA: SPIE, 2001. 150-185.
Malacara and Moore. "Chapter 4: Prisms and Refractive Optical Components." *Handbook of Optical Engineering*. NY: Marcel Dekker, 2001. 142-43.
SPIE 28th Annual International Symposium and Education Program on Microlithography, 5040: Optical Microlithography XVI, Feb. 23-28, 2003, Santa Clara, CA USA. 263-264.
Ulrich. "The Development of Dioptric Projection Lenses for DUV Lithography." *International Optical Design Conference, Proc. of SPIE* 4832 (2002).
BPAI Interference No. 105,834, *Omura v. Shafer*, Declaration—Bd. R. 203(b)1, filed Aug. 30, 2011.
BPAI Interference No. 105,834, *Omura v. Shafer*, Standing Order, filed Aug. 30, 2011.
BPAI Interference No. 105,834, *Omura v. Shafer*, Omura Notice of Real Party in Interest, dated Sep. 13, 2011.
BPAI Interference No. 105,834, *Omura v. Shafer*, Omura Notice of Related Proceedings, filed Sep. 13, 2011.
BPAI Interference No. 105,834, *Omura v. Shafer*, Shafer Designation of Lead and Backup Lead Counsel, filed Sep. 13, 2011.
BPAI Interference No. 105,834, *Omura v. Shafer*, Shafer Notice of Real Party-In-Interest, filed Sep. 13, 2011.
BPAI Interference No. 105,834, *Omura v. Shafer*, Shafer Notice of Related Proceedings, filed Sep. 13, 2011.
BPAI Interference No. 105,834, *Omura v. Shafer*, Shafer Clean Copy of Claims, filed Sep. 13, 2011.
BPAI Interference No. 105,834, *Omura v. Shafer*, Shafer Request for File Copies, filed Sep. 13, 2011.
BPAI Interference No. 105,834, *Omura v. Shafer*, Shafer Submission of Appointment of Additional Attorney, filed Sep. 13, 2011.
BPAI Interference No. 105,834, *Omura v. Shafer*, Omura Designation of Lead and Backup Attorneys, filed Sep. 13, 2011.
BPAI Interference No. 105,834, *Omura v. Shafer*, Omura Request for File Copies, filed Sep. 13, 2011.
BPAI Interference No. 105,834, *Omura v. Shafer*, Omura Clean Copy of Claims, filed Sep. 13, 2011.
BPAI Interference No. 105,834, *Omura v. Shafer*, Order—Bd.R. 109(b)—Authorizing Copies of Office Records, filed Sep. 15, 2011.
BPAI Interference No. 105,834, *Omura v. Shafer*, Shafer Annotated Copy of Claims, filed Sep. 27, 2011.
BPAI Interference No. 105,834, *Omura v. Shafer*, Omura Annotated Copy of Claims, filed Sep. 27, 2011.
BPAI Interference No. 105,834, *Omura v. Shafer*, Shafer Motions List, filed Oct. 19, 2011.
BPAI Interference No. 105,834, *Omura v. Shafer*, Omura Motions List, filed Oct. 19, 2011.
BPAI Interference No. 105,834, *Omura v. Shafer*, Order—Motion Times—Bd.R. 104(c), filed Oct. 27, 2011.
BPAI Interference No. 105,834, *Omura v. Shafer*, Shafer Substantive Motion 1, filed Nov. 7, 2011.
BPAI Interference No. 105,834, *Omura v. Shafer*, Shafer List of Exhibits, filed Nov. 7, 2011.
BPAI Interference No. 105,834, *Omura v. Shafer*, Order—Miscellaneous—Bd.R. 104(a), filed Nov. 10, 2011.
BPAI Interference No. 105,834, *Omura v. Shafer*, Order—Miscellaneous—Bd.R. 104(a), filed Nov. 18, 2011.
BPAI Interference No. 105,834, *Omura v. Shafer*, Omura Opposition 1, filed Nov. 30, 2011.
BPAI Interference No. 105,834, *Omura v. Shafer*, Omura First Exhibit List, filed Nov. 30, 2011.
BPAI Interference No. 105,834, *Omura v. Shafer*, Order—Miscellaneous—Bd.R. 104(a), filed Dec. 5, 2011.
BPAI Interference No. 105,834, *Omura v. Shafer*, Joint Stipulation to Extend Time Periods 1 Through 4, filed Dec. 8. 2011.
BPAI Interference No. 105,834, *Omura v. Shafer*, Joint Stipulation to Extend Time Period 1, filed Dec. 23, 2011.
BPAI Interference No. 105,834, *Omura v. Shafer*, Order—Miscellaneous—Bd.R. 104(a), filed Jan. 4, 2012.
BPAI Interference No. 105,834, *Omura v. Shafer*, Shafer Substantive Motion 3, filed Jan. 10, 2012.
BPAI Interference No. 105,834, *Omura v. Shafer*, Shafer Substantive Motion 4, filed Jan. 10, 2012.
BPAI Interference No. 105,834, *Omura v. Shafer*, Shafer Updated List of Exhibits, filed Jan. 10, 2012.
BPAI Interference No. 105,834, *Omura v. Shafer*, Shafer Substantive Motion 2, filed Jan. 10, 2012.
BPAI Interference No. 105,834, *Omura v. Shafer*, Notice of Filing of Shafer Priority Statement, filed Jan. 10, 2012.
BPAI Interference No. 105,834, *Omura v. Shafer*, Omura Motion 1, filed Jan. 10, 2012.
BPAI Interference No. 105,834, *Omura v. Shafer*, Omura Notice of Filing Priority Statement, filed Jan. 10, 2012.
BPAI Interference No. 105,834, *Omura v. Shafer*, Omura Priority Statement, filed Jan. 10, 2012.
BPAI Interference No. 105,834, *Omura v. Shafer*, Omura Second Exhibit List, filed Jan. 10, 2012.
BPAI Interference No. 105,834, *Omura v. Shafer*, Omura Exhibit 1004—Restatement of the Law, Second, Judgments, § 27(1982).
BPAI Interference No. 105,834, *Omura v. Shafer*, Omura Exhibit 1005—Requirement for Restriction in U.S. Appl. No. 12/816,863, dated Nov. 29, 2010.
BPAI Interference No. 105,834, *Omura v. Shafer*, Omura Exhibit 1006—Amendment in Response to Office Communication in U.S. Appl. No. 12/816,863, dated Nov. 29, 2010.
BPAI Interference No. 105,834, *Omura v. Shafer*, Omura Exhibit 1010—Suggestion of Interference Under Bd. R. 202(a) dated Mar. 28, 2011, in U.S. Appl. No. 12/816,863 to Shafer et al.
BPAI Interference No. 105,834, *Omura v. Shafer*, Omura Exhibit 1011—MPEP 802.01.
BPAI Interference No. 105,834, *Omura v. Shafer*, Omura Exhibit 1012—U.S. Appl. No. 13/081,394 to Shafer et al.
BPAI Interference No. 105,834, *Omura v. Shafer*, Omura Exhibit 1013—U.S. Appl. No. 13/275,760 to Omura.
BPAI Interference No. 105,834, *Omura v. Shafer*, Omura Exhibit 1016—Board Rule 202(a).
BPAI Interference No. 105,834, *Omura v. Shafer*, Shafer Ex. 2005, Judgment—Merits—Bd.R. 127, Interference No. 105,749, Paper No. 157, filed Jun. 29, 2011.
BPAI Interference No. 105,834, *Omura v. Shafer*, Shafer Ex. 2016, Omura Request for Rehearing, Interference No. 105,678, Paper No. 50, filed Sep. 30, 2009.
BPAI Interference No. 105,834, *Omura v. Shafer*, Shafer Ex. 2017, Decision—Request for Rehearing—Bd.R. 127(d), Interference No.

(56) References Cited

OTHER PUBLICATIONS

BPAI Interference No. 105,834, *Omura* v. *Shafer*, Shafer Ex. 2019, Ex parte Robert F. Shaw, 2004 WL 5580635 (Bd.Pat.App. & Interf., May 24, 2004).
BPAI Interference No. 105,834, *Omura* v. *Shafer*, Shafer, Ex. 2029, Declaration of Richard C. Juergens, dated Jan. 9, 2012.
BPAI Interference No. 105,834, *Omura* v. *Shafer*, Shafer, Ex. 2034, U.S. Appl. No. 60/536,248 by Shafer et al., filed on Jan. 14, 2004 (the "'248 Provisional").
BPAI Interference No. 105,834, *Omura* v. *Shafer*, Shafer, Ex. 2036, Inventor declaration filed in U.S. Appl. No. 11/583,934 to Yasuhiro Omura.
BPAI Interference No. 105,834, *Omura* v. *Shafer*, Shafer, Ex. 2039, Code V sequences for the embodiments shown in Fig. 7 of Shafer's Involved Application, Figs. 4 and 7 in the '248 Provisional, and Figs.5, 7, 9, 10, and 14-16 in the Omura Parent Application.
BPAI Interference No. 105,834, *Omura* v. *Shafer*, Shafer, Ex. 2040, Judgment—Order to Show Cause—Bd.R. 127(a)(2), Interference No. 105,753, Paper No. 41, filed Jun. 14, 2011.
BPAI Interference No. 105,834, *Omura* v. *Shafer*, Shafer, Ex. 2048, Declaration and Power of Attorney for Patent Application, filed Jun. 16, 2010, in Shafer's Involved Application.
BPAI Interference No. 105,834, *Omura* v. *Shafer*, Shafer, Ex. 2049, Preliminary Amendment, filed Jun. 16, 2010, in Shafer's Involved Application.
BPAI Interference No. 105,834, *Omura* v. *Shafer*, Shafer, Ex. 2050, Office Action, mailed Jun. 2, 2011, in Shafer's Involved Application.
BPAI Interference No. 105,834, *Omura* v. *Shafer*, Shafer, Ex. 2051, Filing Receipt, mailed Jun. 29, 2010, in Shafer's Involved Application.
BPAI Interference No. 105,834, *Omura* v. *Shafer*, Shafer, Ex. 2052, Filing Receipt, mailed Feb. 12, 2007, in Shafer's Parent Application.
BPAI Interference No. 105,834, *Omura* v. *Shafer*, Shafer, Ex. 2053, Declaration and Power of Attorney for Patent Application, filed Jun. 12, 2007, in Shafer's Parent Application.
BPAI Interference No. 105,834, *Omura* v. *Shafer*, Shafer, Ex. 2054, Notice to File Corrected Application Papers, mailed Jun. 29, 2010, in Shafer's Involved Application.
BPAI Interference No. 105,834, *Omura* v. *Shafer*, Shafer, Ex. 2055, Notice to File Missing Parts of Nonprovisional Application, mailed Mar. 15, 2005, in the '103 Application.
BPAI Interference No. 105,834, *Omura* v. *Shafer*, Shafer, Ex. 2056, Issue Notification, mailed May 21, 2008, in the '103 Application.
BPAI Interference No. 105,834, *Omura* v. *Shafer*, Shafer, Ex. 2057, Declaration and Power of Attorney for Patent Application, filed May 16, 2005, in the '103 Application.
Request for Invalidation by the Petitioner: Carl Zeiss GmbH, issued by the Chinese Patent Office for Chinese Patent No. ZL 200710306116.8 dated Sep. 29, 2013 (44 pages).
Request for Invalidation by the Petitioner: Carl Zeiss GmbH, issued by the Chinese Patent Office for Chinese Patent No. ZL 2008100859109 dated Sep. 29, 2013 (48 pages).
Request for Invalidation by the Petitioner: Carl Zeiss GmbH, issued by the Chinese Patent Office for Chinese Patent No. ZL 200480012069.0 dated Sep. 29, 2013 (50 pages).
Expert Declaration of Prof. Sun Liqun for Chinese Patent No. ZL 200480012069.0 dated Oct. 29, 2013 (46 pages).
Expert Declaration of Prof. Sun Liqun for Chinese Patent No. ZL 200710306116.8 dated Oct. 29, 2013 (35 pages).
Expert Declaration of Prof. Sun Liqun for Chinese Patent No. ZL 2008100859109 dated Oct. 29, 2013 (45 pages).
Decision Institution of Inter Partes Review 37 C.F.R. § 42.108 from IPR of U.S. Patent No. 7,348,575 (IPR2013-00363), tiled Dec. 16, 2013.
Patent Owner's Response to the Petition from IPR of U.S. Patent No. 7,348,575 (IPR2013-00363), filed Mar. 6, 2014.
Nikon Exhibit 2001 from IPR of US 7,348,575 (IPR2013-00363), filed Mar. 6, 2014, International Technology Roadmap for Semiconductors, 2003Edition, Lithography.
Nikon Exhibit 2002 from IPR of US 7,348,575 (IPR2013-00363), filed Mar. 6, 2014, Expert Declaration of Dr. Jose Sasian.
Nikon Exhibit 2003 from IPR of US 7,348,575 (IPR2013-00363), filed Mar. 6, 2014, Deposition Transcript of Richard C. Juergens dated Feb. 12, 2014 for IPR2013-00362.
Nikon Exhibit 2004 from IPR of US 7,348,575 (1PR2013-00363), filed Mar. 6, 2014, Deposition Transcript of Richard C. Juergens dated Feb. 13, 2014 for IPR2013-00363.
Nikon Exhibit 2005 from IPR of US 7,348,575 (IPR2013-00363), filed Mar. 6, 2014, Curriculum Vitae of Dr. Jose Sasian.
Nikon Substitute Exhibit. 2002, from IPR of US 7,348,575 (IPR2013-00363), filed Mar. 14, 2014, Expert Declaration of Dr. Jose Sasian.
Petitioner's Reply to Patent Owner's Response from IPR of U.S. Patent No. 7,348,575 (IPR2013-00363), entered May 28, 2014.
Zeiss Exhibit 1132 from IPR of US 7,348,575 (IPR2013-00363), filed May 28, 2014, OPTI 517 Lens Design Fall 2013.
Zeiss Exhibit 1133 from IPR of US 7,348,575 (IPR2013-00363), filed May 28, 2014, OPTI 517 Image Quality.
Zeiss Exhibit 1134 from IPR of US 7,348,575 (IPR2013-00363), filed May 28, 2014, U.S. Appl. No. 10/639,780 Mann Application.
Zeiss Exhibit 1135 from IPR of US 7,348,575 (IPR2013-00363), filed May 28, 2014, Deposition of Richard Juergen in IPR2013-00363 *Zeiss* v. *Nikon*.
Zeiss Exhibit 1136 from IPR of US 7,348,575 (IPR2013-00363), filed May 28, 2014, Deposition of Jose Sasian in 1PR2013-00362 *Zeiss* v. *Nikon*.
Zeiss Exhibit 1137 from IPR of US 7,348,575 (IPR2013-00363), filed May 28, 2014, U.S. Appl. No. 12/379,415 as filed.
Zeiss Exhibit 1138 from IPR of US 7,348,575 (IPR2013-00363), filed May 28, 2014, Office Action issued in U.S. Appl. No. 12/379,415 on Jan. 7, 2011.
Zeiss Exhibit 1139 from IPR of US 7,348,575 (IPR2013-00363), filed May 28, 2014, Amendment under 37 CFR 1.111 filed in U.S. Appl. No. 12/379,415 on Jul. 7, 2011.
Zeiss Exhibit 1140 from IPR of US 7,348,575 (IPR2013-00363), filed May 28, 2014, U.S. Patent No. 3,887,273 ("Griffiths").
Zeiss Exhibit 1141 from IPR of US 7,348,575 (IPR2013-00363), filed May 28, 2014, U.S. Patent No. 4,867,551 ("Perera").
Zeiss Exhibit 1142 from IPR of US 7,348,575 (IPR2013-00363), filed May 28, 2014, U.S. Patent No. 5,552,922 ("Margarill").
Zeiss Exhibit 1143 from IPR of US 7,348,575 (IPR2013-00363), filed May 28, 2014, U.S. Patent No. 7,631,975 ("Takaura").
Zeiss Exhibit 1144 from IPR of US 7,348,575 (IPR2013-00363), filed May 28, 2014, U.S. Patent No. 8,279,527 ("Lin").
Zeiss Exhibit 1145 from IPR of US 7,348,575 (IPR2013-00363), filed May 28, 2014, *GE Lighting Solutions, LLC* v. *Agilight*, Inc., No. 2013-1267, Slip. Op. 5 (Fed. Cir. May 1, 2014).
Petitioner's Reply to Patent Owner's Response from IPR of U.S. Patent No. 7,348,575 (IPR2013- 00362), entered May 28, 2014.
Zeiss Exhibit 1030 from IPR of US 7,348,575 (IPR2013-00362), filed May 28, 2014, US Patent Publication 2013/0329283 (cited as exhibit 1030 during May 7, 2014 cross examination of Dr. Sasian).
Zeiss Exhibit 1031 from IPR of US 7,348,575 (IPR2013-00362), filed May 28, 2014, US Patent No. 5,650,877 (cited as exhibit 1031 during May 7, 2014 cross-examination of Dr. Sasian).
Zeiss Exhibit 1032 from IPR of US 7,348,575 (IPR2013-00362), filed May 28, 2014, United States Court of Appeals for the Federal Circuit decision in *GE Lighting Solutions, LLC* v. *Agilent, Inc.*, Appeal No. 2013-1267 (May 1, 2014).
Zeiss Exhibit 1033 from IPR of US 7,348,575 (IPR2013-00362), filed May 28, 2014, Cross-examination Transcript of Dr. Sasian for IPR2013-00362 on May 7, 2014.
Zeiss Exhibit 1034 from IPR of US 7,348,575 (IPR2013-00362), filed May 28, 2014, U.S. Patent No. 7,450,300 ("Arriola Patent").
Zeiss Exhibit 1035 from IPR of US 7,348,575 (IPR2013-00362), filed May 28, 2014, File History for U.S. Appl. No. 60/431,370 ("Arriola Provisional").
Zeiss Exhibit 1036 from IPR of US 7,348,575 (IPR2013-00362), filed May 28, 2014, May 25, 2014 Declaration of Mr. Richard Juergens.

(56) References Cited

OTHER PUBLICATIONS

Zeiss Exhibit 1037 from IPR of US 7,348,575 (IPR2013-00362), filed May 28, 2014, Cross-examination Transcript of Dr. Sasian for 1PR2013-00363 on May 8, 2014.
Zeiss Exhibit 1038 from IPR of US 7,348,575 (IPR2013-00362), filed May 28, 2014, Code V Sequence cited in Zeiss 1036.
Zeiss Exhibit 1039 from IPR of US 7,348,575 (IPR2013-00362), filed May 28, 2014, Code V Sequence cited in Zeiss 1036.
Zeiss Exhibit 1040 from IPR of US 7,348,575 (IPR2013-00362), filed May 28, 2014, Code V Sequence cited in Zeiss 1036.
Zeiss Exhibit 1041 from IPR of US 7,348,575 (IPR2013-00362), filed May 28, 2014, Code V Sequence cited in Zeiss 1036.
Zeiss Exhibit 1042 from IPR of US 7,348,575 (IPR2013-00362), filed May 28, 2014, Code V Sequence cited in Zeiss 1036.
Zeiss Exhibit 1043 from IPR of US 7,348,575 (IPR2013-00362), filed May 28, 2014, Code V Sequence cited in Zeiss 1036.
Zeiss Exhibit 1044 from IPR of US 7,348,575 (IPR2013-00362), filed May 28, 2014, Code V Sequence cited in Zeiss 1036.
Zeiss Exhibit 1045 from IPR of US 7,348,575 (IPR2013-00362), filed May 28, 2014, Code V Sequence cited in Zeiss 1036.
Zeiss Exhibit 1046 from IPR of US 7,348,575 (IPR2013-00362), filed May 28, 2014, Code V Sequence cited in Zeiss 1036.
Zeiss Exhibit 1047 from IPR of US 7,348,575 (IPR2013-00362), filed May 28, 2014, Code V Sequence cited in Zeiss 1036.
Zeiss Exhibit 1048 from IPR of US 7,348,575 (IPR2013-00362), filed May 28, 2014, Code V Sequence cited in Zeiss 1036.
Zeiss Exhibit 1049 from IPR of US 7,348,575 (IPR2013-00362), filed May 28, 2014, Code V Sequence cited in Zeiss 1036.
Decision Institution of Inter Partes Review 37 C.P.R. § 42.108 from IPR of U.S. Patent No. 7,348,575 (IPR2013-00362), filed Dec. 16, 2013.
Patent Owner's Response to the Petition from IPR of U.S. Patent No. 7,348,575 (IPR2013-00362), filed Mar. 6, 2014.
Nikon Exhibit 2001from IPR of US 7,348,575 (IPR2013-00362), filed Mar. 6, 2014, Equation from the Feb. 12, 2014 Juergens Deposition.
Nikon Exhibit 2002from IPR of US 7,348,575 (IPR2013-00362), filed Mar. 6, 2014, Moore, "Cramming More Components onto Integrated Circuits," Proceedings of the IEEE, vol. 86, No. 1, Jan. 1998 (reprinted from Gordon E. Moore, "Cramming More Components onto Integrated Circuits," Electronics, pp. 114-117, Apr. 19, 1965).
Nikon Exhibit 2003from IPR of US 7,348,575 (IPR2013-00362), filed Mar. 6, 2014, International Technology Roadmap for Semiconductors, 2003 Edition, Lithography.
Nikon Exhibit 2004from IPR of US 7,348,575 (IPR2013-00362), filed Mar. 6, 2014, U.S. Patent No. 5,488,229.
Nikon Exhibit 2005from IPR of US 7,348,575 (IPR2013-00362), filed Mar. 6, 2014, Feldmann et al., "Catadioptric Projection Lenses for Immersion Lithography," Proc. of SPIE vol. 5962, 59620Y, 2005.
Nikon Exhibit 2006from IPR of US 7,348,575 (IPR2013-00362), filed Mar. 6, 2014, Ohmura et al., "Catadioptric lens development for DUV and VUV projection optics," Optical Microlithography XVI, Anthony Yen, editor, Proceedings of SPIE vol. 5040, Jun. 25, 2003.
Nikon Exhibit 2007 from IPR of US 7,348,575 (IPR2013-00362), filed Mar. 6, 2014, U.S. Patent No. 4,812,028.
Nikon Exhibit 2008 from IPR of US 7,348,575 (IPR2013-00362), filed Mar. 6, 2014, U.S. Patent No. 4,747,678.
Nikon Exhibit 2009 from IPR of US 7,348,575 (IPR2013-00362), filed Mar. 6, 2014, U.S. Patent No. 5,668,673.
Nikon Exhibit 2010 from IPR of US 7,348,575 (IPR2013-00362), filed Mar. 6, 2014, U.S. Patent No. 5,808,805.
Nikon Exhibit 2011 from IPR of US 7,348,575 (IPR2013-00362), filed Mar. 6, 2014, U.S. Patent No. 5,691,802.
Nikon Exhibit 2012 from IPR of US 7,348,575 (IPR2013-00362), filed Mar. 6, 2014, U.S. Patent No. 5,861,997.
Nikon Exhibit 2013 from IPR of US 7,348,575 (IPR2013-00362), filed Mar. 6, 2014, U.S. Patent No. 5,815,310.
Nikon Exhibit 2014 from IPR of US 7,348,575 (IPR2013-00362), filed Mar. 6, 2014, U.S. Patent No. 7,079,314.
Nikon Exhibit 2015 from IPR of US 7,348,575 (IPR2013-00362), filed Mar. 6, 2014, U.S. Patent No. 6,636,350.
Nikon Exhibit 2016 from IPR of US 7,348,575 (IPR2013-00362), filed Mar. 6, 2014, WO2001/59502.
Nikon Exhibit 2017 from IPR of US 7,348,575 (IPR2013-00362), filed Mar. 6, 2014, U.S. Patent No. 7,301,605.
Nikon Exhibit 2018 from IPR of US 7,348,575 (IPR2013-00362), filed Mar. 6, 2014, U.S. Patent No. 7,030,965.
Nikon Exhibit 2019 from IPR of US 7,348,575 (IPR2013-00362), filed Mar. 6, 2014, U.S. Patent Publication No. US2003/197922A.
Nikon Exhibit 2020 from IPR of US 7,348,575 (IPR2013-00362), filed Mar. 6, 2014, U.S. Patent No. 7,385,756.
Nikon Exhibit 2021 from IPR of US 7,348,575 (IPR2013-00362), filed Mar. 6, 2014, Deposition Transcript of Richard C. Juergens dated Feb. 12, 2014 for IPR2013-00362.
Nikon Exhibit 2022 from IPR of US 7,348,575 (IPR2013-00362), filed Mar. 6, 2014, Deposition Transcript of Richard C. Juergens dated Feb. 13, 2014 for IPR2013-00363.
Nikon Exhibit 2023 from IPR of US 7,348,575 (IPR2013-00362), filed Mar. 6, 2014, U.S. Patent No. 5,788,229.
Nikon Exhibit 2024 from IPR of US 7,348,575 (IPR2013-00362), filed Mar. 6, 2014, Expert Declaration of Dr. Jose M. Sasian.
Nikon Exhibit 2025 from IPR of US 7,348,575 (IPR2013-00362), filed Mar. 6, 2014, Curriculum Vitae of Dr. Jose M. Sasian.
Nikon Exhibit 2026 from IPR of US 7,348,575 (IPR2013-00362), filed Mar. 6, 2014, Certified Translation of WO2001/59502 (Ex. 2016).
Nikon Exhibit 2027 from IPR of US 7,348,575 (IPR2013-00362), filed Mar. 6, 2014, U.S. Patent No. 4,293,186.
Nikon Exhibit 2028 from IPR of US 7,348,575 (IPR2013-00362), filed Mar. 6, 2014, U.S. Patent No. 5,298,939.

* cited by examiner ved.

IMMERSION CATADIOPTRIC PROJECTION OBJECTIVE HAVING TWO INTERMEDIATE IMAGES

CROSS-REFERENCE TO RELATED APPLICATIONS

This application is a continuation of U.S. application Ser. No. 13/470,956, filed May 14, 2012, which is a continuation of U.S. application Ser. No. 11/653,366, filed Jan. 16, 2007, now U.S. Pat. No. 8,208,198 issued on Jun. 26, 2012, which is a continuation-in-part of International Application PCT/EP2005/007431, filed Jul. 8, 2005, which claims benefit of U.S. Provisional Applications 60/587,504, filed Jul. 14, 2004, 60/591,775, filed Jul. 27, 2004, 60/612,823, filed Sep. 24, 2004, 60/617,674, filed Oct. 13, 2004, 60/654,950, filed Feb. 23, 2005, and is further a continuation-in-part of U.S. application Ser. No. 11/035,103, filed Jan. 14, 2005, now U.S. Pat. No. 7,385,756, issued on Jun. 10, 2008. U.S. application Ser. No. 11/035,103 claims benefit of U.S. Provisional Applications 60/536,248, filed Jan. 14, 2004, 60/587,504, filed Jul. 14, 2004, 60/591,775, filed Jul. 27, 2004, 60/612,823, filed Sep. 24, 2003, and 60/617,674, filed Oct. 13, 2004. The disclosures of each of these related applications are hereby incorporated by reference into the present continuation application.

BACKGROUND OF THE INVENTION

1. Field of the Invention

The invention relates to a catadioptric projection objective for imaging a pattern arranged in an object surface onto an image surface.

2. Description of the Related Art

Projection objectives of that type are employed on projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale. In order create even finer structures, it is sought to both increase the image-end numerical aperture (NA) of the projection objective to be involved and employ shorter wavelengths, preferably ultraviolet light with wavelengths less than about 260 nm.

However, there are very few materials, in particular, synthetic quartz glass and crystalline fluorides, that are sufficiently transparent in that wavelength region available for fabricating the optical elements required. Since the Abbé numbers of those materials that are available lie rather close to one another, it is difficult to provide purely refractive systems that are sufficiently well color-corrected (corrected for chromatic aberrations).

In lithography, a flat (planar) image is essential to expose planar substrates, such as semiconductor wafers. However, generally the image surface of an optical system is curved, and the degree of curvature is determined by the Petzval sum. The correction of the Petzval sum is becoming more important in view of the increasing demands to project large object fields on planar surfaces with increased resolution.

One approach for obtaining a flat image surface and good color-correction is the use of catadioptric systems, which combine both refracting elements, such as lenses, and reflecting elements, such as mirror, preferably including at least one concave mirror. While the contributions of positive-powered and negative-powered lenses in an optical system to overall power, surface curvature and chromatic aberrations are opposite to each other, a concave mirror has positive power like a positive-powered lens, but the opposite effect on surface curvature without contributing to chromatic aberrations.

Further, the high prices of the materials involved and limited availability of crystalline calcium fluoride in sizes large enough for fabricating large lenses represent problems. Measures that will allow reducing the number and sizes of lenses and simultaneously contribute to maintaining, or even improving, imaging fidelity are thus desired.

Catadioptric projection objectives having at least two concave mirrors have been proposed to provide systems with good color correction and moderate lens mass requirements. The U.S. Pat. No. 6,600,608 B1 discloses a catadioptric projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and provides good color correction axially and laterally. However, since the reflecting surfaces of the concave mirrors are interrupted at the bores, the pupil of the system is obscured.

The Patent EP 1 069 448 B1 discloses another catadioptric projection objective having two concave mirrors facing each other. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors are disclosed in Japanese patent application JP 2002208551 A and US patent application US 2002/00241 A1.

European patent application EP 1 336 887 (corresponding to US 2004/0130806 A1) discloses catadioptric projection objectives having one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors. Concave mirrors are positioned optically near to pupil surfaces closer to pupil surfaces than to the intermediate images of the projection objectives.

International Patent application WO 2004/107011 A1 discloses catadioptric projection objectives having one common straight optical axis and two or more intermediate images and suitable for immersion lithography with numerical apertures up to NA=1.2. At least one concave mirror is positioned optically near to a pupil surface closer to that pupil surface than to an intermediate image of the projection objective.

In the article "Nikon Projection Lens Update" by T. Matsuyama, T. Ishiyama and Y. Ohmura, presented by B. W. Smith in: Optical Microlithography XVII, Proc. of SPIE 5377.65 (2004) a design example of a catadioptric projection lens is shown, which is a combination of a conventional dioptric DUV system and a 6-mirror EUV catoptric system inserted between lens groups of the DUV system. A first intermediate image is formed behind the third mirror of the catoptric (purely reflective) group upstream of a convex mirror. The second intermediate image is formed by a purely reflective (catoptric) second objective part. The third objective part is purely refractive featuring negative refractive power at a waist of minimum beam diameter within the third objective part for Petzval sum correction.

Japanese patent application JP 2003114387 A and international patent application WO 01/55767 A disclose catadioptric projection objectives having one common straight optical axis, a first catadioptric objective part for forming an intermediate image and a second catadioptric objective part for imaging the intermediate image onto the image plane of this system. Concave and convex mirrors are used in combination.

The article "Camera view finder using tilted concave mirror erecting elements" by D. DeJager, SPIE. Vol. 237 (1980) p. 292-298 discloses camera view finders comprising two concave mirrors as elements of a 1:1 telescopic erecting relay system. The system is designed to image an object at infinity into a real image, which is erect and can be viewed through an eyepiece. Separate optical axes of refractive system parts upstream and downstream of the catoptric relay system are parallel offset to each other. In order to build a system having concave mirrors facing each other mirrors must be tilted. The authors conclude that physically realizable systems of this type have poor image quality.

International patent applications WO 92/05462 and WO 94/06047 and the article "Innovative Wide-Field Binocular Design" in OSA/SPIE Proceedings (1994) pages 389ff disclose catadioptric optical systems especially for binoculars and other viewing instruments designed as in-line system having a single, unfolded optical axis. Some embodiments have a first concave mirror having an object side mirror surface arranged on one side of the optical axis and a second concave mirror having a mirror surface facing the first mirror and arranged on the opposite side of the optical axis such that the surface curvatures of the concave mirrors define and intermirror space. A front refractive group forms a first intermediate image near the first mirror and a second intermediate image is formed outside of the space formed by the two facing mirrors. A narrow field being larger in a horizontal direction than in a vertical direction is arranged offset to the optical axis. The object side refractive group has a collimated input and the image side refractive group has a collimated output and entrance and exit pupils far from telecentric are formed. The pupil shape is semi-circular unlike pupil surfaces in lithographic projection lenses, which have to be circular and centered on the optical axis.

The PCT application WO 01/044682 A1 discloses catadioptric UV imaging systems for wafer inspection having one concave mirror designed as Mangin mirror.

Catadioptric projection objectives consisting of a catadioptric imaging subsystem having one single concave mirror and arranged between an entry side and an exit side refractive imaging subsystem (so-calles R-C-R systems) are disclosed, for example, in U.S. application with Ser. No. 60/573,533 filed on May 17, 2004 by the applicant. Other examples of R-C-R-systems are shown in US 2003/0011755, WO 03/036361 or US 2003/0197946.

US patent application with title "Catadioptric Projection Objective" filed by the applicant on Jan. 14, 2005 (based on U.S. provisional applications 60/536,248 filed on Jan. 14, 2004; U.S. 60/587,504 filed Jul. 14, 2004; 60/617,674 filed Oct. 13, 2004; 60/591,775 filed Jul. 27, 2004; and 60/612,823 filed Sep. 24, 2004) discloses catadioptric projection objectives having very high NA and suitable for immersion lithography at NA>1 with maximum values NA=1.2. The projection objectives comprise: a first objective part for imaging the pattern provided in the object plane into a first intermediate image, a second objective part for imaging the first intermediate imaging into a second intermediate image, and a third objective part for imaging the second intermediate imaging directly onto the image plane. The second objective part includes a first concave mirror having a first continuous mirror surface and a second concave mirror having a second continuous mirror surface, the concave mirror faces facing each other and defining an intermirror space. All concave mirrors are positioned optically remote from pupil surfaces. The system has potential for very high numerical apertures at moderate lens mass consumption. The full disclosure of this document and the priority documents thereof is incorporated into the present application by reference.

SUMMARY OF THE INVENTION

It is one object of the invention to provide a catadioptric projection objective suitable for use in the vacuum ultraviolet (VUV) range having potential for very high image side numerical aperture which may be extended to values allowing immersion lithography at numerical apertures NA>1. It is another object to provide catadioptric projection objectives that can be build with relatively small amounts of optical material. It is yet another object to provide compact high-aperture catadioptric projection objectives having moderate size.

As a solution to these and other objects the invention, according to one formulation, provides a catadioptric projection objective for imaging a pattern provided in an object surface of the projection objective onto an image surface of the projection objective comprising:

a first, refractive objective part for imaging the pattern provided in the object plane into a first intermediate image;

a second objective part including at least one concave mirror for imaging the first intermediate imaging into a second intermediate image;

a third, refractive objective part for imaging the second intermediate imaging onto the image plane; wherein:

the projection objective has a maximum lens diameter $D_{max}$, a maximum image field height Y', and an image side numerical aperture NA; wherein $$COMP1 = D_{max}/(Y' \cdot NA^2)$$

and wherein the following condition holds:

$$COMP1 < 10$$

Generally, the dimensions of projection objectives tend to increase dramatically as the image side numerical aperture NA is increased. Empirically it has been found that the maximum lens diameter $D_{max}$ tends to increase stronger than linear with increase of NA according to $D_{max} \sim NA^k$, where k>1. A value k=2 is an approximation used for the purpose of this application. Further, it has been found that the maximum lens diameter $D_{max}$ increases in proportion to the image field size (represented by the image field height Y'). A linear dependency is assumed for the purpose of the application. Based on these considerations a first compactness parameter COMP1 is defined as:

$$COMP1 = D_{max}/(Y' \cdot NA^2).$$

It is evident that, for given values of image field height and numerical aperture, the first compaction parameter COMP1 should be as small as possible if a compact design is desired.

Considering the overall material consumption necessary for providing a projection objective, the absolute number of lenses, $N_L$ is also relevant. Typically, systems with a smaller number of lenses are preferred to systems with larger numbers of lenses. Therefore, a second compactness parameter COMP2 is defined as follows:

$$COMP2 = COMP1 \cdot N_L.$$

Again, small values for COMP2 are indicative of compact optical systems.

Further, projection objectives according to the invention have at least three objective parts for imaging an entry side field plane into an optically conjugate exit side field plane, where the imaging objective parts are concatenated at intermediate images. Typically, the number of lenses and the overall material necessary to build a projection objective will increase the higher the number $N_{OP}$ of imaging objective parts of the optical system is. It is desirable to keep the average number of lenses per objective part, $N_L/N_{OP}$, as small as possible. Therefore, a third compactness parameter COMP3 is defined as follows:

$$COMP3 = COMP1 \cdot N_L/N_{OP}.$$

Again, projection objectives with low optical material consumption will be characterized by small values of COMP3.

A value COMP1<10 indicates a very compact design. Even values of COMP1<9.6 are obtained in some embodiments. In some embodiments the low compactness is obtained although the numerical aperture is larger than 1.2 (i.e. NA>1.2). Embodiments with NA=1.3 or NA=1.35 are possible and allow ultra-high resolution immersion lithography.

In some embodiments, low values for the second compactness parameter can be obtained. In some embodiments COMP2<260 and/or COMP2<240 is obtained. Embodiments with COMP2<220 are possible.

Alternatively, or in addition, low values for the third compactness parameter COMP3 are possible. In some embodiments COMP3<80, and lower values of COMP3<70 are also possible.

In preferred embodiments, a first concave mirror having a first continuous mirror surface and at least one second concave mirror having a second continuous mirror surface are arranged in the second objective part; pupil surfaces are formed between the object plane and the first intermediate image, between the first and the second intermediate image and between the second intermediate image and the image plane; and all concave mirrors are arranged optically remote from a pupil surface.

In these embodiments a circular pupil centered around the optical axis is be provided in a centered optical system. Two or more concave mirrors in the system parts contributing to forming the second intermediate image are provided, where the used area of the concave mirrors deviates significantly from an axial symmetric illumination. In preferred embodiments exactly two concave mirrors are provided and are sufficient for obtaining excellent imaging quality and very high numerical aperture. Systems having one common unfolded (straight) optical axis can be provided which facilitate manufacturing, adjustment and integration into photolithographic exposure systems. No planar folding mirrors are necessary. However, one or more planar folding mirrors could be utilized to obtain more compact designs.

All concave mirrors are arranged "optically remote" from pupil surfaces which means that they are arranged outside an optical vicinity of a pupil surface. They may be arranged optically nearer to field surfaces than to pupil surfaces. Preferred positions optically remote from a pupil surface (i.e. outside an optical vicinity of a pupil surface) may be characterized by the ray height ratio $H = h_C/h_M > 1$, where $h_C$ is the height of a chief ray and $h_M$ is the height of a marginal ray of the imaging process. The marginal ray height $h_M$ is the height of a marginal ray running from an inner field point (closest to the optical axis) to the edge of an aperture stop, whereas the chief ray height $h_C$ is the height of a chief ray running from an outermost field point (farthest away from the optical axis) parallel to or at small angle with respect to the optical axis and intersecting the optical axis at a pupil surface position where an aperture stop may be positioned. With other words: all concave mirrors are in positions where the chief ray height exceeds the marginal ray height.

A position "optically remote" from a pupil surface is a position where the cross sectional shape of the light beam deviates significantly from the circular shape found in a pupil surface or in an immediate vicinity thereto. The term "light beam" as used here describes the bundle of all rays running from the object surface to the image surface. Mirror positions optically remote from a pupil surface may be defined as positions where the beam diameters of the light beam in mutually perpendicular directions orthogonal to the propagation direction of the light beam deviate by more than 50% or 100% from each other. In other words, illuminated areas on the concave mirrors may have a shape having a form strongly deviating from a circle and similar to a high aspect ratio rectangle corresponding to a preferred field shape in lithographic projection objectives for wafer scanners. Therefore, small concave mirrors having a compact rectangular or near rectangular shape significantly smaller in one direction than in the other may be used. A high aperture light beam can therefore be guided through the system without vignetting at mirror edges.

Throughout the specification, the term "objective part" designates an imaging subsystem of the projection objective capable of imaging an object in an object surface of that subsystem into an image surface of the subsystem optically conjugated to the object surface of the subsystem. The object imaged by a subsystem (or objective part) may be the object in the object surface of the projection objective, or an intermediate image.

Wherever the terms "upstream" or "downstream" are used in this specification these terms refer to relative positions along the optical path of a light beam running from the object plane to the image plane of the projection objective. Therefore, a position upstream of the second intermediate image is a position optically between the object plane and the second intermediate image.

The term "intermediate image" generally refers to a "paraxial intermediate image" formed by a perfect optical system and located in a surface optically conjugated to the object surface. Therefore, wherever reference is made to a location or position of an intermediate image, the axial location of this surface optically conjugated to the object surface is meant.

According to another aspect of the invention, a catadioptric projection objective for imaging a pattern provided in an object surface of the projection objective onto an image surface of the projection objective comprises:
a first, refractive objective part for imaging the pattern provided in the object surface into a first intermediate image;
a second objective part for imaging the first intermediate image into a second intermediate image;
a third, refractive objective part for imaging the second intermediate image onto the image surface;
wherein a first concave mirror having a first continuous mirror surface and at least one second concave mirror having a second continuous mirror surface are arranged upstream of the second intermediate image;
pupil surfaces are formed between the object plane and the first intermediate image, between the first and the second intermediate image and between the second intermediate image and the image plane;
all concave mirrors are arranged optically remote from a pupil surface;
the first objective part has a first number $N1_{AS}$ of aspheric lenses;
the third objective part has a second number $N3_{AS}$ of aspheric lenses;
an aspheric lens ratio $ASR=N1_{AS}/N3_{AS}$ is smaller than 1; and
an image side numerical aperture NA is larger than 1.2.

Although it would be desired from a manufacturing point of view to have lenses with spherical lens surfaces only, it appears that a certain number of aspheric lenses are required to obtain sufficient correction of image aberrations. It has been found that in designs where the third objective part has more aspheric lenses than the first objective part have potential for obtaining a good correction status without increasing the overall number, $N_{AS}$, of aspheric lenses in the projection objective above a critical limit where the manufacturing of aspheric lenses becomes a critical issue due to the high number of aspheric lenses to be manufactured.

In some embodiments the first objective part has spherical lenses only such that $N1_{AS}=0$. All-spherical refractive objective parts are particularly easy to manufacture. An all-spherical first objective part may be combined with a third objective part having one or more aspheric lenses, for example 1 or 2 or 3 or 4 or 5 lenses. Preferably the condition $1 \le N3_{AS} \le 7$ is fulfilled.

Preferably, the first objective part has no more than 4 aspheric lenses, i.e. $N1_{AS} \le 4$.

It has been found that the first objective part can be built in many cases with a small number of lenses, thereby optimizing lens material consumption and a compact size of the first objective part particularly in axial direction. In some embodiments, the first objective part includes no more than 5 lenses such that the number $N1_L$ of lenses in the first objective part fulfills the condition $N1_L<5$. Embodiments with $N1_L=4$ are possible. It appears, however, that $N1_L=5$ may be preferable in many cases.

In some embodiments, the first objective part has positive lenses only, whereby formation of the first intermediate image can be obtained with small maximum lens diameters in the first objective part. In other embodiments, at least one negative lens may be useful, particularly for improving correction within the first objective part. Exactly one negative lens is often preferred for that purpose. The negative lens may have a concave lens surface on the image side and may be placed between the pupil surface of the first objective part and the first intermediate image.

It is known that aspheric surfaces provided on optical elements, such as lenses, mirrors and/or essentially planar faces of plates, prisms or the like can be utilized to improve both the correction status and the overall size and material consumption of optical systems. In some embodiments, the projection objective includes at least one "double asphere" comprising a first aspheric surface and a second aspheric surface immediately adjacent to the first aspheric surface, thereby allowing a transmitted beam to pass two subsequent aspheric surfaces without passing an intermediate spheric or planar surface. Double aspheres have proven to be a very powerful correction means in some embodiments.

A double asphere may take the structure of a biaspherical lens having an aspheric entrance surface and an aspheric exit surface. In some preferred embodiments the double asphere is formed by facing adjacent aspheric surfaces of two subsequent lenses. Thereby, an "air space" bounded by aspheric surfaces on both the entry and exit side can be obtained. The "air space" can be filled with air of another gas having refractive index $n \approx 1$. Where aspheric surfaces of a double asphere are distributed on facing lens surfaces of subsequent lenses, the aspheric surfaces can be positioned very close together if desired. An optical distance, measured along the optical axis, between the first and second aspheric surface of the double asphere may therefore be smaller than the thickness (measured along the optical axis) of the thinner one of consecutive lenses forming the double asphere. A complex radial distribution of refractive power can thereby be obtained at a defined position in an axially narrow region along the optical axis.

In some embodiments, the third objective part includes at least one double asphere. Preferably, that double asphere is positioned optically between the second intermediate image and the pupil surface of the third objective part, thereby preferably influencing the ray angles in a region of generally diverging beams. A second double asphere may be provided in that objective part.

Alternatively, or in combination, the first objective part may include at least one double asphere. Where a double asphere is provided within the first objective part, it has been found beneficial when the double asphere in the first objective part is positioned optically close to or at a pupil surface of the first objective part.

As pointed out earlier, avoiding large numbers of aspheric surfaces on lenses may contribute to facilitating manufacturing of the projection objective. Under certain conditions, the correcting action of a single aspheric surface can be approximated by one or more spherical surfaces where large angles of incidence of rays occur on that surface. In some embodiments, the first objective part includes at least one lens having a lens surface where incidence angles of rays transiting that lens surface include incidence angles larger than 60°. Preferably, that surface may be optically close to the pupil surface. The angle of incidence (incidence angle) in this case is defined as the angle enclosed by a ray and the surface normal of the lens surface at the point of impingement of that ray on the lens surface. High incidence angle surfaces of that kind may be employed to reduce the number of aspheres.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments of the invention, the term "optical axis" shall refer to a straight line or sequence of straight-line segments passing through the centers of curvature of the optical elements involved. The optical axis is folded by folding mirrors (deflecting mirrors) or other reflective surfaces. In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the light propagation direction).

Figure 1:
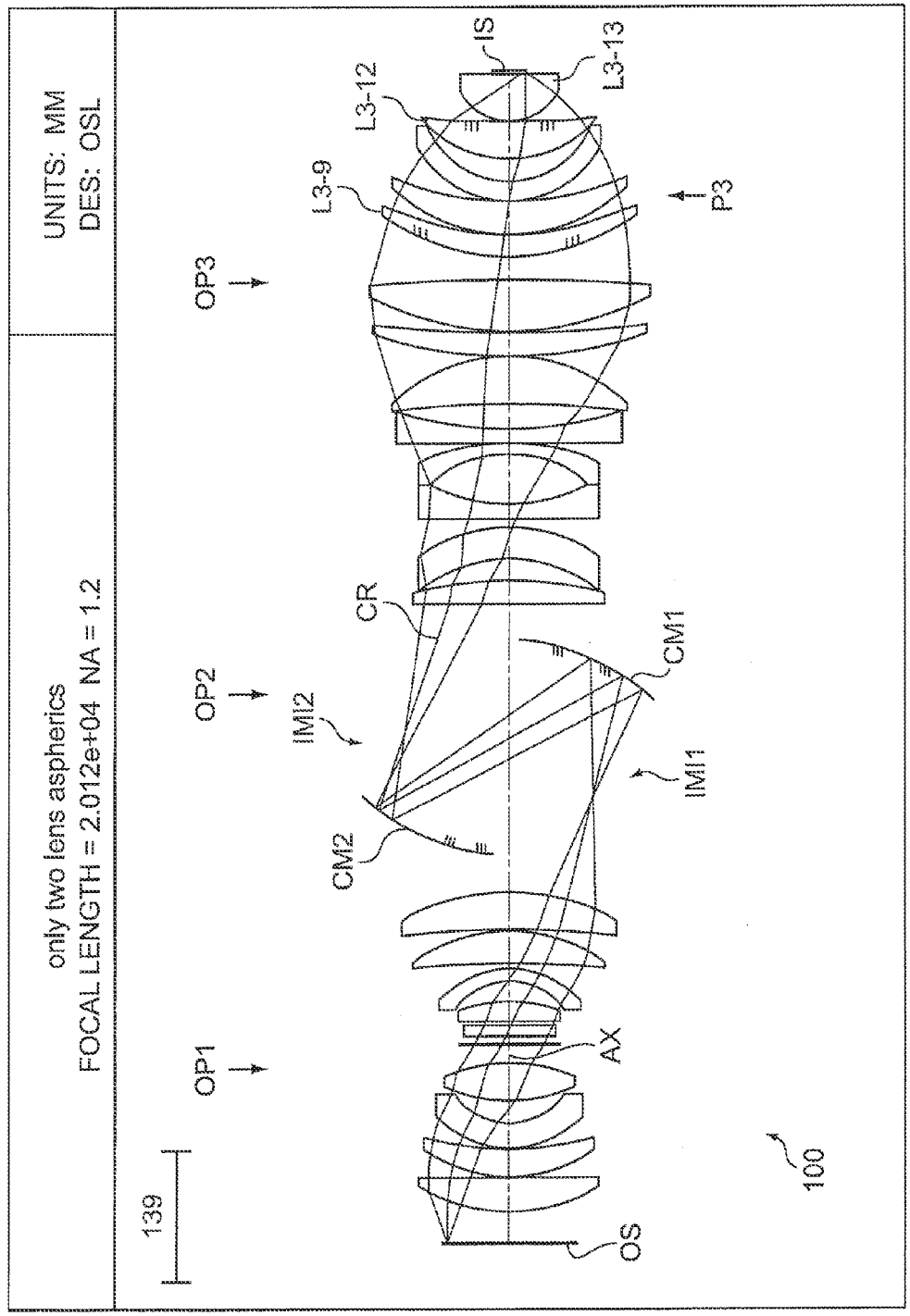
FIG. 1 is a longitudinally sectioned view of a first embodiment of a projection objective according to the invention.

FIG. 1 shows a first embodiment of a catadioptric projection lens 100 according to the invention designed for ca. 193 nm UV working wavelength. It is designed to project an image of a pattern on a reticle arranged in the planar object surface OS (object plane) into the planar image surface IS (image plane) on a reduced scale, for example, 4:1, while creating exactly two real intermediate images IMI1, IMI2. A first refractive objective part OP1 is designed for imaging the pattern in the object surface into the first intermediate image IMI1 at an enlarged scale. A second, catoptric (purely reflective) objective part OP2 images the first intermediate image IMI1 into the second intermediate image IMI2 at a magnification close to 1:1. A third, refractive objective part OP3 images the second intermediate image IMI2 onto the image surface IS with a strong reduction ratio. The second objective part OP2 comprises a first concave mirror CM1 having the concave mirror surface facing the object side, and a second concave mirror CM2 having the concave mirror surface facing the image side. The mirror surfaces are both continuous or unbroken, i.e. they do not have a hole or bore. The mirror surfaces facing each other define a catadioptric cavity, which is also denoted intermirror space, enclosed by the curved surfaces defined by the concave mirrors. The intermediate images IMI1, IMI2 are both situated inside the catadioptric cavity well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry.

The objective 100 is rotational symmetric and has one straight optical axis AX common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting.

The projection objective 100 is designed as an immersion objective for λ=193 nm having an image side numerical aperture NA=1.2 when used in conjunction with the high index immersion fluid, e.g. pure water, between the exit surface of the objective closest to the image surface IS, and the image surface IS. The refractive first objective part OP1 has spherical lenses only. Both concave mirrors CM1, CM2 are aspherical mirrors. The third objective part OP3 has one aspheric surface (entrance surface of lens L3-9) near the position of the pupil surface P3 of that objective part (where the chief ray CR of the imaging intersects the optical axis AX) and a second aspheric surface on the exit side of the penultimate lens L3-12 immediately upstream of the last, image side piano-convex lens L3-13. The last lens, which will be in contact with an immersion fluid during operation of the projection objective, is also denoted "immersion lens" in this specification. Although the projection objective is not fully corrected for all aberrations, it shows that an imaging is possible with a small number of aspheric lenses ($N_{AS}=2$) all placed in the third objective part.

Figure 2:
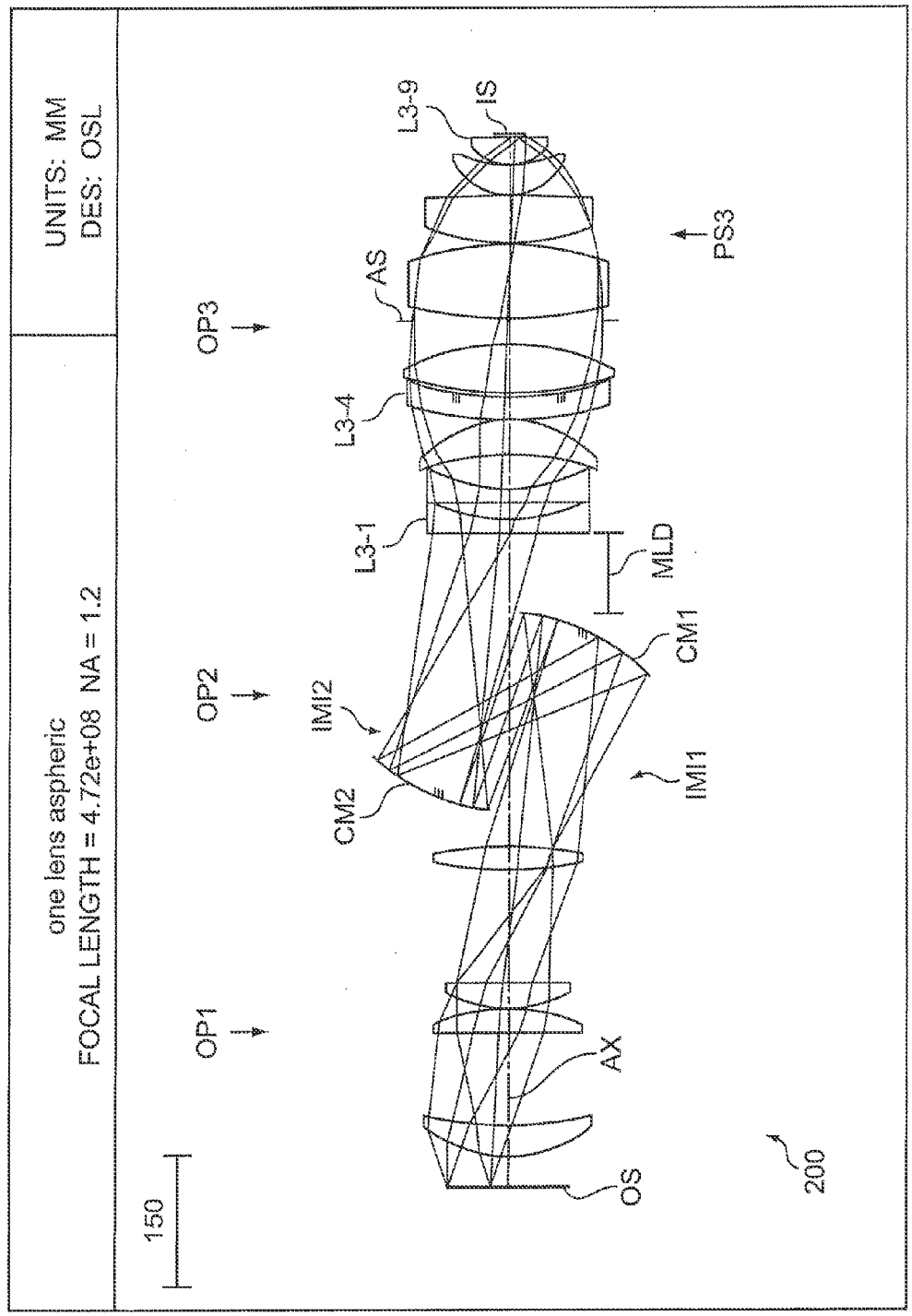
FIG. 2 is a longitudinally sectioned view of a second embodiment of a projection objective according to the invention.

FIG. 2 shows a second embodiment of a projection objective 200 having an all-spheric first objective part OP1 and only one aspheric lens L3-4 in third objective part OP3. An aperture stop AS is placed in the third objective part in the region of the pupil surface PS3 thereof. There is no need for a well-corrected position for an aperture stop in the first objective part OP1, which, in this case, consists of only four lenses, all lenses being spherical positive lenses. Thereby, a very simple and compact construction of the first objective part is obtained.

The projection objective 200 is designed as an immersion lens for λ=193 nm having an image side numerical aperture NA=1.20 when used in conjunction with a high index immersion fluid, e.g. pure water, between the exit surface of the objective and the image surface. The specification for this design is summarized in Table 2. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of the material employed for its fabrication. The sixth column lists the optically utilizable, clear, semi diameter [mm] of the optical component. A radius r=0 in a table designates a planar surface (having infinite radius).

In the case of this particular embodiment, three surfaces (surfaces 9, 10, 18) are aspherical surfaces. Table 2A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2 h^2))]+C1 \cdot h^4 + C2 \cdot h^6 + \ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 2A.

It is remarkable that in this embodiment many aberrations are corrected to a high degree with a small number of lenses ($N_L$=13) and only one aspheric lens (L3-4) in addition to the aspheric concave mirrors CM1, CM2. Particularly, all third-order and fifth-order aberrations are zero. The variation in telecentricity is corrected over the field. Higher-order (seventh-order and higher) distortion is corrected over the field. Pupil aberration on the image side is corrected so that the image side numerical aperture NA=1.2 is constant over the field. Two real rays are corrected on-axis and four aperture rays are corrected at an intermediate field point. Higher-order (seventh-order and higher) astigmatism is corrected at the edge of the field and at an intermediate field point. This correction status is obtained with an objective where the lens diameters of the third objective part (acting as a focusing lens group) are quite small, with 218 mm diameter for the largest lens. The first lens L3-1 of the third objective part has a relatively large geometrical distance to the vertex of the geometrically nearest mirror (first concave mirror CM1), where that axial mirror-lens-distance MLD is 90 mm. This is about 7.5% of the axial distance between object surface OS and image surface IS, this object-image distance also being denoted as "track length". A large geometrical distance MLD between the image side first concave mirror CM1 and the first lens of the third objective part contributes to small lens diameters in the third objective part.

The last lens L3-9 on the image side (immersion lens) has a short radius (50 mm) of the spherical entrance surface, whereby small incidence angles are obtained at that surface.

Figure 3:
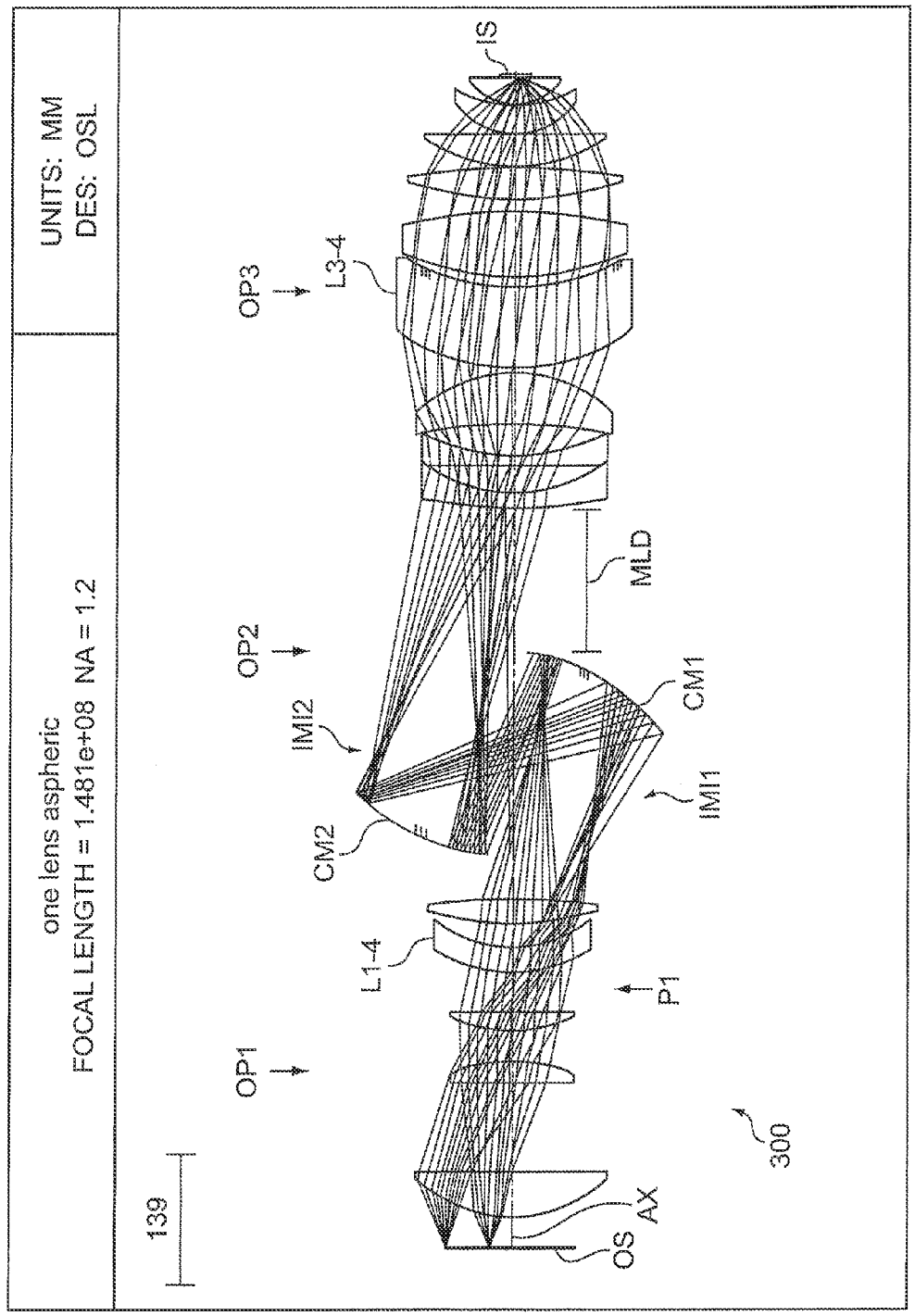
FIG. 3 is a longitudinally sectioned view of a third embodiment of a projection objective according to the invention.

The design can be optimized with regard to residual aberrations, where higher order Petzval curvature and higher order sagitta oblique spherical aberration appears to dominate. Adding one lens to the first objective part and/or providing one or more further aspheric surfaces can contribute to reduce the residual aberrations. An example of a further development of the design of FIG. 2 is shown in FIG. 3, where an additional negative lens L1-4 designed as a meniscus lens having an image side concave surface is added in the first objective part between the pupil surface P1 thereof and the first intermediate image. This modification allows to correct the mentioned residual aberrations. This example exemplifies, amongst others, that the basic design allows high flexibility for correcting imaging errors within overall simple construction with small number of lenses and a small number of aspherical lenses.

Figure 4:
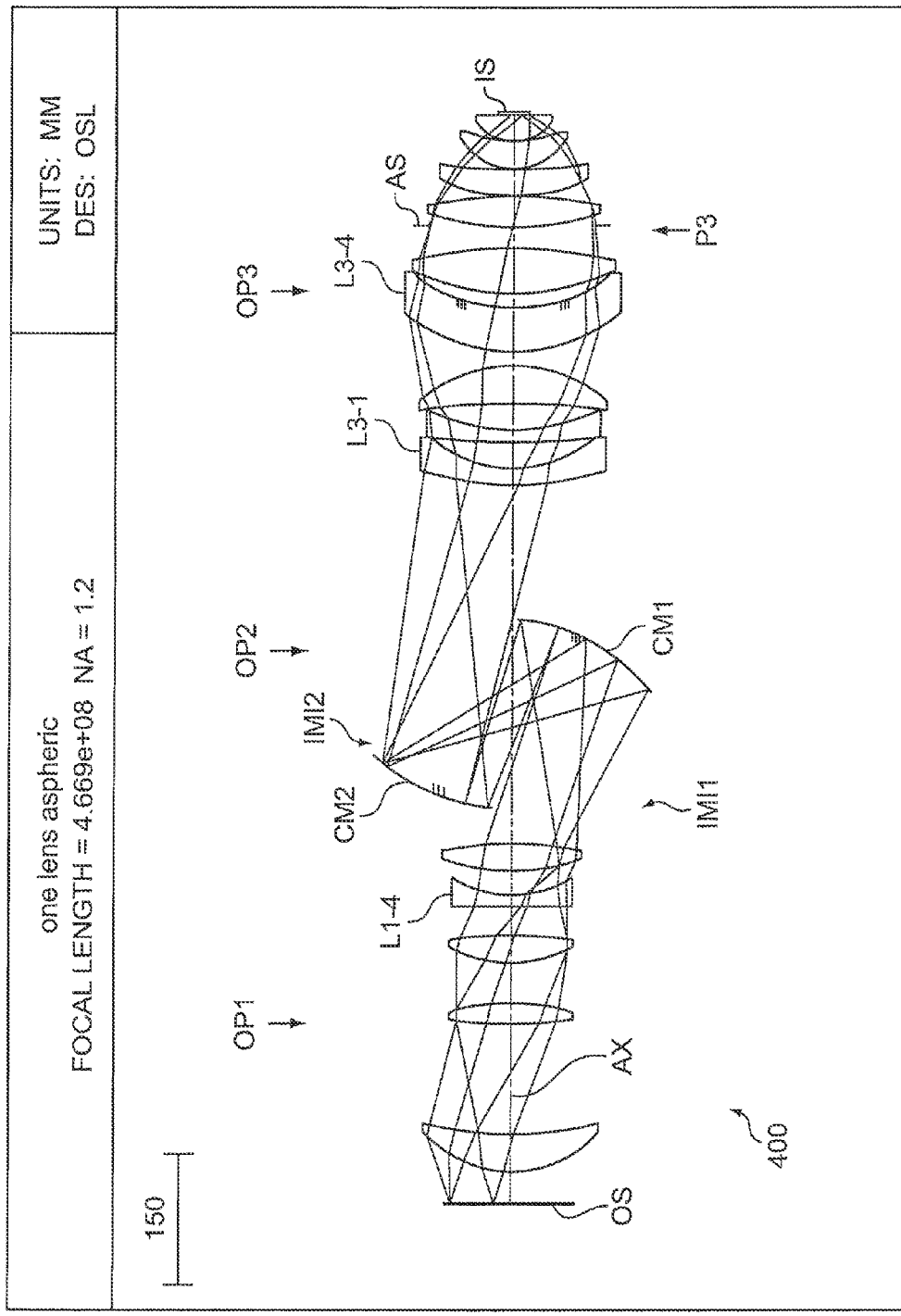
FIG. 4 is a longitudinally sectioned view of a fourth embodiment of a projection objective according to the invention.

A fourth embodiment of a projection objective 400 is shown in FIG. 4, the specification thereof is given in tables 4 and 4A. Similar to the embodiments of FIGS. 2 and 3, there is only one aspheric lens, namely positive meniscus lens L3-4 having an aspheric exit surface, in that system, placed in the third objective part OP3 in the region of largest beam diameter upstream of the aperture stop AS optically close to the pupil surface P3 of that objective part. The first objective part OP1 is all-spherical, having only one negative lens L1-4 in a sequence P-P-P-N-P, where "P" denotes a positive lens and "N" denotes a negative lens. From a construction point of view, a large axial distance between the vertex of the image side concave mirror CM1 and the first lens L3-1 of the third objective part OP3 is apparent, this distance MLD being more than 10% of the track length.

Figure 5:
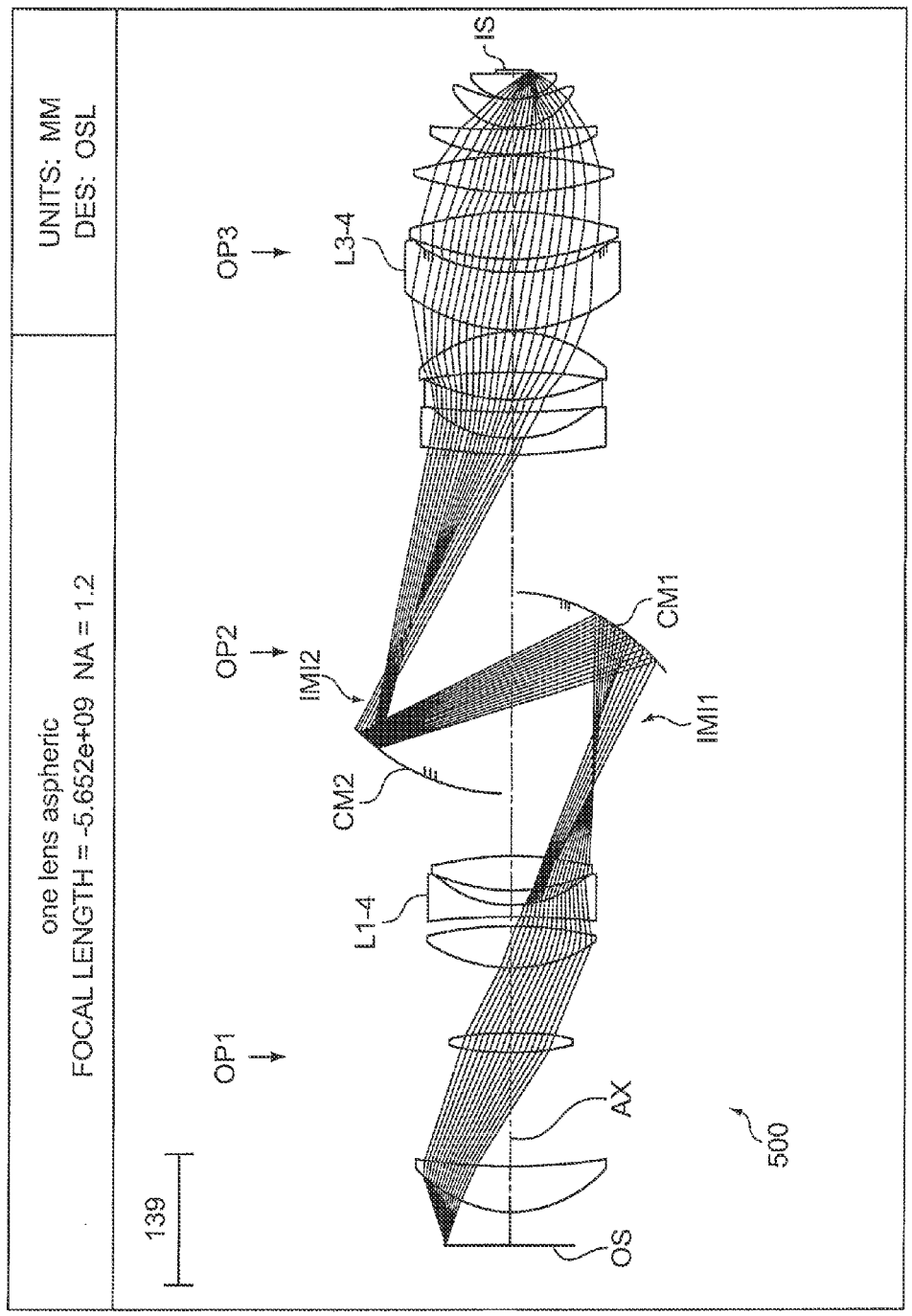
FIG. 5 is a longitudinally sectioned view of a fifth embodiment of a projection objective according to the invention.

FIG. 5 shows a variant of the systems of FIGS. 3 and 4, where slight modifications predominantly in the first objective part OP1 were applied to a improve correction. The resulting design of FIG. 5 has two field points that are corrected for both astigmatism and Petzval curvature, and the field zone with no astigmatism is in focus.

In preferred designs of the invention, distortion, astigmatism, Petzval curvature and telecentricity variation over the field can all be corrected to very high orders with a similar construction of the first objective part OP1 (serving as a relay system to form the first intermediate image IMI1) and only a few spherical lenses in addition to the aspheric mirrors.

It appears that two aspheric concave mirrors CM1, CM2 are important for obtaining good correction with a small number of aspheric lenses. Two aspheric mirrors generally allow to make a design that is corrected for two chief ray aberrations, like distortion and telecentricity variation, to very high orders. It appears that those two aberrations can be exactly corrected by the two aspheric mirrors if the aspheric deformations of that mirrors are set correctly. It is one remarkable aspect, that, in addition, the astigmatism and Petzval curvature can also be corrected to a high degree with an all-spherical first objective part OP1.

It appears that there are at least three characteristics, which, singly or in combination, can contribute to the positive properties of the design type with regard to aberration corrections. One aspect is that the concave mirrors may preferably be quite unequal in radius, compared to other embodiments where the concave mirrors CM1, CM2 are identical or almost identical. Further, it appears that quite a lot of coma at the intermediate images IMI1 and/or IMI2 facilitates correction with a small number of aspheric lenses. Also, the remarkably large air space (mirror-lens-distance MLD) between the vertex of the image side concave mirror CM1 and the first lens of the third objective part appears to contribute to that beneficial properties.

It appears that the object side and the image side and/or the projection objective, i.e. the first objective part OP1 and the third objective part OP3, can almost be designed independently. In particular, the third objective part (focusing lens group) can be designed for aperture aberrations without much concern for field aberrations, and then a first objective part being relatively simple in construction can be designed to compensate for field aberration, wherein that compensation might be obtained without aspheric lenses or with only a small number of aspheric lens, e.g. only one aspheric lens.

The previous embodiments show that designs are available having a fairly simple first objective part with only four or five lenses, where all lenses may be spherical. Such rather simple relay lens group can give correction for field aberrations to an extremely high order. Aperture aberrations are preferably corrected in the third objective part, which may also have a fairly simple construction with just a few aspherics, the number of aspheric lenses in third objective part preferably being higher than the number of aspheric lenses in the first objective part.

Figure 6:
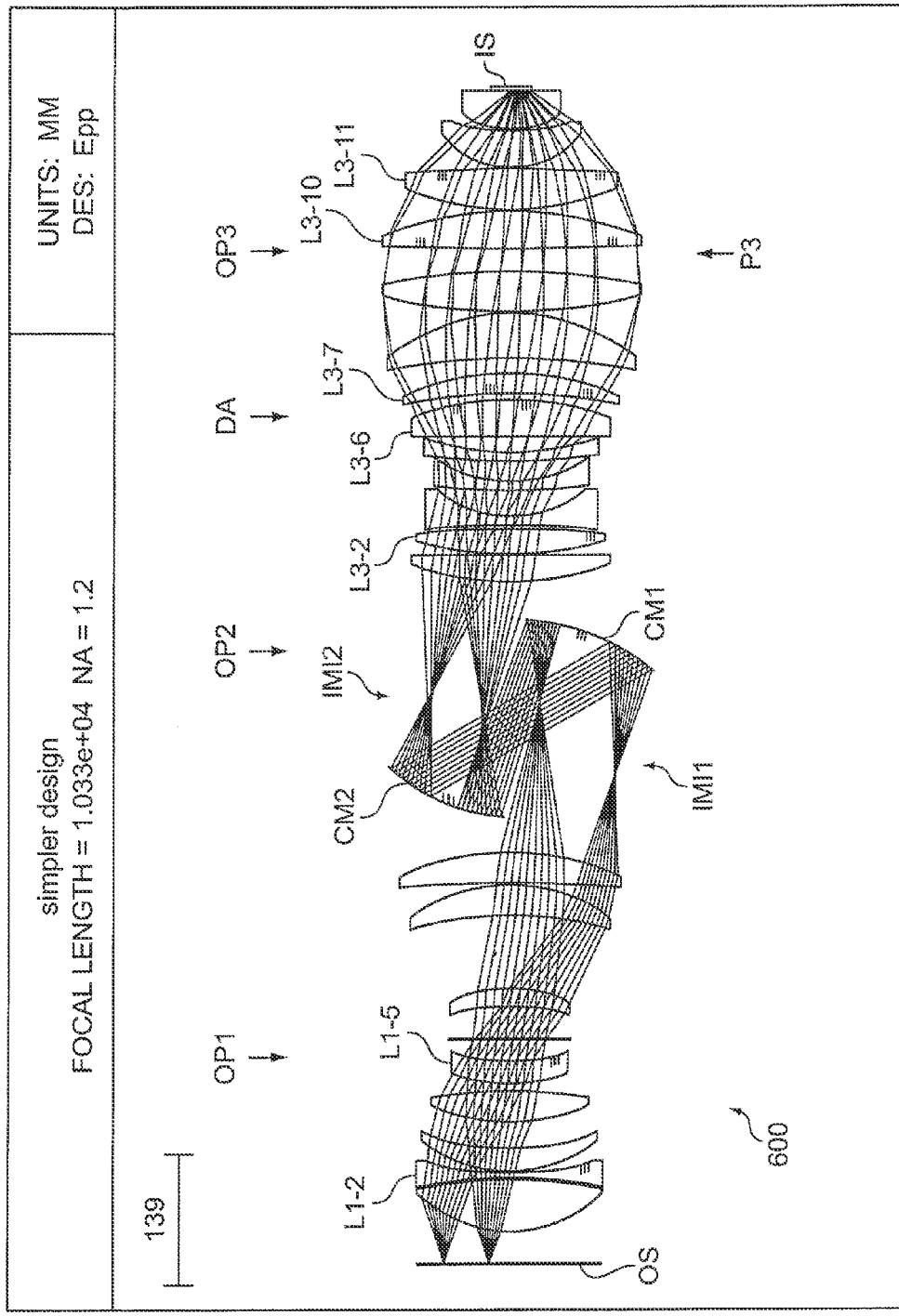
FIG. 6 is a longitudinally sectioned view of a sixth embodiment of a projection objective according to the invention.
Figure 7:
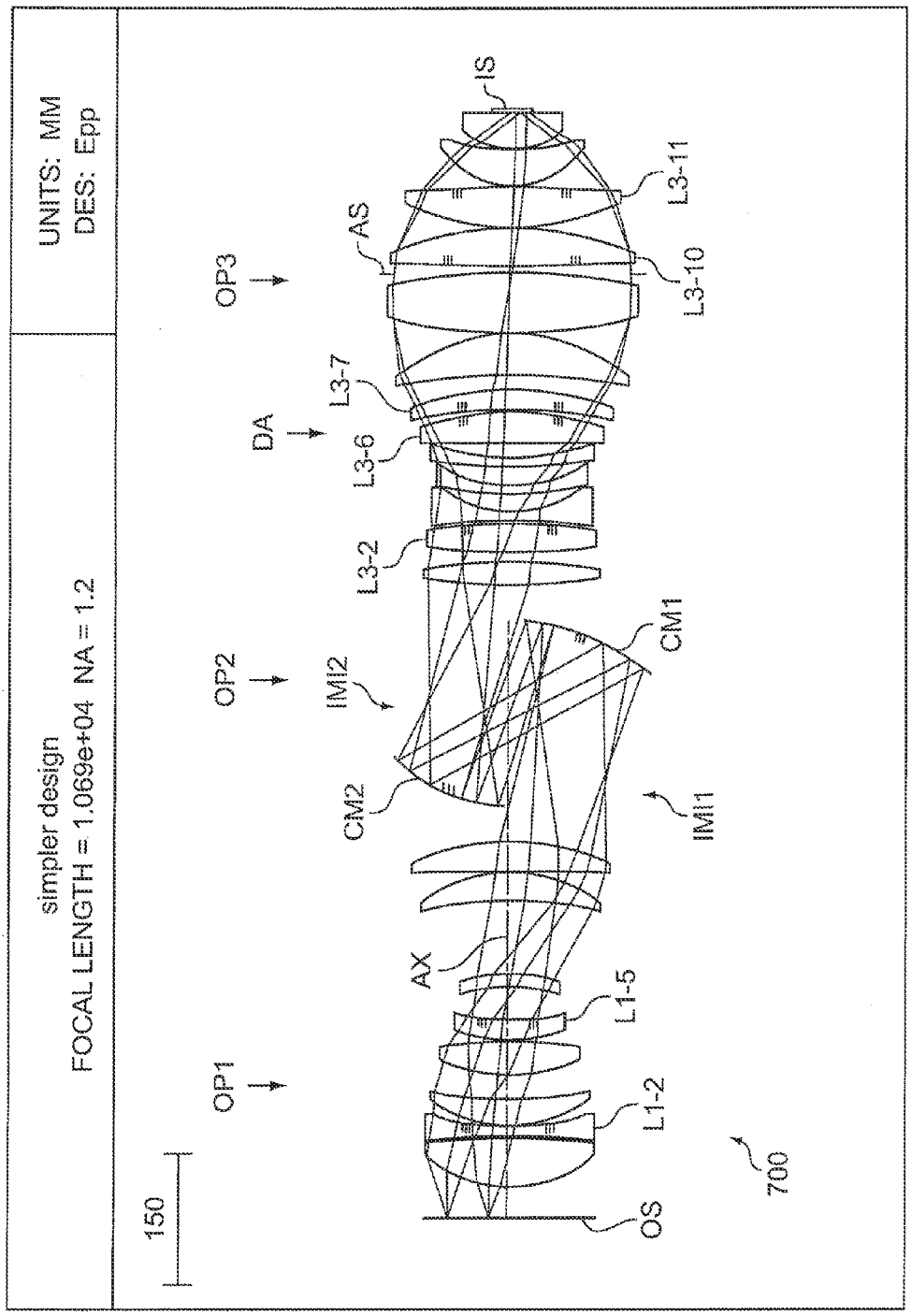
FIG. 7 is a longitudinally sectioned view of a seventh embodiment of a projection objective according to the invention.

FIGS. 6 and 7 show closely related embodiments 600, 700, where the number of aspheric lenses in the refractive first and third objective part is increased when compared to the previous embodiments. The specification of objective 700 is given in tables 7 and 7A. An improvement with respect to aperture aberrations is obtained. Particularly, seven aspheric lenses are used, where $N1_{AS}=2$ and $N3_{AS}=5$, such that the aspheric lens ratio ASR=0.4. The design of FIG. 6 having two aspheric lenses L1-2 and L1-5 in the first objective part OP1 has an wavefront aberration of 5 milliwaves over the field.

One double asphere DA is provided in the third objective part OP3 optically between a second intermediate image IMI2 and the pupil surface P3 of that objective part in a region of significantly increasing beam diameter. The double asphere is formed by the aspheric exit surface of positive lens L3-6 and the subsequent aspheric entry surface of the following positive meniscus lens L3-7 immediately adjacent thereto. The axial separation of the two aspheric surfaces is smaller than the thickness of the thinner lens L3-7 adjacent to the double asphere such that the aspheres are in close proximity. A complex radial distribution of refractive power is thereby obtained in a specific region of the beam, thereby contributing strongly to image correction.

Figure 8:
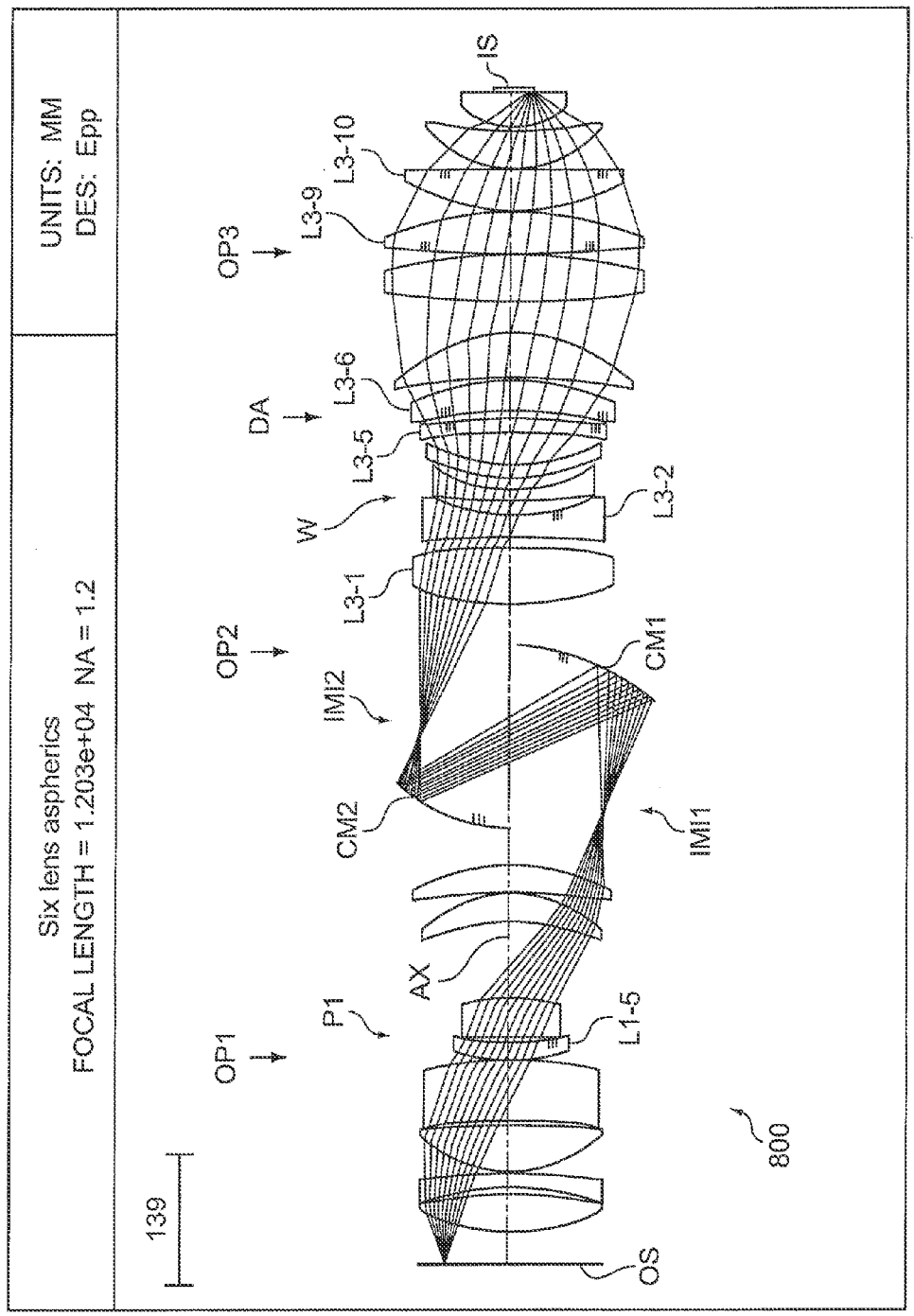
FIG. 8 is a longitudinally sectioned view of a eighth embodiment of a projection objective according to the invention.
Figure 9:
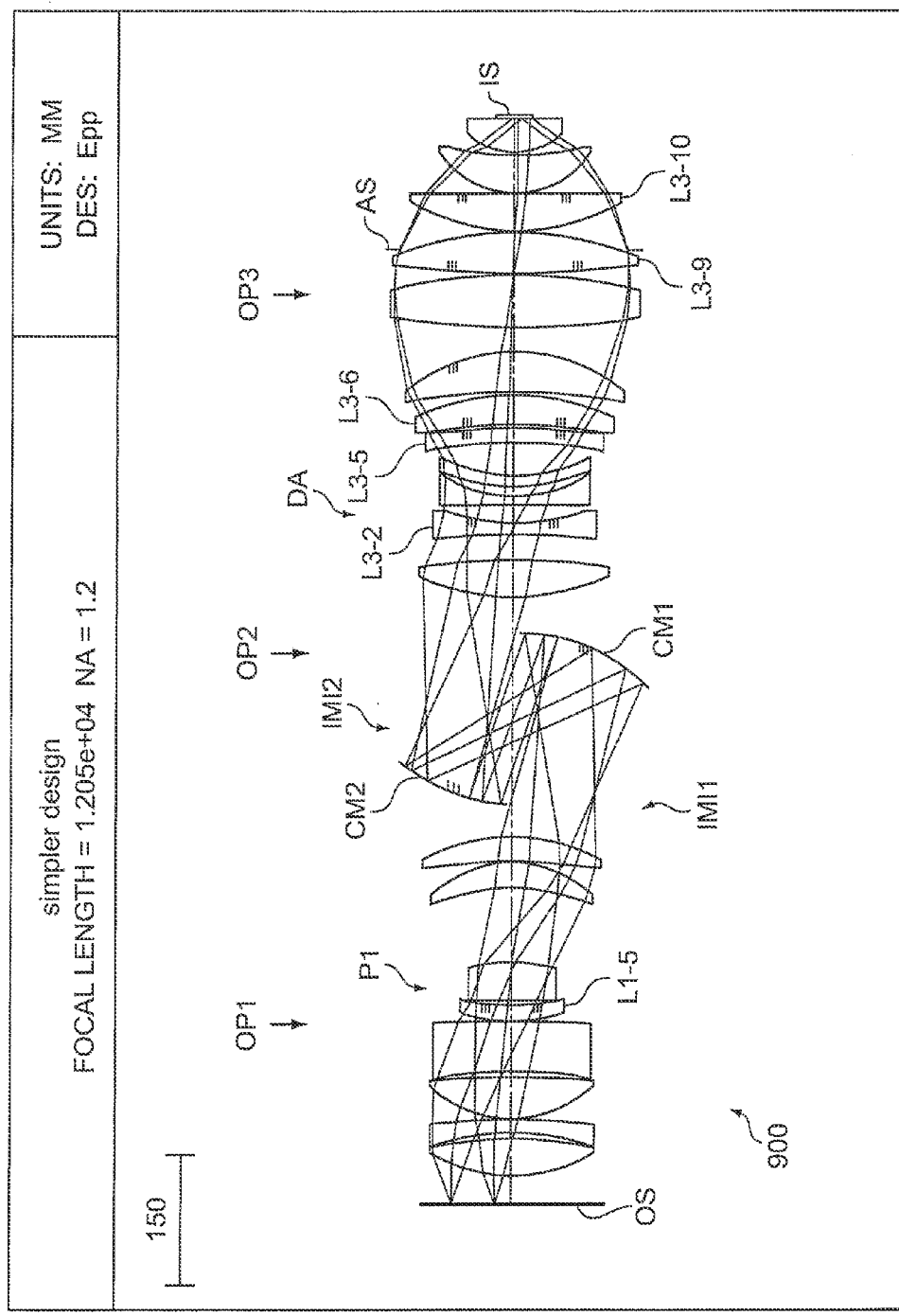
FIG. 9 is a longitudinally sectioned view of a ninth embodiment of a projection objective according to the invention.

FIGS. 8 and 9 show embodiments 800, 900 very similar in design. The specification of projection objective 900 is given in tables 9, 9A. An image-side numerical aperture NA=1.2 and wavefront error of about 6 milliwaves is obtained with only six aspheric lenses, where one aspheric lens (positive meniscus L1-5 having image side concave surface placed near the pupil surface P1) is provided in the first objective part and the remainder of five aspheric lenses are distributed within the third objective part OP3. These aspheric lenses include a biconcave negative meniscus L3-2, a double asphere DA formed by a lens pair L3-5, L3-6 with facing aspheric surfaces, a biconvex positive lens L3-9 close to the aperture stop AS, and a positive lens L3-10 between the aperture stop and the image surface IS. As indicated by the ray distribution in FIG. 8, the front pupil in the relay section formed by first objective part OP1 is pretty well corrected. A focus region with little or no coma aberrations (low-coma intermediate image) for both intermediate images IMI1 and IMI2 is apparent. The low-coma intermediate image IMI2 is refocused onto the image surface with refractive objective part OP3 having a thick positive lens L3-1 on the entry side and a significant waist W (i.e. a region of beam diameter constriction) between the first lens L3-1 and the region of largest beam diameter shortly upstream of the aperture stop AS. Double asphere DA is placed in the divergent beam between the waist and the aperture stop AS.

Figure 10:
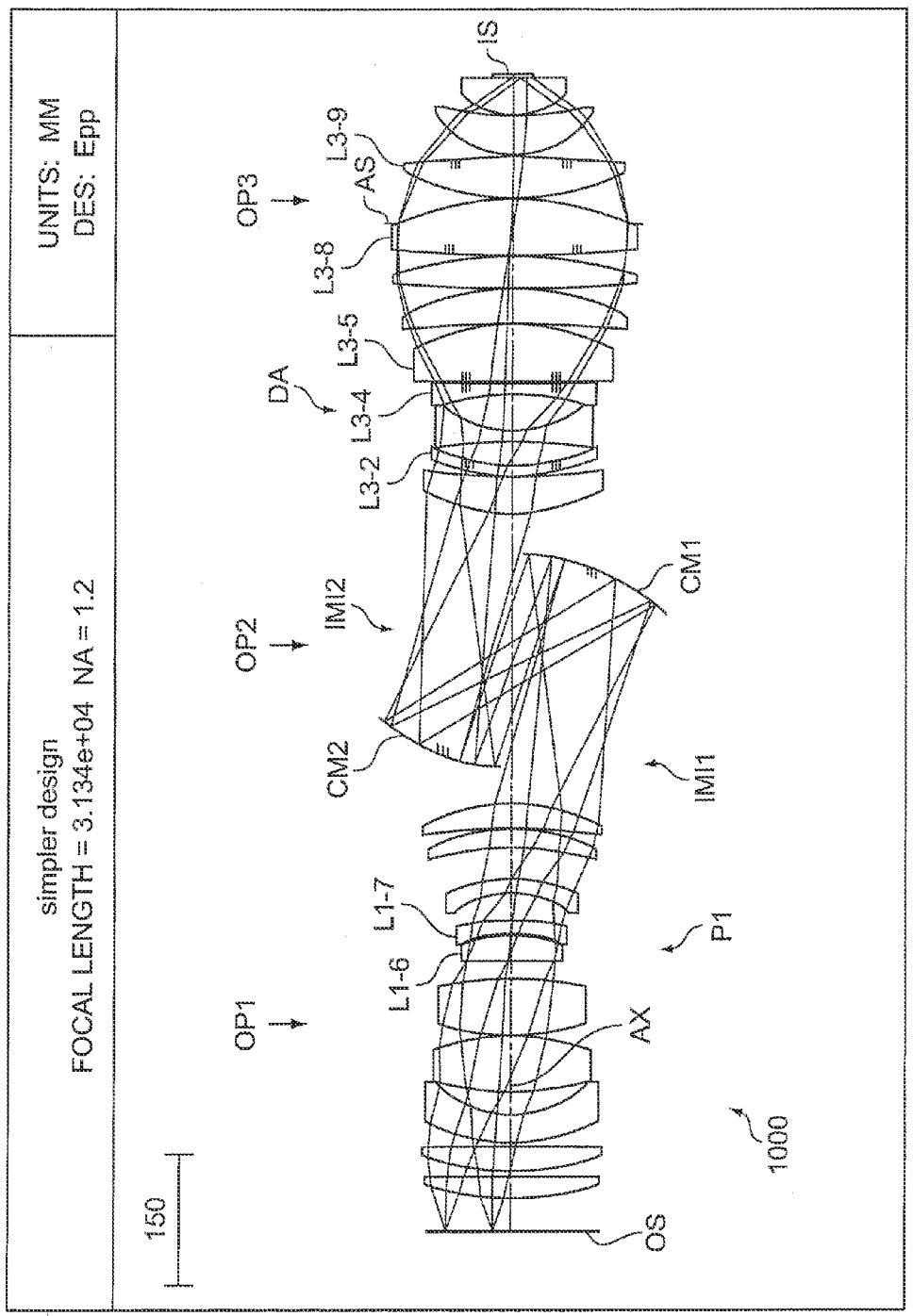
FIG. 10 is a longitudinally sectioned view of a tenth embodiment of a projection objective according to the invention.

The projection objective 1000 in FIG. 10 may in some respects be considered as a variant of the embodiments shown in FIGS. 8 and 9. A specification thereof is given in tables 10, 10A. Whereas the third objective part OP3 has five aspheric lenses relatively similar in design and positioning when compared to the embodiments 800 and 900, there is no aspheric lens in the first objective part OP1, such that $N_{AS}=5$. Remarkably, an all-spherical doublett consisting of an image-side biconvex positive lens L1-6 and a negative meniscus lens L1-7 having an object side concave surface immediately downstream of the positive lens is positioned near the pupil surface P1. High angles of incidence of rays exiting the positive lens L1-6 and entering the subsequent negative lens L1-7 are found in that region, where the angles of incidence include angles larger than 60°. It appears that the optical effect of the aspheric lens L1-5 of embodiments 800, 900 having a difficult to manufacture aspheric surface with rapid slope changes can at least partly be simulated by using some fairly high incidence angles (in the range of 60°-65°) in a similar region near the pupil surface of the first objective part OP1. Since the spherical surfaces of the doublett lenses L1-6, L1-7 are easier to manufacture, manufacturability can be improved in some cases by replacing an aspheric lens by one or more spherical lens surfaces where high incidence angles occur.

When replacement of an aspheric surface by spherical surfaces is considered, it appears that what most matters is the base spherical curvature. A spherical doublett may therefore be able to replace an aspheric surface—even a very high order aspheric.

The correction status of variants of embodiment 1000 ranges between 4, 5 and 6 milliwaves over the field. This indicates that this correction can be obtained with an all-spherical first objective part OP1 and that the complete design does not need many aspheric lenses (only 5 lens aspherics here) to obtain a good performance.

The specification of the catadioptric projection objective 1100 is given in tables 11, 11A. The embodiment is a good example to show that "double aspheres" having two pretty strong aspheric lens surfaces very close to each other may be a very powerful design component. Here, a double asphere DA formed by lenses L3-4 and L3-5 is found in the region of increasing beam diameter within the third objective part OP3, similar to the embodiments shown in FIGS. 8, 9, and 10, for example. In addition, a second double asphere DA formed by the facing surfaces of lenses L1-5 and L1-6 is present optically near the front pupil, i.e. the pupil surface P1 of the first objective part OP1. In this embodiment, $N_{AS}=8$, $N1_{AS}=3$ and $N3_{AS}=5$. The correction is about 2.5 milliwaves only at NA=1.2, with the largest lens diameter of 220 mm found in the third objective part close to the aperture stop AS. This exemplifies the potential of this design for obtaining good optical performance with a small number of aspheric lenses.

Figure 12:
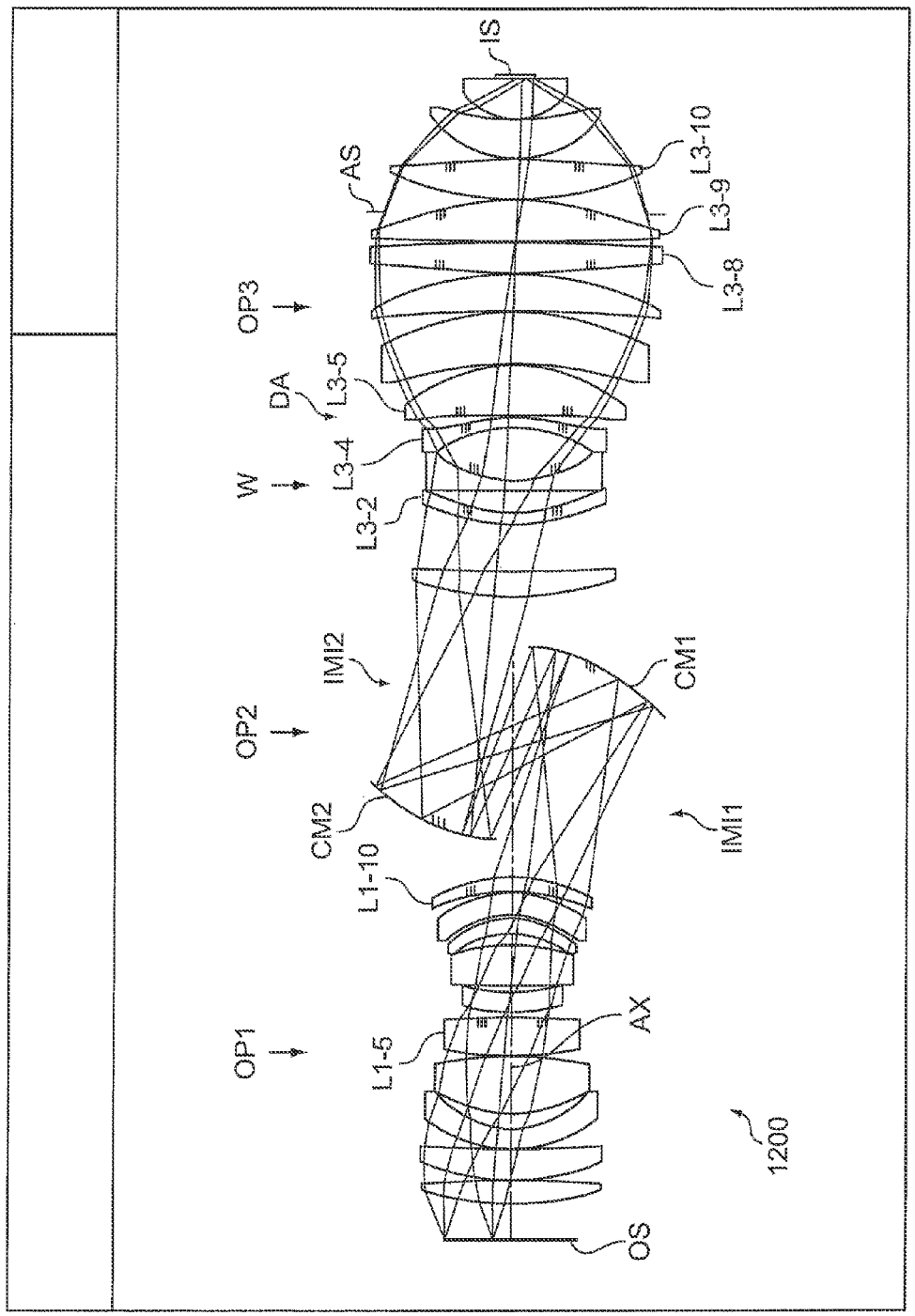
FIG. 12 is a longitudinally sectioned view of a twelfth embodiment of a projection objective according to the invention.

FIG. 12 shows an immersion objective for λ=193 nm having NA=1.3 (instead of NA=1.2 in the previous examples). The largest lens diameter (found shortly upstream of the aperture stop AS within the third objective part OP3) is 270 mm. There are just eight aspheric lenses with $N1_{AS}=2$ and $N3_{AS}=6$. These include one double asphere DA formed by lenses L3-4 and L3-5 and positioned in a region of diverging beam between a waist W in the third objective part and the aperture stop AS. The field radius is 66 mm. The correction is about 4 to 6 milliwaves over the field. The design assumes exactly telecentric input. It is evident that from the ray configuration at the intermediate images that there is a large amount of coma at the intermediate images.

Figure 13:
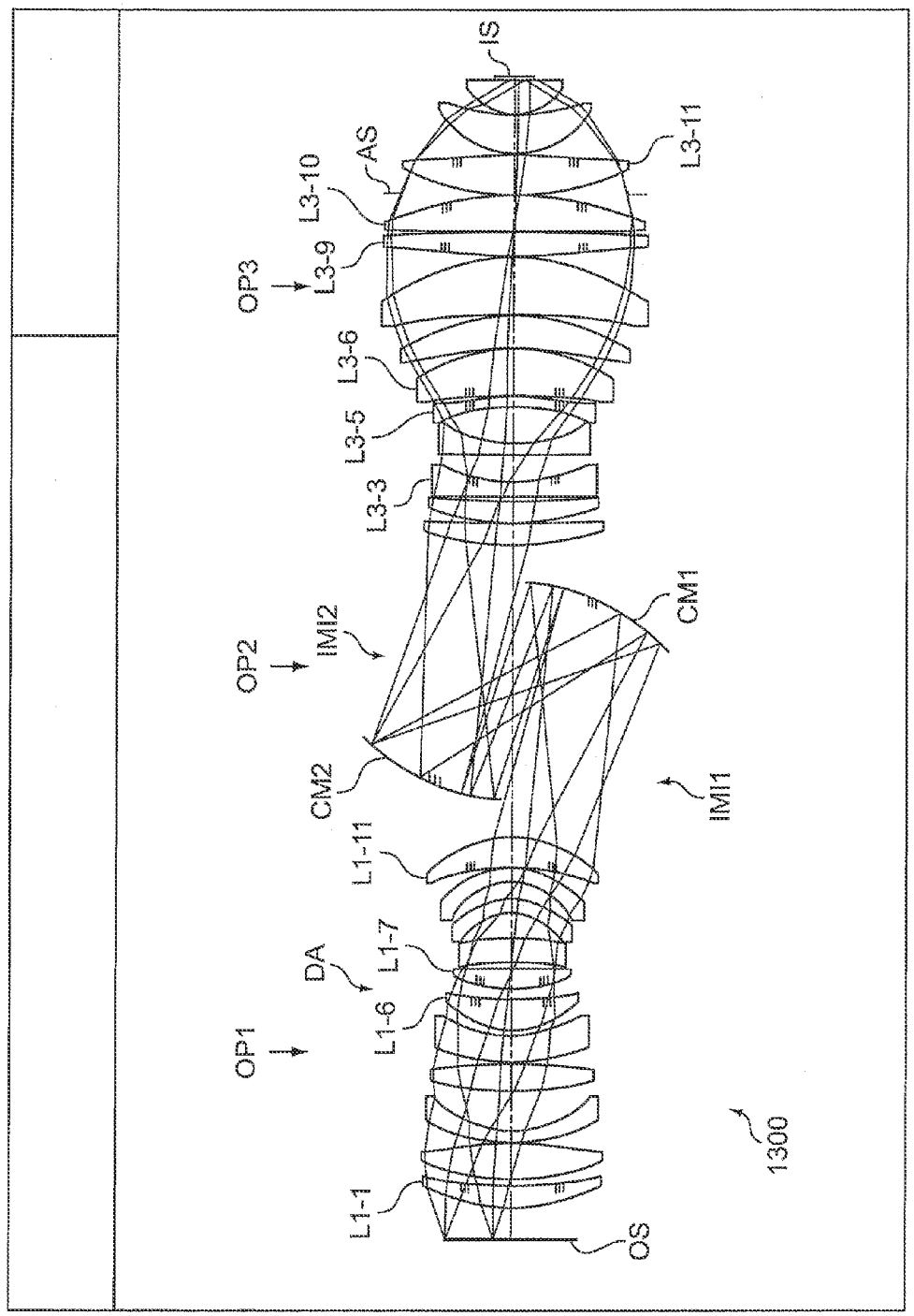
FIG. 13 is a longitudinally sectioned view of a thirteenth embodiment of a projection objective according to the invention.

A further embodiment of a catadioptric immersion objective 1300 with NA=1.3 is shown in FIG. 13. The specification is given in tables 13, 13A. $N_{AS}=10$, $N1_{AS}=4$ and $N3_{AS}=6$. Although the image-side numerical aperture NA=1.3 corresponds to that of objective 1200, the largest lens diameter is only 250 mm (instead of 270 mm in embodiment 1200). Still, the wavefront error is about 4 milliwaves over the field only. Again, the design is characterized by the absence of a real stop so that a telecentric input is required. Again a large amount of coma is found at the intermediate images.

Figure 11:
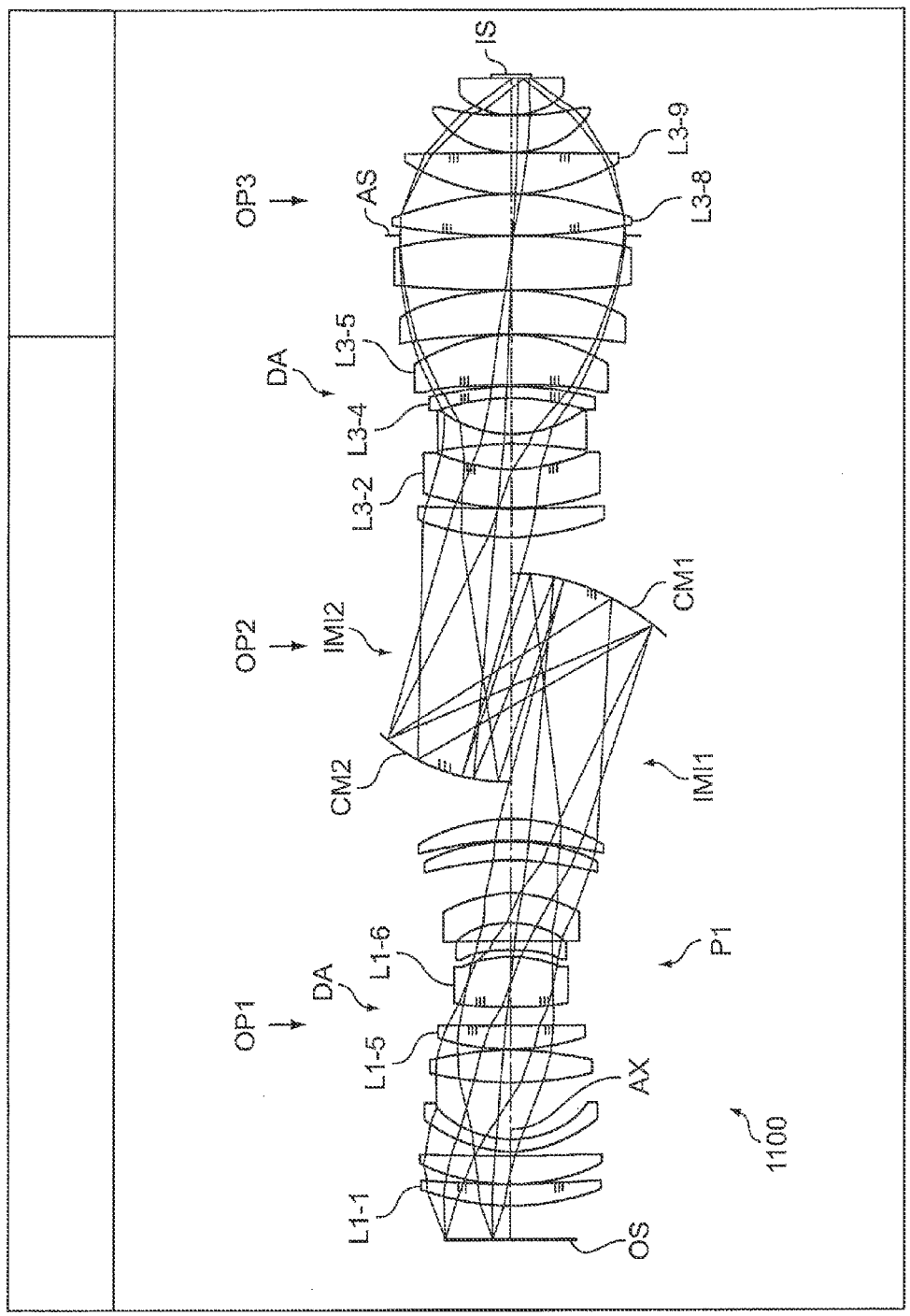
FIG. 11 is a longitudinally sectioned view of a eleventh embodiment of a projection objective according to the invention.
Figure 14:
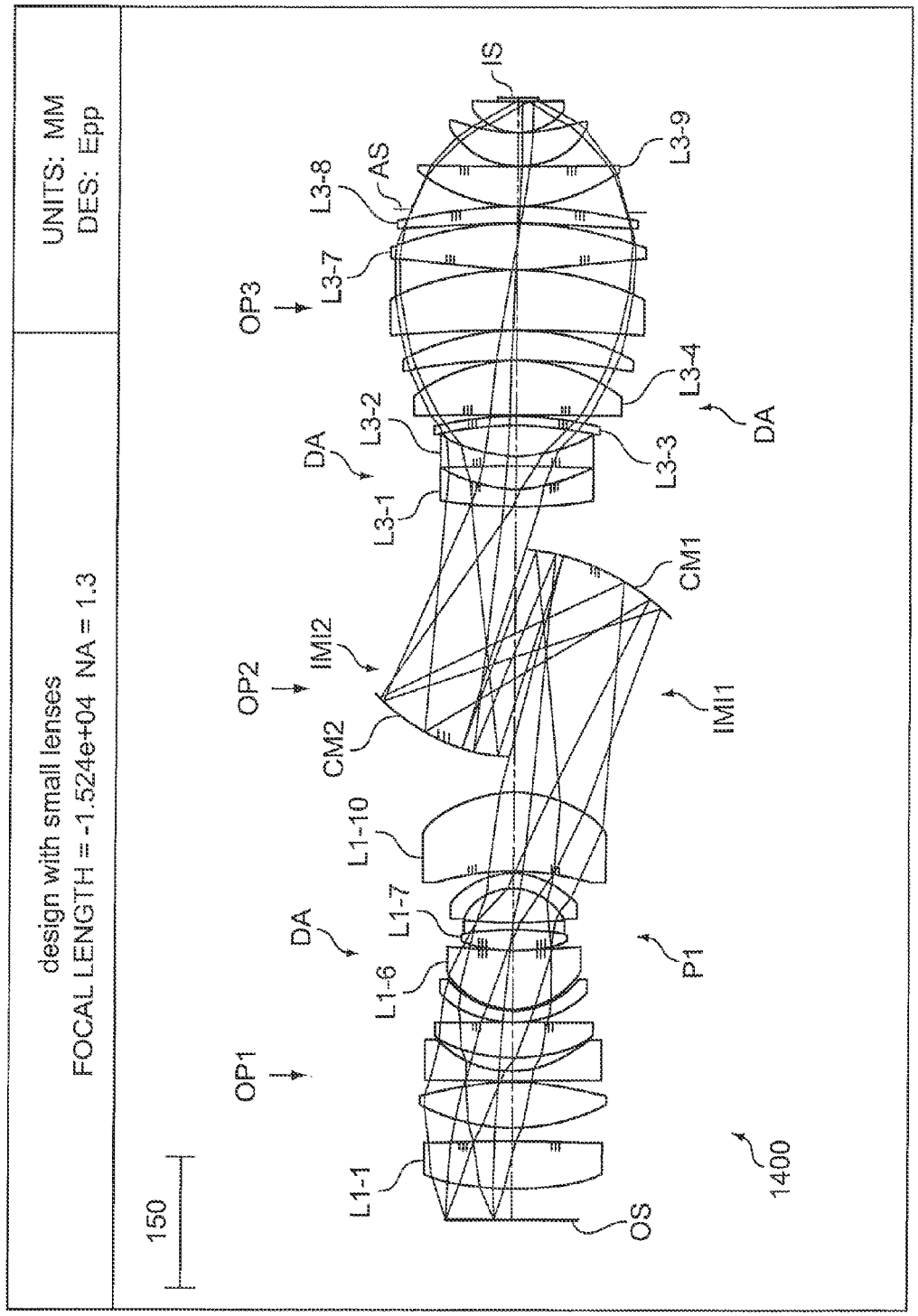
FIG. 14 is a longitudinally sectioned view of a fourteenth embodiment of a projection objective according to the invention.

The catadioptric immersion objective 1400 in FIG. 14 (specification given in tables 14 and 14A) is another example of a high NA catadioptric immersion objective with NA=1.3 and a relatively small maximum lens diameter, that lens diameter of the largest lens being only 250 mm. Four out of eleven aspheric lenses are found in the first objective part OP1, the remainder of seven aspheric lenses is distributed in the third objective part OP3. When compared to previous designs, manufacturability of the aspheric lenses is improved by observing the requirement that all of the aspheric lens surfaces have less than 1.0 mm deformation from a spheric surface and have local aspheric radii being greater than 150 mm for each aspheric surface. Three double aspheres are provided. One double asphere DA formed by lenses L1-6 and L1-7 positioned at the pupil surface P1 within the first objective part OP1 is designed to have fairly high incidence angles which appears to have a similar effect as short local aspheric radii (which are more difficult to manufacture). There are two double aspheres DA in the third objective part OP3, namely one double asphere formed by facing surfaces of negative lenses L3-1, L3-2 in the region of minimum lens diameter within the third objective part, and a subsequent double aspheric formed by facing surfaces of lenses L3-3 and L3-4 in the region of largest beam diameter increase between the second intermediate image IMI2 and the aperture stop AS, which is positioned between the region of largest beam diameter and the image surface IS. Like the embodiments of FIGS. 11 to 13, large amount of coma is present in the intermediate images IMI1, IMI2.

Figure 15:
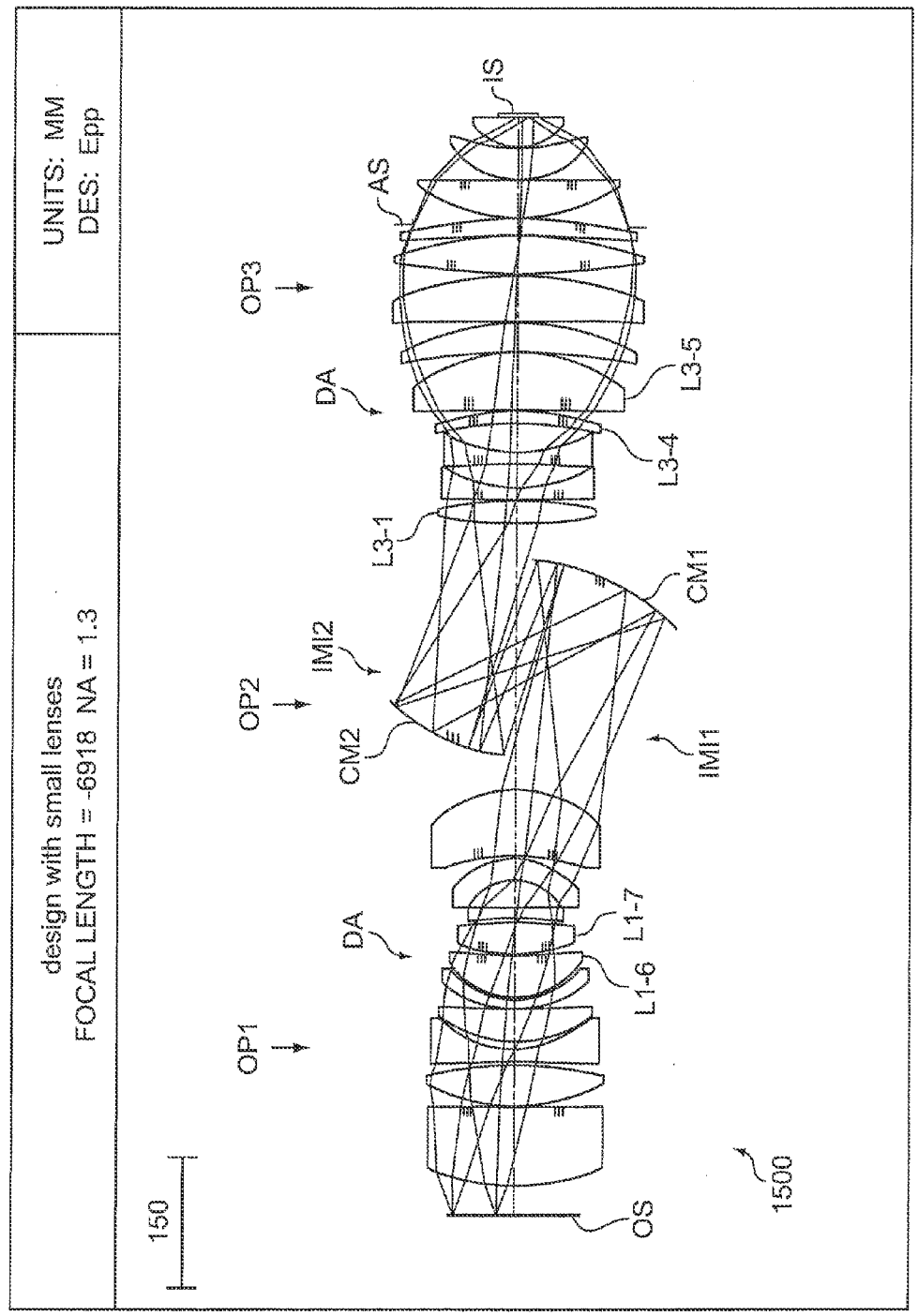
FIG. 15 is a longitudinally sectioned view of a fifteenth embodiment of a projection objective according to the invention.

The catadioptric immersion objective 1500 in FIG. 15 (specification in tables 15 and 15A) is a variant of the embodiment shown in FIG. 14, where sizes and types of lenses present in the objective 1500 are essentially the same. A difference lies in the fact that an additional biconvex positive lens L3-1 is introduced immediately after the second intermediate image IMI2, thereby providing positive refractive power on the entry side of third objective part OP3. Good performance at NA=1.3 is obtained.

Figure 16:
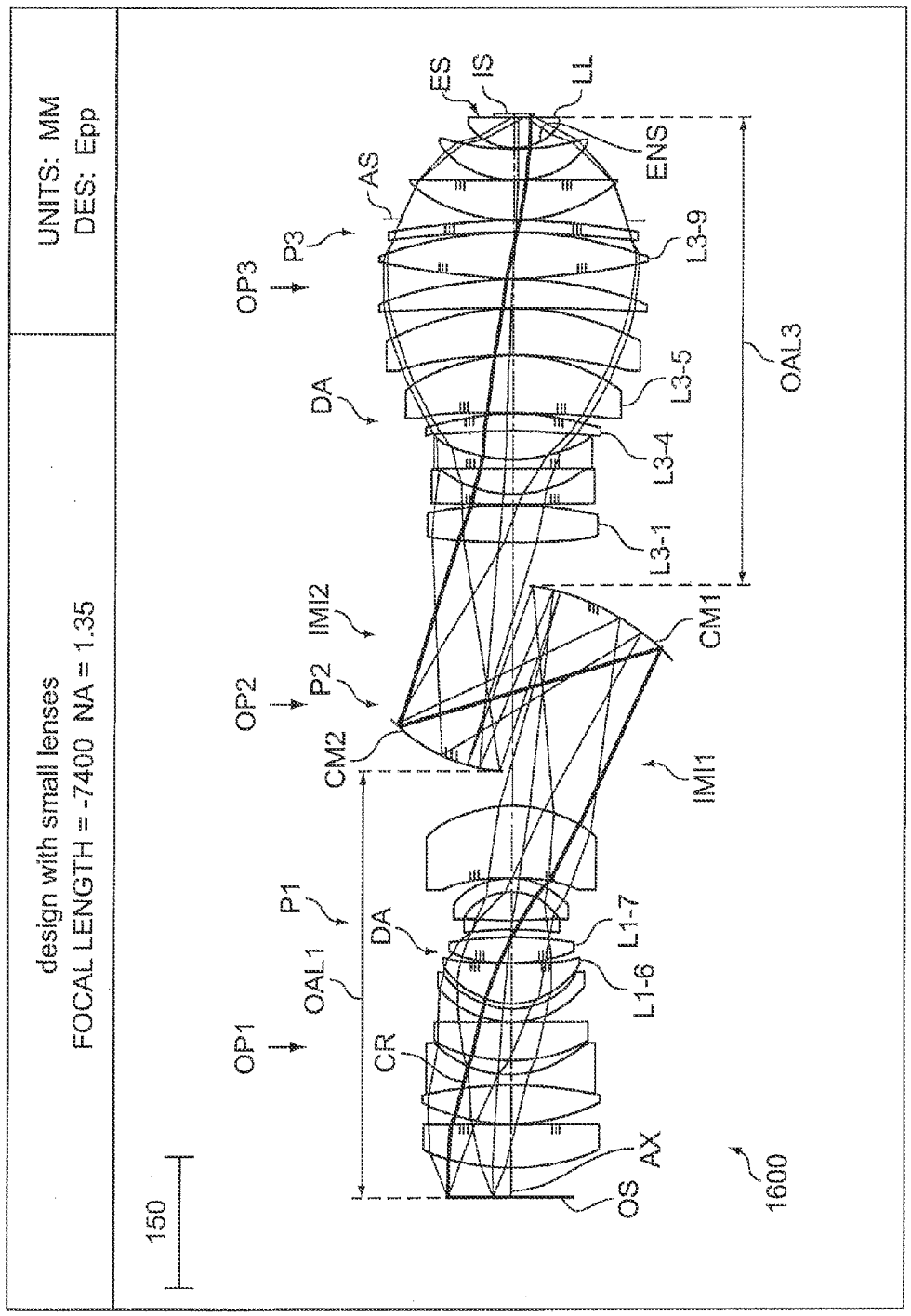
FIG. 16 is a longitudinally sectioned view of a sixteenth embodiment of a projection objective according to the invention.

The basic design has potential for even higher image side numerical apertures with NA>1.3. The catadioptric immersion objective 1600 in FIG. 16 (specification in tables 16 and 16A) is based on the design of FIG. 15, but optimized to obtain NA=1.35. Like in that embodiment, there are ten lenses in the first objective part (including 4 aspheric lenses), and twelve lenses in the third objective part (including 7aspheric lenses). Although the basic types of lenses are the same, lens thickness, surface radii and lens positions differ slightly. As the numerical aperture increases, it appears beneficial to place the aperture stop AS in the third objective part OP3 between the region of maximum beam diameter (at biconvex lens L3-8) and the image surface IS in the region of strongly converging beam. Here, only three positive lenses are placed between the aperture stop and the image surface.

It may be beneficial to place the second objective part OP2 geometrically closer to the image surface the higher the desired numerical aperture is. For convenience, the second objective part OP2, preferably consisting of two aspheric concave mirrors CM1, CM2 only, is also denoted "mirror group" in the following. In order to demonstrate this feature, a first optical axis length OAL1 is defined between the object surface OS and the vertex of the concave mirror CM2 geometrically closest to the object surface, and a third optical axis length OAL3 is defined between the vertex of the concave mirror (CM1) geometrically closest to the image surface and the image surface (see FIG. 16). Based on this definition, a mirror group position parameter MG =OAL1/OAL3 is defined, where this value tends to be larger the further the mirror group tends to be positioned on the image side of the projection objective. In table 17, the values of OAL1, OAL3 and MG are summarized for all embodiments described here. Based on these data, a mirror group position parameter MG>0.7 appears to be desirable in order to obtain high image side numerical apertures. Preferably, MG≥0.8. More preferably, MG≥0.9.

Each projection objective described here has a high NA image side end where projection radiation exits the projection objective at an exit surface ES, which is preferably planar in order to allow a uniform distance between the exit surface and a planar substrate surface arranged at the image surface IS. The lens closest to the image surface and forming the exit surface ES, is denoted "last lens" LL here. Preferably, the last lens is a piano-convex positive lens having a curved entry surface ENS, which is spherically curved in most embodiments, and the planar exit surface ES. In order to obtain high NA it has been found useful to design the last lens such that large refractive power provided by the curved entry surface ENS is arranged as close as possible to the image surface. Further, strong curvatures, i.e. small curvature radii of the entry surface ENS of the last lens LL appear desirable. If $T_{LL}$ is the thickness of the last lens on the optical axis (i.e. the axial distance between the entry surface ENS and the exit surface ES measured along the optical axis), $R_{LL}$ is the object side vertex radius of the last lens (i.e. the radius of the entry surface ENS), and $DIA_{LL}$ is the optically free diameter of the entry surface of the last lens, then the parameters $LL1=T_{LL}/R_{LL}$ and $LL2=DIA_{LL}/R_{LL}$ should preferably fall within certain limits. Particularly, it has been found useful if the conditions 1.1<LL1<2.2 holds for LL1. Preferably, the upper limit may be even smaller, such as 1.8 or 1.7 or 1.6. As parameter LL1 becomes unity for a hemispherical lens, where the center of curvature or the entry surface coincides with the exit surface, the condition regarding LL1 shows that non-hemispherical last lenses are preferred, where the center of curvature of the curved entry surface lies outside the last lens, particularly beyond the image surface.

Alternatively, or in addition, the condition 2.1<LL2<2.6 should preferably hold for LL2. The upper limit could be smaller, e.g. 2.5 or 2.4 or 2.3. The respective values for LL1 and LL2 are presented in table 18. If at least one of the above condition holds, strong positive power provided by the curved entry surface of the last lens is provided close to the image surface, thereby allowing a large image side numerical aperture NA to be obtained, particularly with NA>1.1 or NA>1.2, such as NA=1.3 or NA=1.35.

With regard to the correction status of the intermediate images IMI1, IMI2 it is found that in some embodiments both intermediate images are essentially focused (i.e. many aberrations are corrected to a high degree), whereas in other embodiments significant aberrations occur, particularly coma (compare FIG. 11-16) A significant coma aberration for the second intermediate image IMI2 may be beneficial with respect to overall correction of the objective. Since the catoptric second objective part consisting of the concave mirrors CM1 and CM2 is effective to image the first intermediate image into the second intermediate image in an essentially symmetric manner, only little coma is usually introduced by the catoptric second objective part. Therefore, the correction status with respect to coma for both intermediate images tends to be similar. For some embodiments, a significant amount of coma at least for the second intermediate image appears to contribute significantly to the overall correction. The following observations are notable in that respect.

The correction of the sine condition of the entire objective is challenging particularly for objectives having very high image side NA. The correction of sine condition may be facilitated by coma in the intermediate image. If the imaging from the high NA image surface to the low NA object surface (i.e. in reverse direction when compared to the intended use of projection objectives in lithography) is considered, the third objective part (where radiation enters) provides an intermediate image having a certain correction status. Assuming that the spherical aberration of that imaging is corrected, then the intermediate image will be essentially free of coma, if the sine condition of that imaging would be corrected. In contrast, if the sine condition is not corrected, that intermediate image would have a significant amount of coma. If the intermediate image has a considerable amount of coma, correction of the sine condition in the third objective part is facilitated.

Now, imaging of the second intermediate image into the image surface in the intended direction (towards the high NA end) is considered. If the second intermediate image would have a good correction status, particularly without coma, then the entire correction of the sine condition would have to be effected by the third objective part imaging the second intermediate image onto the image surface. If, in contrast, a certain amount of coma is present in the second intermediate image, then the third objective part can be designed in a more relaxed manner since the correction of the sine condition can at least partly be effected by the objective parts optically upstream of the third objective part, i.e. the refractive relay system OP1 forming the first intermediate image, and the catoptric second objective part OP2. Therefore, it appears that designs where the correction of coma is distributed between the first refractive objective part OP1 and the third objective part OP3 may be beneficial when compared to objectives where each of that refractive objective part is independently corrected for coma.

As mentioned earlier, the invention allows to build high NA projection objectives suitable for immersion lithography at NA>1 with compact size.

Table 19 summarizes the values necessary to calculate the compactness parameters COMP1, COMP2, COMP3 and the respective values for these parameters for each of the systems presented with a specification table (the table number (corresponding to the same number of a figure) is given in column 1 of table 19). Further, the respective values for $N1_{AS}$, $N3_{AS}$, and ASR are shown.

Table 19 shows that preferred embodiments according to the invention generally observe at least one of the conditions given earlier indicating that compact designs with moderate material consumption are obtained according to the design rules laid out in this specification. Further, the particular values characterizing the aspheric lens number and distribution are shown.

In the following, further characteristic features of projection objectives according to the invention are summarized, where one or more of those features may be present in an embodiment of the invention. Parameters summarized in tables 20 and 21 are used to demonstrate these features.

In some embodiments, the chief ray of the imaging process takes a characteristic course. For demonstration purposes, a chief ray CR running from an outermost field point (furthest away from the optical axis AX) essentially parallel to the optical axis and intersecting the optical axis at three consecutive pupil surface positions P1, P2, P3, each within on of the imaging objective parts OP1, OP2, OP3, is drawn in bold line in FIG. 16 to facilitate understanding. The angle included between the optical axis AX and the chief ray CR at each position along the chief ray is denoted "chief ray angle" CRA in the following. The chief ray CR is divergent (chief ray height increasing in light propagation direction) at the position of the first intermediate image IMI1 and converging at the position of the second intermediate image IMI2. Strongly converging chief rays appear to be beneficial to obtain high image side NA and a sufficient correction.

In the region between the two concave mirrors CM1, CM2, the chief ray crosses the optical axis at a high chief ray angle CRA (M), that angle preferably falling in the region between 58° and 75°, particularly between 60° and 72°. (see table 20).

With regard to the magnification provided by the imaging objective parts OP1, OP2, OP3 it appears that it is beneficial if the magnification $\beta_3$ of the third objective part OP 3 imaging the second intermediate image IMI2 at high reduction ratio onto the image surface should preferably fall within a range $0.11 \leq \beta_3 \leq 0.17$. In order to obtain a desired overall reduction ratio (e.g. 1:4 or 1:5) the second objective part OP2 may contribute to the overall reduction by having a magnification ratio $\beta_2 < 1$. Preferably, the mirror group forming the second objective part OP2 may be designed to have a moderate reducing effect characterized by $0.85 \leq \beta_2 < 1$. If the second objective part contributes to some extent to the overall reduction, the third objective part responsible for the major part of reduction can be designed in a more relaxed manner.

It appears that the refractive power (characterized by the focal length f) provided by the first two or three lenses on the entry side of the third objective part OP3 immediately after the second concave mirror CM2 may contribute to good performance by designing this entry group such that the overall refractive power of that entry group is negative. In the embodiments of FIGS. 2, 4, 14, 15, 16, the entry group is formed by the first two lenses of the third objective part, providing an entry group focal length f3 (L1 . . . 2). In the embodiments of FIGS. 7, 9, 10, 11, 12, 13, the entry group is formed by three consecutive lenses, thereby providing a focal length f3 (L1 . . . 3) of the entry group. Values are given in table 20.

On the other hand, it appears that not many negative lenses should be present in the third objective part following the second concave mirror CM2, where that number $N3_{NL}$ of negative lenses is three or less than three in all embodiments (parameter K7a=YES in table 21), and is smaller than three in the embodiments of FIGS. 2, 4, 14, 15, 16 (parameter K7=YES in table 21).

Further, it appears to be beneficial if the optically free diameter $DIA_{31}$ of the first lens L3-1 of the third objective part OP3 is significantly smaller than the diameter $DIA_{AS}$ of the aperture stop. Preferably, the diameter ratio $DR = DIA_{31}/DIA_{AS}$ should be smaller than 0.9. More preferably, an upper value of 0.8, even more preferably an upper value of 0.7 should not be exceeded. Values for the diameter ratio DR are given in table 21.

Further, it has been found that it may be beneficial if more than 50% of all lenses after the second concave mirror (i.e. lenses of the third objective part) have an optically free diameter smaller than the diameter of the second intermediate image IMI2 following the second concave mirror CM2.

This condition is fulfilled for all embodiments, as shown by parameter K10 in table 21.

Also, all lenses of the first, refractive objective part OP1 should preferably be smaller than the paraxial size of the first intermediate image. If this condition is fulfilled, parameter K9 in table 20 is fulfilled.

In order to provide strong positive refractive power for obtaining strong beam convergence at the high NA image end it is preferable if at least one of 8 and 9 consecutive lenses upstream of the image surface should have positive refractive power. This is exemplified by parameter K11 in table 21, which is "YES"=Y if the condition is fulfilled and "NO"=N if the condition is not fulfilled.

In this context it is worth to note that it appears beneficial for obtaining high NA, if the position of the aperture stop AS is in the region of convergent beam between the position of largest beam diameter within the third objective part OP3, and the image surface. This property is exemplified by the ratio AS-IS/TT shown in table 20, where AS-IS is the geometrical distance between the position of the aperture stop AS and the image surface IS, and TT is the "track length" of the objective, i.e. the geometrical distance between object surface and image surface. The ratio AS-IS/TT may fall in a range between 0.09 and 0.18 (see table 20).

This feature is particularly pronounced in embodiments of FIGS. 12 to 16.

Further characteristic features are evident from the course of the coma beam. Here, a "coma beam" refers to a beam emerging from an object field point furthest remote from the optical axis and transiting the aperture stop at the edge of the aperture. The coma beam therefore contributes to determining which lens diameters must be used. The angle included by this coma beam and the optical axis is denoted in "coma beam angle CBA" in the following. The angle of that beam after refraction at the last lens of the first objective part (upstream of the first intermediate image IMI1) is denoted CBA1, whereas the angle of the coma beam immediately upstream of the refraction at the first lens of the image side third objective part OP3 is denoted CBA3. The values of these angles are given in table 21. It appears that for both coma beam angles values of less than 5° may be beneficial (table 21).

As noted above, the chief ray intersects the optical axis at pupil surfaces P1, P2, P3 in the concatenated objective parts OP1, OP2, OP3. As the pupil surfaces within the first and third objective parts are accessible for setting an aperture stop, these positions are also denoted aperture positions. The beam diameter at the aperture stop, $DIA_{AS}$ and the beam diameter $DIA_{P1}$ at the pupil surface P1 in the first objective part, conjugated to the position of the aperture stop, should fall within certain limits. The ratio $DIA_{AS}/DIA_{P1}$ should be larger than 1. Preferably the condition $DIA_{AS}/DIA_{P1}>2$ should be satisfied. (see table 21).

It is to be understood that all systems described above may be complete systems for forming a real image (e.g. on a wafer) from a real object. However, the systems may be used as partial systems of larger systems. For example, the "object" for a system mentioned above may be an image formed by an imaging system (relay system) upstream of the object plane. Likewise, the image formed by a system mentioned above may be used as the object for a system (relay system) downstream of the image plane.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The contents of all the claims is made part of this description by reference.

TABLE 2

| SURF | RADIUS | THICKNESS | MATERIAL | INDEX | SEMIDIAM. |
|---|---|---|---|---|---|
| 0 | 0 | 35.375532 | | | 66 |
| 1 | 131.949135 | 35.970704 | SILUV | 1.56038308 | 87.585 |
| 2 | 406.761557 | 104.80906 | | | 85.863 |
| 3 | 3059.843345 | 27.506721 | SILUV | 1.56038308 | 75.651 |
| 4 | −198.500428 | 1.017885 | | | 74.735 |
| 5 | 130.040913 | 27.00543 | SIO2V | 1.5607857 | 63.806 |
| 6 | 645.092151 | 131.039998 | | | 59.727 |
| 7 | 295.611694 | 27.141936 | SIO2V | 1.5607857 | 73.901 |
| 8 | −488.184201 | 269.934616 | | | 75.186 |
| 9 | −168.378905 | −229.757172 | REFL | | 146.55 |
| 10 | 191.880744 | 321.03168 | REFL | | 142.027 |
| 11 | 3866.479073 | 15 | SILUV | 1.56038308 | 84.264 |
| 12 | 200.296391 | 23.187613 | | | 81.401 |
| 13 | −853.282183 | 12 | SILUV | 1.56038308 | 81.615 |
| 14 | 183.221555 | 40.757592 | | | 85.452 |
| 15 | −260.121033 | 40.375633 | SILUV | 1.56038308 | 88.116 |
| 16 | −119.830244 | 1.000373 | | | 93.697 |
| 17 | 377.105699 | 25.88629 | SILUV | 1.56038308 | 107.44 |
| 18 | 806.870168 | 6.60952 | | | 108.283 |
| 19 | 402.481304 | 53.968509 | SILUV | 1.56038308 | 109.043 |
| 20 | −239.942098 | 30.458674 | | | 110.617 |
| 21 | 0 | 0 | | | 105.938 |
| 22 | 448.147113 | 83.062268 | SILUV | 1.56038308 | 104.924 |
| 23 | −279.740357 | 1 | | | 97.993 |
| 24 | 225.5812 | 54.802627 | SILUV | 1.56038308 | 86.607 |
| 25 | −998.977091 | 1 | | | 76.79 |
| 26 | 66.501558 | 33.495315 | SILUV | 1.56038308 | 57.153 |
| 27 | 131.610919 | 0.100001 | | | 48.532 |
| 28 | 49.614771 | 31.476238 | SILUV | 1.56038308 | 37.98 |
| 29 | 0 | 3 | H2OV193 | 1.43667693 | 21.144 |
| 30 | 0 | 0 | | | 16.918 |

TABLE 2A

Aspheric constants

| | SRF | | |
|---|---|---|---|
| | 9 | 10 | 18 |
| K | −0.452326 | −0.261902 | 0 |
| C1 | 0.00E+00 | 0.00E+00 | 9.85E−08 |
| C2 | 7.69E−14 | −1.44E−15 | 6.78E−13 |
| C3 | −1.99E−18 | 2.07E−19 | −8.47E−17 |
| C4 | 4.90E−22 | −1.14E−23 | −2.33E−21 |
| C5 | −2.26E−26 | −5.61E−28 | −3.90E−27 |
| C6 | 5.71E−31 | 4.00E−32 | 0.00E+00 |

TABLE 4

| SURF | RADIUS | THICKNESS | MATERIAL | INDEX | SEMIDIAM. |
|---|---|---|---|---|---|
| 0 | 0 | 35.793949 | | | 66 |
| 1 | 120.118526 | 42.934369 | SIO2V | 1.5607857 | 90.022 |
| 2 | 412.405523 | 126.645729 | | | 87.381 |
| 3 | 633.242338 | 22.659816 | SIO2V | 1.5607857 | 61.491 |
| 4 | −210.086581 | 46.042292 | | | 60.076 |
| 5 | 130.137899 | 30.712802 | SIO2V | 1.5607857 | 61.678 |
| 6 | −522.603119 | 34.752273 | | | 61.093 |
| 7 | −1187.517919 | 12 | SIO2V | 1.5607857 | 59.563 |
| 8 | 114.106019 | 28.350504 | | | 59.307 |
| 9 | 222.108344 | 30.902208 | SIO2V | 1.5607857 | 68.301 |
| 10 | −299.15163 | 256.466683 | | | 69.608 |
| 11 | −150.205889 | −216.466684 | REFL | | 144.702 |
| 12 | 198.80711 | 372.659505 | REFL | | 143.838 |
| 13 | 281.738211 | 19.28133 | SIO2V | 1.5607857 | 93.203 |
| 14 | 125.854932 | 30.787413 | | | 85.622 |
| 15 | 774.983336 | 12 | SIO2V | 1.5607857 | 86.014 |
| 16 | 190.931672 | 31.687547 | | | 88.47 |
| 17 | −741.767142 | 42.517621 | SIO2V | 1.5607857 | 90.935 |
| 18 | −141.29554 | 16.921402 | | | 95.293 |
| 19 | 161.709504 | 50.734927 | SIO2V | 1.5607857 | 110.341 |
| 20 | 256.329089 | 15.962417 | | | 100.811 |
| 21 | 231.628153 | 52.349429 | SIO2V | 1.5607857 | 101.677 |
| 22 | −355.162157 | 24.394096 | | | 100.975 |
| 23 | 0 | 0 | | | 90.786 |
| 24 | 298.995001 | 34.357885 | SIO2V | 1.5607857 | 87.38 |
| 25 | −413.984465 | 1 | | | 84.467 |
| 26 | 175.550604 | 30.458976 | SIO2V | 1.5607857 | 75.285 |
| 27 | 577.927994 | 1 | | | 68.756 |
| 28 | 62.317914 | 30.663962 | SIO2V | 1.5607857 | 53.826 |
| 29 | 131.702852 | 0.1 | | | 46.784 |
| 30 | 50 | 29.329548 | SIO2V | 1.5607857 | 36.877 |
| 31 | 0 | 3 | H2OV193 | 1.43667693 | 21.061 |
| 32 | 0 | 0 | | | 17.019 |

TABLE 4A

Aspheric constants

| | SRF | | |
|---|---|---|---|
| | 11 | 12 | 20 |
| K | −0.536388 | −0.289717 | 0 |
| C1 | 0.00E+00 | 0.00E+00 | 1.38E−07 |
| C2 | 1.40E−13 | 1.67E−15 | 1.67E−12 |
| C3 | −1.27E−17 | 7.77E−21 | −1.05E−16 |
| C4 | 1.60E−21 | 1.74E−23 | 6.80E−21 |
| C5 | −8.54E−26 | −1.14E−27 | −2.06E−24 |
| C6 | 2.08E−30 | 3.15E−32 | 1.25E−28 |

TABLE 7

| SURF | RADIUS | THICKNESS | MATERIAL | INDEX | SEMIDIAM. |
|---|---|---|---|---|---|
| 0 | 0 | 35.099987 | LUFTV193 | 1.00030168 | 66 |
| 1 | 127.537708 | 53.812686 | SIO2V | 1.5607857 | 88.311 |
| 2 | −1424.403792 | 3.183483 | | | 85.654 |
| 3 | −759.069196 | 12 | SIO2V | 1.5607857 | 85.361 |
| 4 | 433.221851 | 0.999992 | N2VP950 | 1.00029966 | 81.029 |
| 5 | 138.239142 | 29.708609 | SIO2V | 1.5607857 | 81.573 |
| 6 | 417.683183 | 28.068546 | N2VP950 | 1.00029966 | 79.153 |
| 7 | 178.55362 | 36.417688 | SIO2V | 1.5607857 | 70.512 |
| 8 | −494.07005 | 2.060781 | N2VP950 | 1.00029966 | 65.044 |
| 9 | 155.188372 | 24.032084 | SIO2V | 1.5607857 | 54.381 |
| 10 | 599.310224 | 35.766015 | N2VP950 | 1.00029966 | 44.737 |
| 11 | −222.232519 | 15.518078 | SIO2V | 1.5607857 | 43.157 |
| 12 | −158.540648 | 83.688942 | N2VP950 | 1.00029966 | 48.398 |
| 13 | −340.58772 | 31.059836 | SIO2V | 1.5607857 | 87.94 |
| 14 | −151.34275 | 0.999997 | N2VP950 | 1.00029966 | 92.472 |
| 15 | −3390.668582 | 33.959537 | SIO2V | 1.5607857 | 99.743 |
| 16 | −231.522766 | 249.6227 | N2VP950 | 1.00029966 | 101.635 |
| 17 | −184.547095 | −209.6227 | REFL | 1.00029966 | 139.73 |
| 18 | 167.029818 | 249.92793 | REFL | 1.00029966 | 120.262 |
| 19 | 621.261771 | 25.224239 | SIO2V | 1.5607857 | 88.34 |
| 20 | −556.892379 | 11.423072 | N2VP950 | 1.00029966 | 87.849 |
| 21 | 928.352541 | 31.861443 | SIO2V | 1.5607857 | 84.353 |
| 22 | −3894.042096 | 4.258076 | N2VP950 | 1.00029966 | 81.388 |
| 23 | −515.240387 | 10.001518 | SIO2V | 1.5607857 | 80.081 |
| 24 | 128.35306 | 19.188164 | N2VP950 | 1.00029966 | 74.104 |
| 25 | 308.870114 | 10.000043 | SIO2V | 1.5607857 | 74.899 |
| 26 | 137.165863 | 21.160324 | N2VP950 | 1.00029966 | 75.171 |
| 27 | 535.690303 | 10.000083 | SIO2V | 1.5607857 | 77.414 |
| 28 | 270.832047 | 16.021774 | N2VP950 | 1.00029966 | 81.505 |
| 29 | 6886.310806 | 36.167214 | SIO2V | 1.5607857 | 84.419 |
| 30 | −205.759199 | 3.943304 | N2VP950 | 1.00029966 | 92.09 |
| 31 | −673.879021 | 20.931667 | SIO2V | 1.5607857 | 96.507 |
| 32 | −289.392079 | 17.53001 | N2VP950 | 1.00029966 | 102.53 |
| 33 | −578.552137 | 45.351534 | SIO2V | 1.5607857 | 114.339 |
| 34 | −180.862466 | 0.999999 | N2VP950 | 1.00029966 | 118.861 |
| 35 | 486.683329 | 67.153511 | SIO2V | 1.5607857 | 127.052 |
| 36 | −560.582675 | −0.510173 | N2VP950 | 1.00029966 | 126.509 |
| 37 | 0 | 8.553303 | N2VP950 | 1.00029966 | 124.301 |
| 38 | 804.757635 | 41.461871 | SIO2V | 1.5607857 | 124.183 |
| 39 | −290.647705 | 1.000095 | N2VP950 | 1.00029966 | 124.308 |
| 40 | 251.571322 | 46.634322 | SIO2V | 1.5607857 | 109.472 |
| 41 | −989.86448 | 1.000042 | N2VP950 | 1.00029966 | 103.95 |
| 42 | 86.546078 | 40.283002 | SIO2V | 1.5607857 | 72.678 |
| 43 | 219.985874 | 0.999974 | N2VP950 | 1.00029966 | 63.421 |
| 44 | 87.427095 | 40.057397 | SIO2V | 1.5607857 | 50.39 |
| 45 | 0 | 3 | H2OV193 | 1.43667693 | 21.125 |
| 46 | 0 | 0 | | | 16.5 |

TABLE 7A

Aspheric constants

| | \multicolumn{5}{c}{SRF} |
|---|---|---|---|---|---|
| | 4 | 10 | 17 | 18 | 22 |
| K | 0 | 0 | −0.746204 | −0.286924 | 0 |
| C1 | 6.03E−08 | 4.24E−07 | 0.00E+00 | 0.00E+00 | −1.62E−07 |
| C2 | 7.60E−12 | −3.19E−11 | 3.46E−14 | 6.73E−15 | 5.78E−12 |
| C3 | −2.87E−17 | 1.88E−14 | −2.87E−19 | −1.19E−18 | 2.80E−16 |
| C4 | −1.68E−21 | −2.25E−18 | 1.04E−22 | 2.14E−22 | 2.70E−22 |
| C5 | 1.40E−24 | 1.47E−21 | −7.95E−27 | −2.28E−26 | −1.87E−24 |
| C6 | 2.15E−30 | 4.27E−25 | 3.94E−31 | 1.46E−30 | 1.45E−28 |
| C7 | −1.03E−32 | −5.55E−28 | −1.07E−35 | −5.11E−35 | −5.39E−33 |
| C8 | 1.22E−36 | 1.42E−31 | 1.22E−40 | 7.66E−40 | 1.42E−36 |

| | SRF | | | |
|---|---|---|---|---|
| | 30 | 31 | 38 | 41 |
| K | 0 | 0 | 0 | 0 |
| C1 | 5.31E−08 | −5.32E−08 | −3.90E−08 | −2.16E−08 |
| C2 | 1.81E−12 | −1.14E−13 | 4.45E−15 | 2.47E−12 |
| C3 | 1.20E−16 | 8.83E−17 | 4.67E−17 | −8.51E−17 |

TABLE 7A-continued

| | Aspheric constants | | | |
|---|---|---|---|---|
| C4 | −4.21E−21 | −8.32E−21 | −1.21E−21 | 3.85E−21 |
| C5 | −3.09E−25 | 3.44E−25 | 3.05E−27 | −1.62E−25 |
| C6 | −6.36E−31 | −3.35E−29 | 9.87E−32 | 5.85E−30 |
| C7 | −1.97E−33 | 1.94E−33 | 3.24E−38 | −6.78E−35 |
| C8 | −7.59E−38 | −2.07E−37 | 7.29E−42 | −7.43E−40 |

TABLE 9

| SURF | RADIUS | THICKNESS | MATERIAL | INDEX | SEMIDIAM. |
|---|---|---|---|---|---|
| 0 | 0 | 35 | LUFTV193 | 1.00030168 | 66 |
| 1 | 167.582589 | 42.122596 | SIO2V | 1.5607857 | 84.14 |
| 2 | −417.631156 | 7.351797 | | | 83.778 |
| 3 | −242.658436 | 14.999993 | SIO2V | 1.5607857 | 83.61 |
| 4 | −639.381532 | 1 | N2VP950 | 1.00029966 | 84.261 |
| 5 | 118.161915 | 52.272937 | SIO2V | 1.5607857 | 82.935 |
| 6 | −405.15896 | 2.506345 | N2VP950 | 1.00029966 | 79.384 |
| 7 | −349.632507 | 57.987649 | SIO2V | 1.5607857 | 78.093 |
| 8 | −625.61536 | 0.999978 | N2VP950 | 1.00029966 | 57.316 |
| 9 | 258.6518 | 13.775087 | SIO2V | 1.5607857 | 51.65 |
| 10 | 3309.642007 | 6.085525 | N2VP950 | 1.00029966 | 46.297 |
| 11 | 2505.032734 | 45.485164 | SIO2V | 1.5607857 | 44.366 |
| 12 | −160.280782 | 83.214895 | N2VP950 | 1.00029966 | 43.224 |
| 13 | −179.709766 | 28.095749 | SIO2V | 1.5607857 | 75.748 |
| 14 | −113.094268 | 0.99999 | N2VP950 | 1.00029966 | 80.728 |
| 15 | −828.761389 | 28.910199 | SIO2V | 1.5607857 | 86.836 |
| 16 | −193.020806 | 237.594315 | N2VP950 | 1.00029966 | 88.806 |
| 17 | −170.301754 | −197.594315 | REFL | 1.00029966 | 137.191 |
| 18 | 164.75935 | 237.900412 | REFL | 1.00029966 | 114.069 |
| 19 | 213.979631 | 41.964013 | SIO2V | 1.5607857 | 95.394 |
| 20 | −571.726494 | 30.907497 | N2VP950 | 1.00029966 | 93.468 |
| 21 | −607.905756 | 12.000001 | SIO2V | 1.5607857 | 81.046 |
| 22 | 213.467641 | 20.540794 | N2VP950 | 1.00029966 | 75.725 |
| 23 | 118232.9153 | 10.073155 | SIO2V | 1.5607857 | 75.17 |
| 24 | 134.456642 | 11.393332 | N2VP950 | 1.00029966 | 73.687 |
| 25 | 193.022977 | 12.19948 | SIO2V | 1.5607857 | 75.339 |
| 26 | 149.820622 | 39.058556 | N2VP950 | 1.00029966 | 76.132 |
| 27 | −473.179277 | 16.280318 | SIO2V | 1.5607857 | 82.022 |
| 28 | −265.194438 | 3.071697 | N2VP950 | 1.00029966 | 88.666 |
| 29 | −596.281929 | 34.549024 | SIO2V | 1.5607857 | 89.977 |
| 30 | −234.857742 | 2.605623 | N2VP950 | 1.00029966 | 100.123 |
| 31 | −681.432168 | 46.50367 | SIO2V | 1.5607857 | 108.764 |
| 32 | −170.41214 | 29.245335 | N2VP950 | 1.00029966 | 113.403 |
| 33 | 709.34663 | 59.972517 | SIO2V | 1.5607857 | 125.713 |
| 34 | −519.598522 | 1.519132 | N2VP950 | 1.00029966 | 126.621 |
| 35 | 450.108474 | 47.183961 | SIO2V | 1.5607857 | 123.987 |
| 36 | −298.350498 | −21.086597 | N2VP950 | 1.00029966 | 122.98 |
| 37 | 0 | 23.537621 | N2VP950 | 1.00029966 | 120.368 |
| 38 | 195.285408 | 43.215118 | SIO2V | 1.5607857 | 105.824 |
| 39 | 22862.90022 | 1.012838 | N2VP950 | 1.00029966 | 100.964 |
| 40 | 97.777305 | 39.731996 | SIO2V | 1.5607857 | 76.541 |
| 41 | 292.58902 | 4.247054 | N2VP950 | 1.00029966 | 67.621 |
| 42 | 77.06685 | 38.565556 | SIO2V | 1.5607857 | 47.651 |
| 43 | 0 | 3 | H2OV193 | 1.43667693 | 21.068 |
| 44 | 0 | 0 | | | 16.5 |

TABLE 9A

| | Aspheric constants | | | | |
|---|---|---|---|---|---|
| | SRF | | | | |
| | 10 | 17 | 18 | 22 | 28 |
| K | 0 | −0.609408 | −0.404331 | 0 | 0 |
| C1 | 4.50E−07 | 0.00E+00 | 0.00E+00 | −6.14E−08 | 1.09E−07 |
| C2 | −2.70E−11 | 7.78E−15 | −9.34E−15 | 3.42E−12 | 3.58E−12 |
| C3 | 4.11E−14 | 3.36E−19 | −6.87E−19 | 2.90E−16 | 5.02E−16 |
| C4 | −1.48E−17 | −2.72E−23 | 1.64E−25 | −4.54E−21 | −3.35E−20 |

TABLE 9A-continued

| | Aspheric constants | | | | |
|---|---|---|---|---|---|
| C5 | 1.25E−20 | 2.59E−27 | 2.75E−27 | −1.65E−24 | −2.30E−24 |
| C6 | −3.96E−24 | −1.24E−31 | −6.03E−31 | 1.25E−27 | 5.00E−29 |
| C7 | 4.61E−28 | 3.13E−36 | 3.69E−35 | −1.97E−31 | −3.03E−32 |
| C8 | 5.89E−32 | −3.19E−41 | −8.59E−40 | 1.57E−35 | 2.67E−36 |

| | SRF | | |
|---|---|---|---|
| | 29 | 35 | 39 |
| K | 0 | 0 | 0 |
| C1 | −2.77E−08 | −4.34E−08 | −1.96E−08 |
| C2 | −7.08E−13 | 1.12E−13 | 2.57E−12 |
| C3 | 5.74E−16 | 5.13E−17 | −8.29E−17 |
| C4 | −4.78E−20 | −1.19E−21 | 5.74E−21 |
| C5 | 3.19E−24 | −1.83E−26 | −6.59E−25 |
| C6 | −2.07E−28 | 2.98E−31 | 5.81E−29 |
| C7 | 6.57E−33 | 3.65E−35 | −2.82E−33 |
| C8 | −8.15E−37 | −9.28E−40 | 5.86E−38 |

TABLE 10

| SURF | RADIUS | THICKNESS | MATERIAL | INDEX | SEMIDIAM. |
|---|---|---|---|---|---|
| 0 | 0 | 35 | LUFTV193 | 1.00030168 | 66 |
| 1 | 287.201368 | 23.165416 | SIO2V | 1.5607857 | 80.746 |
| 2 | 9548.563984 | 5.351787 | N2VP950 | 1.00029966 | 81.708 |
| 3 | 237.938727 | 27.034898 | SIO2V | 1.5607857 | 84.398 |
| 4 | 9748.474128 | 5.009226 | N2VP950 | 1.00029966 | 83.75 |
| 5 | 162.029839 | 30.440188 | SIO2V | 1.5607857 | 81.611 |
| 6 | 97.700439 | 24.108143 | N2VP950 | 1.00029966 | 71.632 |
| 7 | 285.67649 | 59.994975 | SIO2V | 1.5607857 | 72.04 |
| 8 | −212.500863 | 1.413267 | N2VP950 | 1.00029966 | 73.053 |
| 9 | 231.286954 | 59.984338 | SIO2V | 1.5607857 | 68.81 |
| 10 | −272.808567 | 19.053716 | N2VP950 | 1.00029966 | 59.332 |
| 11 | 470.335844 | 27.320605 | SIO2V | 1.5607857 | 44.739 |
| 12 | −139.04097 | 1.780746 | N2VP950 | 1.00029966 | 45.687 |
| 13 | −127.442683 | 14.466354 | SIO2V | 1.5607857 | 45.809 |
| 14 | −301.722518 | 29.641205 | N2VP950 | 1.00029966 | 49.864 |
| 15 | −87.764582 | 15.000004 | SIO2V | 1.5607857 | 53.623 |
| 16 | −141.229355 | 34.507463 | N2VP950 | 1.00029966 | 61.571 |
| 17 | −259.685309 | 20.689312 | SIO2V | 1.5607857 | 75.669 |
| 18 | −163.685953 | 1.001108 | N2VP950 | 1.00029966 | 79.628 |
| 19 | −425.644839 | 25.473178 | SIO2V | 1.5607857 | 82.933 |
| 20 | −177.604049 | 271.436522 | N2VP950 | 1.00029966 | 85.588 |
| 21 | −192.411117 | −231.436522 | REFL | 1.00029966 | 145.837 |
| 22 | 181.316474 | 275.635733 | REFL | 1.00029966 | 127.943 |
| 23 | 160.280773 | 39.766183 | SIO2V | 1.5607857 | 84.727 |
| 24 | 433.630809 | 1.168124 | N2VP950 | 1.00029966 | 79.442 |
| 25 | 172.894805 | 12.000005 | SIO2V | 1.5607857 | 76.455 |
| 26 | 142.708343 | 25.834202 | N2VP950 | 1.00029966 | 72.617 |
| 27 | −522.138568 | 12 | SIO2V | 1.5607857 | 71.538 |
| 28 | 98.617841 | 39.707255 | N2VP950 | 1.00029966 | 66.149 |
| 29 | −242.043593 | 13.973969 | SIO2V | 1.5607857 | 67.886 |
| 30 | −428.430378 | 1.113943 | N2VP950 | 1.00029966 | 76.048 |
| 31 | 1395.872365 | 59.770439 | SIO2V | 1.5607857 | 77.227 |
| 32 | −200.881136 | 0.999953 | N2VP950 | 1.00029966 | 94.132 |
| 33 | −796.373326 | 36.651147 | SIO2V | 1.5607857 | 101.811 |
| 34 | −231.145256 | 0.999958 | N2VP950 | 1.00029966 | 107.115 |
| 35 | 1394.739591 | 34.401193 | SIO2V | 1.5607857 | 113.699 |
| 36 | −367.962973 | 0.999965 | N2VP950 | 1.00029966 | 114.834 |
| 37 | 501.517244 | 61.420268 | SIO2V | 1.5607857 | 114.165 |
| 38 | −252.939454 | −26.770128 | N2VP950 | 1.00029966 | 113.428 |
| 39 | 0 | 27.770123 | N2VP950 | 1.00029966 | 113.395 |
| 40 | 219.357199 | 45.58316 | SIO2V | 1.5607857 | 104.413 |
| 41 | −692.879408 | 0.999976 | N2VP950 | 1.00029966 | 100.937 |
| 42 | 89.810973 | 40.252244 | SIO2V | 1.5607857 | 73.593 |
| 43 | 252.083859 | 1.000011 | N2VP950 | 1.00029966 | 64.98 |
| 44 | 72.146642 | 41.286323 | SIO2V | 1.5607857 | 48.589 |
| 45 | 0 | 3 | H2OV193 | 1.43667693 | 21.154 |
| 46 | 0 | 0 | | | 16.501 |

TABLE 10A

Aspheric constants

| | SRF | | | | |
|---|---|---|---|---|---|
| | 21 | 22 | 26 | 30 | 31 |
| K | −0.459313 | −0.341948 | 0 | 0 | 0 |
| C1 | 0.00E+00 | 0.00E+00 | −8.70E−08 | 1.71E−07 | −5.72E−08 |
| C2 | 1.02E−14 | −4.95E−15 | −1.61E−12 | 6.01E−12 | −2.30E−13 |
| C3 | −5.02E−19 | 2.15E−19 | 1.90E−16 | 5.80E−17 | 1.96E−16 |
| C4 | 7.89E−23 | −9.13E−23 | −5.76E−20 | −5.21E−20 | −1.01E−20 |
| C5 | −5.82E−27 | 1.06E−26 | 1.91E−23 | −8.66E−24 | −1.44E−23 |
| C6 | 2.63E−31 | −7.20E−31 | −5.62E−27 | −1.36E−27 | 2.35E−27 |
| C7 | −6.44E−36 | 2.52E−35 | 7.41E−31 | 6.08E−31 | −1.26E−31 |
| C8 | 6.64E−41 | −3.58E−40 | −4.73E−35 | −5.19E−35 | −3.01E−36 |

| | SRF | |
|---|---|---|
| | 37 | 41 |
| K | 0 | 0 |
| C1 | −5.65E−08 | −2.58E−08 |
| C2 | 8.17E−14 | 3.95E−12 |
| C3 | 8.43E−17 | −2.50E−16 |
| C4 | −7.58E−22 | 2.34E−20 |
| C5 | −6.19E−26 | −2.23E−24 |
| C6 | −8.89E−31 | 1.68E−28 |
| C7 | 1.00E−34 | −7.72E−33 |
| C8 | −1.44E−39 | 1.60E−37 |

TABLE 11

| SURF | RADIUS | THICKNESS | MATERIAL | INDEX | SEMIDIAM. |
|---|---|---|---|---|---|
| 0 | 0.000000 | 35.000000 | | | 66.0 |
| 1 | 213.125261 | 21.214076 | SIO2 | 1.560786 | 82.2 |
| 2 | 480.525665 | 1.000000 | | | 82.6 |
| 3 | 185.297502 | 31.993610 | SIO2 | 1.560786 | 84.8 |
| 4 | 7598.261113 | 4.999310 | | | 83.7 |
| 5 | 117.345388 | 11.527031 | SIO2 | 1.560786 | 79.0 |
| 6 | 90.286435 | 62.598487 | | | 72.4 |
| 7 | 309.861090 | 34.537793 | SIO2 | 1.560786 | 74.4 |
| 8 | −255.169966 | 1.000267 | | | 73.6 |
| 9 | 183.493169 | 25.255034 | SIO2 | 1.560786 | 67.0 |
| 10 | −733.608935 | 19.932610 | | | 63.6 |
| 11 | 331.584148 | 52.054611 | SIO2 | 1.560786 | 51.0 |
| 12 | −141.351439 | 8.662425 | | | 44.3 |
| 13 | −135.694467 | 12.000000 | SIO2 | 1.560786 | 45.2 |
| 14 | −438.411699 | 16.902875 | | | 48.6 |
| 15 | −80.203122 | 31.804553 | SIO2 | 1.560786 | 49.3 |
| 16 | −123.130978 | 34.208750 | | | 62.6 |
| 17 | −308.561940 | 19.408823 | SIO2 | 1.560786 | 76.5 |
| 18 | −190.486221 | 1.000288 | | | 80.0 |
| 19 | −339.277899 | 24.240054 | SIO2 | 1.560786 | 81.9 |
| 20 | −169.353619 | 266.539075 | | | 84.6 |
| 21 | −190.594737 | −226.539075 | REFL | | 149.9 |
| 22 | 178.620508 | 266.539075 | REFL | | 125.1 |
| 23 | 221.347957 | 30.251017 | SIO2 | 1.560786 | 86.1 |
| 24 | 1463.195317 | 1.000000 | | | 83.7 |
| 25 | 250.202612 | 40.863033 | SIO2 | 1.560786 | 81.0 |
| 26 | 143.175358 | 28.105820 | | | 69.5 |
| 27 | −407.324144 | 12.000273 | SIO2 | 1.560786 | 68.5 |
| 28 | 115.532167 | 36.897440 | | | 67.0 |
| 29 | −221.836172 | 11.999999 | SIO2 | 1.560786 | 68.9 |
| 30 | −226.960357 | 1.000000 | | | 74.6 |
| 31 | 2492.697910 | 55.157108 | SIO2 | 1.560786 | 78.7 |
| 32 | −161.739806 | 1.000000 | | | 91.0 |
| 33 | −695.448789 | 45.255799 | SIO2 | 1.560786 | 97.4 |
| 34 | −259.466566 | 1.000000 | | | 104.4 |
| 35 | 1602.782680 | 56.958100 | SIO2 | 1.560786 | 107.7 |
| 36 | −470.968577 | 1.000000 | | | 110.0 |
| 37 | 0.000000 | 0.000000 | | | 109.3 |
| 38 | 386.901024 | 44.983112 | SIO2 | 1.560786 | 110.7 |
| 39 | −272.274704 | 1.000000 | | | 111.1 |
| 40 | 175.872135 | 43.089438 | SIO2 | 1.560786 | 99.5 |
| 41 | −2548.763499 | 1.000000 | | | 95.3 |

TABLE 11-continued

| SURF | RADIUS | THICKNESS | MATERIAL | INDEX | SEMIDIAM. |
|---|---|---|---|---|---|
| 42 | 91.643707 | 37.595346 | SIO2 | 1.560786 | 72.4 |
| 43 | 255.781458 | 1.000000 | | | 64.0 |
| 44 | 67.785174 | 39.963844 | SIO2 | 1.560786 | 47.1 |
| 45 | 0.000000 | 3.000000 | H20 | 1.436677 | 21.2 |
| 46 | 0.000000 | 0.000000 | | | 16.5 |

TABLE 11A

Aspheric constants

| | SRF | | | | |
|---|---|---|---|---|---|
| | 2 | 10 | 11 | 21 | 22 |
| K | 0 | 0 | 0 | −0.496553 | −0.336642 |
| C1 | 1.643437E−09 | 8.928205E−09 | −8.734171E−08 | 0.000000E+00 | 0.000000E+00 |
| C2 | 1.208889E−14 | 1.236176E−11 | 2.818326E−12 | 5.747313E−15 | −6.240079E−15 |
| C3 | 8.824285E−18 | −1.197673E−15 | −1.228572E−15 | −1.412426E−19 | 6.784381E−20 |
| C4 | 2.922597E−21 | 6.507491E−19 | 1.042260E−18 | 2.261574E−23 | −7.158782E−23 |
| C5 | −2.369521E−25 | −1.334779E−22 | −3.756091E−23 | −1.450149E−27 | 8.093083E−27 |
| C6 | 3.356358E−30 | 2.670393E−26 | −1.473570E−25 | 5.772350E−32 | −5.720179E−31 |
| C7 | 2.828477E−35 | −3.381376E−30 | 7.050051E−29 | −1.232729E−36 | 2.078917E−35 |
| C8 | 1.430860E−38 | 2.797022E−34 | −9.591943E−33 | 1.120210E−41 | −3.145520E−40 |

| | SRF | | | | |
|---|---|---|---|---|---|
| | 26 | 30 | 31 | 38 | 41 |
| K | 0 | 0 | 0 | 0 | 0 |
| C1 | −7.826978E−08 | 1.171952E−07 | −8.372229E−08 | −4.940289E−08 | −1.537092E−08 |
| C2 | 1.072045E−12 | 5.982055E−12 | 1.174253E−12 | 4.933796E−13 | 3.778447E−12 |
| C3 | 4.523977E−16 | −1.760506E−16 | −2.681026E−16 | 6.928288E−17 | −2.017127E−16 |
| C4 | −1.271459E−19 | −1.993128E−20 | −1.550679E−20 | −1.609487E−21 | 1.881073E−20 |
| C5 | 3.954232E−23 | −9.529811E−24 | −1.593859E−24 | −7.739698E−26 | −2.087789E−24 |
| C6 | −1.083373E−26 | 1.085578E−28 | −3.657276E−30 | 2.774226E−30 | 1.840295E−28 |
| C7 | 1.465752E−30 | 2.273221E−31 | 2.631779E−32 | −1.572253E−36 | −9.812256E−33 |
| C8 | −8.520650E−35 | −2.669719E−35 | −7.142431E−36 | −4.163468E−40 | 2.332003E−37 |

TABLE 12

| SURF | RADIUS | THICKNESS | MATERIAL | INDEX | SEMIDIAM. |
|---|---|---|---|---|---|
| 0 | 0 | 35 | | | 66 |
| 1 | 251.921115 | 26.62683 | SILUV | 1.56038308 | 83.147 |
| 2 | −989.210896 | 1 | | | 83.812 |
| 3 | 226.732024 | 32.025623 | SILUV | 1.56038308 | 85.26 |
| 4 | 1085.208221 | 1 | | | 83.38 |
| 5 | 128.283517 | 22.646566 | SILUV | 1.56038308 | 80.387 |
| 6 | 88.961725 | 15.545973 | | | 70.501 |
| 7 | 125.835208 | 59.877475 | SILUV | 1.56038308 | 70.846 |
| 8 | −376.328333 | 1 | | | 65.691 |
| 9 | 291.512418 | 41.049599 | SILUV | 1.56038308 | 60.714 |
| 10 | −247.107293 | 6.176611 | | | 50.627 |
| 11 | 152.969724 | 21.192151 | SILUV | 1.56038308 | 42.473 |
| 12 | 228.518434 | 5.482582 | | | 43.945 |
| 13 | 1248.660787 | 43.964726 | SILUV | 1.56038308 | 44.944 |
| 14 | −152.706184 | 12.818026 | | | 54.237 |
| 15 | −87.366215 | 15.60332 | SILUV | 1.56038308 | 54.983 |
| 16 | −85.682846 | 3.636916 | | | 59.545 |
| 17 | −86.526213 | 23.242695 | SILUV | 1.56038308 | 60.097 |
| 18 | −108.668356 | 1 | | | 69.405 |
| 19 | −200 | 16.671044 | SILUV | 1.56038308 | 72.006 |
| 20 | −142.798216 | 250.765038 | | | 74.782 |
| 21 | −166.718612 | −210.765038 | REFL | | 144.311 |
| 22 | 174.284123 | 264.180115 | REFL | | 134.956 |
| 23 | 285.315103 | 27.076989 | SILUV | 1.56038308 | 95.88 |
| 24 | 1483.882926 | 52.740402 | | | 94.405 |
| 25 | 185.601922 | 11.999964 | SILUV | 1.56038308 | 84.907 |
| 26 | 111.087869 | 22.323131 | | | 81.119 |

TABLE 12-continued

| SURF | RADIUS | THICKNESS | MATERIAL | INDEX | SEMIDIAM. |
|---|---|---|---|---|---|
| 27 | 1952.941696 | 12 | SILUV | 1.56038308 | 80.86 |
| 28 | 111.206342 | 58.54433 | | | 74.709 |
| 29 | −126.687949 | 9.999452 | SILUV | 1.56038308 | 76.019 |
| 30 | −155.19187 | 1 | | | 85.365 |
| 31 | 1585.242523 | 54.769473 | SILUV | 1.56038308 | 95.306 |
| 32 | −154.387429 | 1 | | | 104.707 |
| 33 | −348.074244 | 55.068746 | SILUV | 1.56038308 | 113.511 |
| 34 | −243.634705 | 1 | | | 127.583 |
| 35 | −1336.659415 | 41.515446 | SILUV | 1.56038308 | 135.024 |
| 36 | −276.658598 | 1 | | | 137.317 |
| 37 | 435.341885 | 31.595504 | SILUV | 1.56038308 | 136.928 |
| 38 | −3129.657481 | 1.00012 | | | 136.305 |
| 39 | 2105.975535 | 44.442342 | SILUV | 1.56038308 | 135.677 |
| 40 | −300.54242 | −13.727335 | | | 134.991 |
| 41 | 0 | 14.727335 | | | 128.371 |
| 42 | 267.42491 | 43.877196 | SILUV | 1.56038308 | 118.91 |
| 43 | 7074.847026 | 1 | | | 115.781 |
| 44 | 96.288803 | 41.059596 | SILUV | 1.56038308 | 80.776 |
| 45 | 228.69124 | 1 | | | 72.473 |
| 46 | 61.190052 | 42.233094 | SILUV | 1.56038308 | 49.33 |
| 47 | 0 | 3 | WATER | 1.437 | 23.01 |
| 48 | 0 | 0 | | | 16.502 |

TABLE 12A

Aspheric constants

| | SRF | | | | |
|---|---|---|---|---|---|
| | 10 | 19 | 21 | 22 | 26 |
| K | 0 | 0 | −0.418696 | −0.381372 | 0 |
| C1 | 3.04E−07 | −2.32E−08 | 0.00E+00 | 0.00E+00 | −1.87E−07 |
| C2 | 4.29E−11 | 2.52E−13 | 6.76E−15 | −3.96E−15 | −1.36E−11 |
| C3 | −1.17E−14 | −8.41E−18 | 7.47E−20 | 1.19E−19 | −1.96E−16 |
| C4 | 4.44E−18 | −1.26E−20 | −4.44E−24 | −6.18E−23 | −5.50E−21 |
| C5 | −1.37E−21 | 4.90E−25 | 8.79E−28 | 5.39E−27 | 4.78E−24 |
| C6 | 2.64E−25 | −2.31E−28 | −4.77E−32 | −3.03E−31 | −9.08E−28 |
| C7 | −4.76E−29 | 2.58E−32 | 1.37E−36 | 9.32E−36 | 7.93E−32 |
| C8 | 2.93E−33 | −2.18E−36 | −1.19E−41 | −1.19E−40 | −5.07E−36 |

| | SRF | | | | |
|---|---|---|---|---|---|
| | 30 | 31 | 37 | 40 | 43 |
| K | 0 | 0 | 0 | 0 | 0 |
| C1 | 1.24E−07 | −6.86E−08 | −4.46E−08 | −2.05E−09 | −8.05E−08 |
| C2 | 9.26E−12 | −4.81E−14 | −5.47E−13 | 1.28E−13 | 5.05E−12 |
| C3 | 4.76E−16 | 7.52E−17 | 5.21E−17 | 1.78E−17 | −2.49E−16 |
| C4 | 1.38E−20 | −1.74E−20 | 6.91E−22 | −6.14E−22 | 1.14E−20 |
| C5 | −7.47E−24 | 8.52E−25 | −2.40E−26 | 4.48E−26 | −3.40E−25 |
| C6 | 5.98E−28 | −2.23E−29 | −2.11E−31 | −1.55E−30 | 2.27E−30 |
| C7 | −7.73E−32 | −3.06E−33 | −2.39E−35 | 1.88E−35 | 2.38E−34 |
| C8 | 7.38E−36 | 1.25E−37 | 5.01E−40 | −4.01E−40 | −5.88E−39 |

TABLE 13

| SURF | RADIUS | THICKNESS | MATERIAL | INDEX | SEMIDIAM. |
|---|---|---|---|---|---|
| 0 | 0 | 35 | | | 65 |
| 1 | 186.586828 | 23.414502 | SIO2V | 1.5607857 | 83.982 |
| 2 | 597.259215 | 10.26813 | | | 84.106 |
| 3 | 246.448938 | 35.48684 | SIO2V | 1.5607857 | 87.131 |
| 4 | −495.470793 | 0.999999 | | | 86.762 |
| 5 | 174.29392 | 12 | SIO2V | 1.5607857 | 82.318 |
| 6 | 105.886625 | 42.974925 | | | 75.746 |
| 7 | 298.014263 | 30.569503 | SIO2V | 1.5607857 | 77.754 |
| 8 | −362.490174 | 0.999996 | | | 77.303 |
| 9 | 197.585289 | 26.9647 | SIO2V | 1.5607857 | 72.92 |
| 10 | 115.191376 | 6.433657 | | | 64.383 |
| 11 | 87.197031 | 33.092701 | SIO2V | 1.5607857 | 63.668 |

TABLE 13-continued

| SURF | RADIUS | THICKNESS | MATERIAL | INDEX | SEMIDIAM. |
|---|---|---|---|---|---|
| 12 | −21177.81881 | 11.342683 | | | 59.87 |
| 13 | 170.163316 | 22.577563 | SIO2V | 1.5607857 | 53.888 |
| 14 | −397.634502 | 6.245625 | | | 50.153 |
| 15 | −329.557796 | 25.65494 | SIO2V | 1.5607857 | 46.008 |
| 16 | −440.379282 | 27.044628 | | | 48.461 |
| 17 | −57.443645 | 14.999995 | SIO2V | 1.5607857 | 48.693 |
| 18 | −75.393191 | 18.813359 | | | 56.902 |
| 19 | −65.427115 | 14.999993 | SIO2V | 1.5607857 | 58.809 |
| 20 | −85.530419 | 0.099998 | | | 69.648 |
| 21 | −227.629071 | 32.632252 | SIO2V | 1.5607857 | 78.348 |
| 22 | −113.134147 | 273.116577 | | | 82.743 |
| 23 | −185.855248 | −233.116577 | REFL | | 152.166 |
| 24 | 187.338489 | 273.423654 | REFL | | 143.116 |
| 25 | 277.370431 | 23.120389 | SIO2V | 1.5607857 | 85.671 |
| 26 | 1042.417218 | 0.999997 | | | 83.965 |
| 27 | 232.607011 | 22.047511 | SIO2V | 1.5607857 | 81.953 |
| 28 | 681.476699 | 7.231337 | | | 79.179 |
| 29 | −4285.293249 | 15 | SIO2V | 1.5607857 | 78.599 |
| 30 | 110.856061 | 30.36008 | | | 72.288 |
| 31 | −2955.113107 | 12 | SIO2V | 1.5607857 | 71.211 |
| 32 | 119.488431 | 40.054646 | | | 69.309 |
| 33 | −194.926507 | 10 | SIO2V | 1.5607857 | 71.047 |
| 34 | −199.009301 | 0.999987 | | | 77.318 |
| 35 | 7009.414576 | 51.207677 | SIO2V | 1.5607857 | 80.754 |
| 36 | −165.020018 | 1 | | | 95.379 |
| 37 | −367.692901 | 34.170188 | SIO2V | 1.5607857 | 103.911 |
| 38 | −197.86104 | 1 | | | 110.595 |
| 39 | −660.167042 | 61.861902 | SIO2V | 1.5607857 | 118.204 |
| 40 | −205.342177 | 1 | | | 126.012 |
| 41 | 465.895739 | 25.776885 | SIO2V | 1.5607857 | 126.361 |
| 42 | −2628.836635 | 0.099011 | | | 125.541 |
| 43 | 8527.260833 | 40.948445 | SIO2V | 1.5607857 | 125.078 |
| 44 | −271.386413 | 0 | | | 124.177 |
| 45 | 0 | 0 | | | 112.927 |
| 46 | 243.774903 | 41.095341 | SIO2V | 1.5607857 | 107.874 |
| 47 | −3313.940195 | 1 | | | 104.66 |
| 48 | 83.350349 | 42.069771 | SIO2V | 1.5607857 | 73.803 |
| 49 | 208.118275 | 1 | | | 66.123 |
| 50 | 55.435689 | 36.911372 | SIO2V | 1.5607857 | 44.754 |
| 51 | 0 | 3 | H2OV193 | 1.43667693 | 22.888 |
| 52 | 0 | 0 | | | 16.254 |

TABLE 13A

Aspheric constants

| | SRF | | | | |
|---|---|---|---|---|---|
| | 2 | 12 | 13 | 21 | 23 |
| K | 0 | 0 | 0 | 0 | −0.4498 |
| C1 | 5.14E−08 | 2.47E−07 | 6.72E−08 | −1.49E−08 | 0.00E+00 |
| C2 | −3.80E−14 | 3.12E−11 | 2.44E−11 | 5.94E−13 | −6.07E−16 |
| C3 | −1.94E−18 | −4.32E−15 | 1.29E−15 | −3.47E−17 | −1.49E−19 |
| C4 | 4.21E−21 | 1.90E−18 | 3.61E−19 | −4.54E−22 | 7.27E−24 |
| C5 | −7.98E−25 | −1.98E−22 | 5.61E−22 | −1.73E−25 | −4.02E−28 |
| C6 | 6.31E−29 | 2.16E−26 | −4.89E−26 | 3.64E−29 | 9.03E−33 |
| C7 | −2.12E−34 | −3.06E−31 | 1.03E−30 | −2.29E−33 | −7.65E−38 |
| C8 | −1.42E−37 | 4.40E−34 | 5.75E−34 | 1.51E−37 | −5.25E−43 |

| | SRF | | | | |
|---|---|---|---|---|---|
| | 24 | 30 | 34 | 35 | 41 |
| K | −0.304978 | 0 | 0 | 0 | 0 |
| C1 | 0.00E+00 | −2.20E−07 | 1.50E−07 | −9.41E−08 | −6.08E−08 |
| C2 | −4.92E−15 | −1.47E−11 | 1.13E−11 | −6.32E−13 | −6.68E−14 |
| C3 | 4.31E−20 | −6.27E−17 | 5.33E−16 | −4.10E−17 | 9.32E−17 |
| C4 | −3.35E−23 | −7.88E−20 | 5.07E−21 | −1.21E−20 | 1.98E−21 |
| C5 | 2.63E−27 | 3.08E−23 | −4.57E−24 | −2.81E−24 | −8.05E−26 |
| C6 | −1.39E−31 | −5.95E−27 | −2.28E−28 | 8.14E−29 | 9.24E−32 |
| C7 | 3.83E−36 | 6.01E−31 | −1.86E−32 | 5.30E−33 | −1.69E−34 |
| C8 | −4.49E−41 | −2.86E−35 | 1.72E−35 | −2.48E−36 | 6.17E−39 |

TABLE 13A-continued

Aspheric constants

| | SRF | |
|---|---|---|
| | 44 | 47 |
| K | 0 | 0 |
| C1 | −7.09E−09 | −6.42E−08 |
| C2 | 4.04E−13 | 4.46E−12 |
| C3 | 2.36E−17 | −2.33E−16 |
| C4 | 5.85E−22 | 1.60E−20 |
| C5 | −5.55E−26 | −7.22E−25 |
| C6 | 6.24E−30 | 1.37E−29 |
| C7 | −3.15E−34 | 3.59E−34 |
| C8 | 5.34E−39 | −9.82E−39 |

TABLE 14

| SURF | RADIUS | THICKNESS | MATERIAL | INDEX | SEMIDIAM. |
|---|---|---|---|---|---|
| 0 | 0 | 35 | | | 65 |
| 1 | 264.155216 | 53.039363 | SIO2V | 1.5607857 | 81.542 |
| 2 | −708.29109 | 15.80469 | | | 84.656 |
| 3 | 198.655375 | 49.267177 | SIO2V | 1.5607857 | 90.333 |
| 4 | −296.847851 | 1.032629 | | | 89.02 |
| 5 | 188395.3333 | 12.000019 | SIO2V | 1.5607857 | 83.702 |
| 6 | 102.545536 | 14.972935 | | | 73.983 |
| 7 | 142.785896 | 38.44762 | SIO2V | 1.5607857 | 75.139 |
| 8 | 7336.068136 | 1 | | | 73.713 |
| 9 | 106.928203 | 12.000081 | SIO2V | 1.5607857 | 70.401 |
| 10 | 85.093164 | 1.641753 | | | 64.758 |
| 11 | 76.898689 | 64.469228 | SIO2V | 1.5607857 | 64.84 |
| 12 | −453690.3967 | 0.494708 | | | 50.446 |
| 13 | 151.681366 | 18.484685 | SIO2V | 1.5607857 | 47.423 |
| 14 | −363.490767 | 1.138548 | | | 43.25 |
| 15 | −423.037048 | 10 | SIO2V | 1.5607857 | 43.525 |
| 16 | 513.67606 | 37.991004 | | | 45.761 |
| 17 | −54.826872 | 16.135714 | SIO2V | 1.5607857 | 48.065 |
| 18 | −76.475326 | 2.91112 | | | 59.373 |
| 19 | −235.467293 | 87.250476 | SIO2V | 1.5607857 | 69.466 |
| 20 | −123.833603 | 270.153968 | | | 91.586 |
| 21 | −189.904942 | −230.153968 | REFL | | 154.818 |
| 22 | 175.052549 | 279.034717 | REFL | | 138.889 |
| 23 | 584.131276 | 18.62041 | SIO2V | 1.5607857 | 71.907 |
| 24 | 111.389792 | 27.300612 | | | 68.759 |
| 25 | −1516.326452 | 12.000002 | SIO2V | 1.5607857 | 69.364 |
| 26 | 147.378607 | 31.451574 | | | 73.254 |
| 27 | −362.020208 | 12 | SIO2V | 1.5607857 | 76.176 |
| 28 | −208.499815 | 1.640751 | | | 80.458 |
| 29 | 2551.550571 | 58.800655 | SIO2V | 1.5607857 | 89.721 |
| 30 | −162.566587 | 1 | | | 102.174 |
| 31 | −596.110808 | 30.823878 | SIO2V | 1.5607857 | 111.779 |
| 32 | −242.915533 | 1.000004 | | | 115.425 |
| 33 | −1403.743088 | 66.546477 | SIO2V | 1.5607857 | 119.764 |
| 34 | −315.509469 | 1.000866 | | | 126.177 |
| 35 | 408.007384 | 50.326509 | SIO2V | 1.5607857 | 125.404 |
| 36 | −350.602433 | 1 | | | 123.958 |
| 37 | −1141.174919 | 18.698745 | SIO2V | 1.5607857 | 116.585 |
| 38 | −446.728577 | −3.536343 | | | 114.214 |
| 39 | 0 | 4.536343 | | | 109.775 |
| 40 | 159.383791 | 42.840202 | SIO2V | 1.5607857 | 100.406 |
| 41 | 3177.374501 | 1 | | | 97.192 |
| 42 | 78.804469 | 35.408881 | SIO2V | 1.5607857 | 68.008 |
| 43 | 170.008236 | 1 | | | 60.471 |
| 44 | 55.898462 | 33.213214 | SIO2V | 1.5607857 | 42.887 |
| 45 | 0 | 3 | H2OV193 | 1.43667693 | 22.783 |
| 46 | 0 | 0 | | | 16.253 |

TABLE 14A

Aspheric constants

| | SRF | | | | |
|---|---|---|---|---|---|
| | 2 | 12 | 13 | 19 | 21 |
| K | 0 | 0 | 0 | 0 | −0.447479 |
| C1 | 3.78E−08 | 3.57E−07 | −5.44E−08 | 3.83E−08 | 0.00E+00 |
| C2 | 2.66E−12 | 1.96E−11 | −2.40E−11 | 2.56E−13 | −5.59E−16 |
| C3 | −1.97E−16 | 6.31E−15 | 8.87E−15 | −2.12E−16 | 3.43E−19 |
| C4 | 2.37E−20 | −9.55E−19 | −7.06E−18 | 5.73E−21 | −3.56E−23 |
| C5 | −2.23E−24 | −2.55E−22 | 1.67E−21 | −1.00E−24 | 2.72E−27 |
| C6 | 1.48E−28 | −8.65E−26 | −2.22E−25 | 2.39E−28 | −1.16E−31 |
| C7 | −9.02E−34 | 2.04E−29 | −1.24E−28 | 1.26E−32 | 2.72E−36 |
| C8 | −2.19E−37 | −1.29E−32 | 8.07E−33 | −1.88E−36 | −2.60E−41 |

| | SRF | | | | |
|---|---|---|---|---|---|
| | 22 | 24 | 25 | 28 | 29 |
| K | −0.269196 | 0 | 0 | 0 | 0 |
| C1 | 0.00E+00 | −1.90E−07 | −1.07E−07 | 7.94E−08 | −4.11E−08 |
| C2 | −2.35E−15 | −9.95E−12 | 1.90E−12 | 3.38E−12 | −9.39E−13 |
| C3 | 4.59E−21 | −5.46E−16 | −1.31E−16 | 5.77E−17 | −3.94E−17 |
| C4 | −1.95E−23 | 1.36E−20 | −8.66E−20 | −3.25E−21 | 7.40E−21 |
| C5 | 2.32E−27 | 1.11E−23 | 6.80E−23 | −2.17E−25 | −7.50E−24 |
| C6 | −1.42E−31 | −1.76E−27 | −1.45E−26 | 4.68E−30 | 1.58E−27 |
| C7 | 4.52E−36 | 1.20E−30 | 3.34E−30 | 4.57E−32 | −1.55E−31 |
| C8 | −5.19E−41 | −6.74E−35 | −2.43E−34 | 1.76E−36 | 6.35E−36 |

| | SRF | | |
|---|---|---|---|
| | 35 | 38 | 41 |
| K | 0 | 0 | 0 |
| C1 | −5.52E−08 | −1.11E−08 | −2.87E−08 |
| C2 | 2.65E−13 | 8.65E−13 | 2.22E−12 |
| C3 | 8.42E−17 | 3.74E−17 | −1.63E−16 |
| C4 | 3.45E−21 | 3.35E−21 | 2.19E−20 |
| C5 | −2.31E−25 | −4.18E−25 | −1.18E−24 |
| C6 | 2.28E−31 | 2.67E−29 | −2.24E−29 |
| C7 | 2.16E−35 | −8.47E−34 | 5.71E−33 |
| C8 | 2.04E−39 | 5.77E−39 | −1.82E−37 |

TABLE 15

| SURF | RADIUS | THICKNESS | MATERIAL | INDEX | SEMIDIAM. |
|---|---|---|---|---|---|
| 0 | 0 | 35 | | | 65 |
| 1 | 220.440206 | 90.193314 | SIO2V | 1.5607857 | 82.632 |
| 2 | −2258.387326 | 0.099978 | | | 86.391 |
| 3 | 191.078269 | 45.21979 | SIO2V | 1.5607857 | 89.197 |
| 4 | −346.939277 | 5.038291 | | | 87.936 |
| 5 | −862.704276 | 11.999955 | SIO2V | 1.5607857 | 83.714 |
| 6 | 106.229194 | 9.360323 | | | 75.459 |
| 7 | 124.368852 | 37.350319 | SIO2V | 1.5607857 | 77.121 |
| 8 | 2278.621151 | 1 | | | 75.985 |
| 9 | 130.547812 | 11.999956 | SIO2V | 1.5607857 | 73.073 |
| 10 | 97.147988 | 1.00002 | | | 67.707 |
| 11 | 80.762223 | 48.20009 | SIO2V | 1.5607857 | 67.797 |
| 12 | −836.844333 | 0.735286 | | | 62.235 |
| 13 | 146.655061 | 35.349711 | SIO2V | 1.5607857 | 56.269 |
| 14 | −325.682663 | 5.303246 | | | 44.684 |
| 15 | −237.715704 | 10 | SIO2V | 1.5607857 | 42.717 |
| 16 | 97614.51754 | 31.113387 | | | 44.942 |
| 17 | −55.878516 | 25.725119 | SIO2V | 1.5607857 | 46.52 |
| 18 | −84.463856 | 3.412335 | | | 61.171 |
| 19 | −206.813589 | 73.554079 | SIO2V | 1.5607857 | 68.435 |
| 20 | −122.996844 | 265.817443 | | | 87.048 |
| 21 | −188.846432 | −225.817443 | REFL | | 158.348 |
| 22 | 170.512895 | 266.104304 | REFL | | 131.309 |
| 23 | 617.040338 | 25.358997 | SIO2V | 1.5607857 | 77.734 |
| 24 | −340.978557 | 1 | | | 76.849 |
| 25 | −575.873317 | 11.999961 | SIO2V | 1.5607857 | 74.709 |
| 26 | 127.056764 | 29.486792 | | | 68.944 |
| 27 | −919.909026 | 11.999959 | SIO2V | 1.5607857 | 69.382 |

TABLE 15-continued

| SURF | RADIUS | THICKNESS | MATERIAL | INDEX | SEMIDIAM. |
|---|---|---|---|---|---|
| 28 | 141.247218 | 33.090673 | | | 73.039 |
| 29 | −327.789177 | 14.007072 | SIO2V | 1.5607857 | 76.032 |
| 30 | −187.527488 | 1.002508 | | | 80.888 |
| 31 | 1268.298268 | 66.023641 | SIO2V | 1.5607857 | 92.44 |
| 32 | −172.960759 | 1 | | | 106.476 |
| 33 | −551.894279 | 31.122194 | SIO2V | 1.5607857 | 114.794 |
| 34 | −248.493705 | 2.656579 | | | 118.516 |
| 35 | −5734.547222 | 50.472484 | SIO2V | 1.5607857 | 123.221 |
| 36 | −350.590281 | 3.163294 | | | 126.143 |
| 37 | 402.358109 | 43.558538 | SIO2V | 1.5607857 | 124.07 |
| 38 | −381.952357 | 1 | | | 122.788 |
| 39 | −1074.912987 | 18.425846 | SIO2V | 1.5607857 | 116.413 |
| 40 | −432.576165 | −8.977508 | | | 114.127 |
| 41 | 0 | 9.977508 | | | 111.763 |
| 42 | 180.300844 | 40.797225 | SIO2V | 1.5607857 | 101.129 |
| 43 | 6426.19364 | 1 | | | 97.236 |
| 44 | 84.482776 | 36.262612 | SIO2V | 1.5607857 | 70.522 |
| 45 | 215.215262 | 1 | | | 63.323 |
| 46 | 53.879713 | 33.812201 | SIO2V | 1.5607857 | 42.561 |
| 47 | 0 | 3 | H2OV193 | 1.43667693 | 22.774 |
| 48 | 0 | 0 | | | 16.253 |

TABLE 15A

Aspheric constants

| | SRF | | | | |
|---|---|---|---|---|---|
| | 2 | 12 | 13 | 19 | 21 |
| K | 0 | 0 | 0 | 0 | −0.468594 |
| C1 | 2.23E−08 | 1.88E−07 | −1.64E−07 | 1.00E−08 | 0.00E+00 |
| C2 | 4.33E−12 | 2.77E−11 | −1.41E−12 | −4.07E−13 | 1.68E−16 |
| C3 | −3.03E−16 | −4.05E−15 | −5.95E−15 | −1.03E−16 | 2.66E−19 |
| C4 | 2.79E−20 | −2.39E−18 | −2.18E−18 | 2.01E−20 | −2.52E−23 |
| C5 | −3.36E−24 | 1.40E−21 | 6.20E−22 | −6.52E−24 | 1.91E−27 |
| C6 | 2.26E−28 | −3.87E−25 | −4.85E−26 | 1.34E−27 | −8.03E−32 |
| C7 | −2.80E−33 | 5.49E−29 | 2.56E−29 | −1.27E−31 | 1.83E−36 |
| C8 | −1.73E−37 | −3.09E−33 | −4.08E−33 | 5.46E−36 | −1.72E−41 |

| | SRF | | | | |
|---|---|---|---|---|---|
| | 22 | 25 | 27 | 30 | 31 |
| K | −0.258782 | 0 | 0 | 0 | 0 |
| C1 | 0.00E+00 | 1.46E−07 | −1.45E−07 | 6.78E−08 | −4.22E−08 |
| C2 | −2.25E−15 | −1.14E−11 | 1.44E−11 | 5.29E−12 | −1.13E−13 |
| C3 | 4.56E−19 | 1.33E−15 | 1.58E−16 | 2.99E−17 | −2.12E−16 |
| C4 | −7.45E−23 | −1.50E−19 | −1.60E−19 | −3.15E−20 | 3.70E−20 |
| C5 | 7.82E−27 | 7.50E−24 | 6.20E−23 | 3.57E−24 | −8.27E−24 |
| C6 | −4.50E−31 | 1.43E−28 | −1.02E−26 | −7.69E−28 | 1.28E−27 |
| C7 | 1.44E−35 | −1.30E−31 | 1.65E−30 | 6.47E−32 | −1.13E−31 |
| C8 | −1.76E−40 | 1.14E−35 | −1.59E−34 | −4.37E−37 | 4.59E−36 |

| | SRF | | |
|---|---|---|---|
| | 37 | 40 | 43 |
| K | 0 | 0 | 0 |
| C1 | −5.99E−08 | −1.37E−08 | −2.10E−08 |
| C2 | 4.92E−13 | 1.20E−12 | 1.02E−12 |
| C3 | 8.41E−17 | 1.32E−17 | −2.69E−18 |
| C4 | 4.25E−21 | 5.28E−21 | 7.37E−21 |
| C5 | −2.88E−25 | −5.23E−25 | −3.90E−25 |
| C6 | 5.24E−31 | 2.93E−29 | −7.25E−30 |
| C7 | 5.37E−35 | −9.06E−34 | 1.51E−33 |
| C8 | 1.09E−39 | 2.79E−39 | −1.24E−38 |

TABLE 16

| SURF | RADIUS | THICKNESS | MATERIAL | INDEX | SEMIDIAM. |
|---|---|---|---|---|---|
| 0 | 0 | 35 | | | 65 |
| 1 | 203.096237 | 51.348217 | SIO2V | 1.5607857 | 84.153 |
| 2 | −1160.222766 | 0.099783 | | | 85.288 |
| 3 | 181.493677 | 43.475858 | SIO2V | 1.5607857 | 86.58 |
| 4 | −341.925526 | 1.005485 | | | 84.893 |
| 5 | −403.858869 | 11.999746 | SIO2V | 1.5607857 | 83.592 |
| 6 | 109.657938 | 15.898981 | | | 74.771 |
| 7 | 164.368819 | 44.721199 | SIO2V | 1.5607857 | 76.185 |
| 8 | 77645.0807 | 1 | | | 75.386 |
| 9 | 95.919438 | 11.999975 | SIO2V | 1.5607857 | 73.703 |
| 10 | 80.656102 | 5.826329 | | | 67.839 |
| 11 | 79.189771 | 47.039779 | SIO2V | 1.5607857 | 68.939 |
| 12 | −561.553393 | 0.099927 | | | 64.509 |
| 13 | 139.074465 | 29.669365 | SIO2V | 1.5607857 | 60.109 |
| 14 | −351.160951 | 9.311808 | | | 53.957 |
| 15 | −473.600856 | 10 | SIO2V | 1.5607857 | 43.672 |
| 16 | 620.385225 | 33.601754 | | | 45.134 |
| 17 | −52.784435 | 14.999981 | SIO2V | 1.5607857 | 46.152 |
| 18 | −74.212989 | 1.001764 | | | 56.339 |
| 19 | −209.153453 | 84.778236 | SIO2V | 1.5607857 | 63.352 |
| 20 | −130.926715 | 255.559533 | | | 85.589 |
| 21 | −187.311637 | −215.559533 | REFL | | 162.9 |
| 22 | 158.774035 | 264.523552 | REFL | | 123.289 |
| 23 | 534.325629 | 42.990891 | SIO2V | 1.5607857 | 83.598 |
| 24 | −461.508523 | 1 | | | 82.714 |
| 25 | −5934.605843 | 12.000066 | SIO2V | 1.5607857 | 80.886 |
| 26 | 119.705874 | 28.744512 | | | 76.197 |
| 27 | 1519.32587 | 12.058263 | SIO2V | 1.5607857 | 77.6 |
| 28 | 141.843628 | 31.894192 | | | 79.343 |
| 29 | −915.926476 | 20.162536 | SIO2V | 1.5607857 | 82.206 |
| 30 | −205.883678 | 1.152206 | | | 86.328 |
| 31 | 10322.23403 | 66.866508 | SIO2V | 1.5607857 | 93.09 |
| 32 | −181.874156 | 1 | | | 109.763 |
| 33 | −421.7412 | 53.839358 | SIO2V | 1.5607857 | 117.145 |
| 34 | −248.466964 | 0.999941 | | | 128.448 |
| 35 | −1926.967116 | 32.001083 | SIO2V | 1.5607857 | 134.375 |
| 36 | −368.835919 | 1.852034 | | | 135.911 |
| 37 | 354.164031 | 52.480694 | SIO2V | 1.5607857 | 136.137 |
| 38 | −368.63102 | 1 | | | 135.137 |
| 39 | −828.73625 | 11.784388 | SIO2V | 1.5607857 | 126.567 |
| 40 | −810.714199 | 2.572951 | | | 124.051 |
| 41 | 0 | −1.572951 | | | 118.262 |
| 42 | 154.167114 | 46.690534 | SIO2V | 1.5607857 | 107.326 |
| 43 | 9845.921815 | 1 | | | 104.915 |
| 44 | 90.785618 | 33.664668 | SIO2V | 1.5607857 | 74.672 |
| 45 | 224.183877 | 1 | | | 69.281 |
| 46 | 52.291327 | 34.416469 | SIO2V | 1.5607857 | 43.665 |
| 47 | 0 | 3 | H2OV193 | 1.43667693 | 24.683 |
| 48 | 0 | 0 | | | 16.256 |

TABLE 16A

Aspheric constants

| | SRF | | | | |
|---|---|---|---|---|---|
| | 2 | 12 | 13 | 19 | 21 |
| K | 0 | 0 | 0 | 0 | −0.448249 |
| C1 | 8.02E−09 | 2.78E−07 | −1.35E−07 | 3.82E−08 | 0.00E+00 |
| C2 | 4.20E−12 | 3.61E−11 | 7.65E−12 | 4.03E−15 | −6.31E−16 |
| C3 | −3.80E−16 | −3.72E−15 | −3.60E−15 | −2.87E−16 | 3.14E−19 |
| C4 | 1.06E−20 | −7.33E−19 | −1.74E−18 | −4.72E−20 | −2.63E−23 |
| C5 | 9.90E−25 | 5.93E−22 | 5.77E−22 | 4.58E−23 | 1.70E−27 |
| C6 | −1.56E−28 | −1.48E−25 | 4.63E−26 | −1.86E−26 | −6.12E−32 |
| C7 | 1.90E−32 | 2.05E−29 | −1.32E−29 | 3.54E−30 | 1.22E−36 |
| C8 | −9.78E−37 | −1.01E−33 | −4.75E−35 | −2.52E−34 | −1.00E−41 |
| | SRF | | | | |
| | 22 | 25 | 27 | 30 | 31 |
| K | −0.301702 | 0 | 0 | 0 | 0 |
| C1 | 0.00E+00 | 1.70E−07 | −1.21E−07 | 4.69E−08 | −4.37E−08 |

TABLE 16A-continued

Aspheric constants

| | | | | | |
|---|---|---|---|---|---|
| C2 | −1.93E−15 | −1.40E−11 | 1.82E−11 | 4.01E−12 | −6.80E−13 |
| C3 | −1.03E−18 | 1.35E−15 | 6.67E−16 | −2.83E−17 | −2.42E−16 |
| C4 | 1.15E−22 | −2.19E−19 | 8.15E−20 | −6.69E−22 | 3.15E−20 |
| C5 | −7.31E−27 | 1.48E−23 | 3.45E−24 | 4.14E−24 | −5.56E−24 |
| C6 | 1.26E−31 | −6.97E−28 | 3.08E−27 | −1.25E−27 | 3.74E−28 |
| C7 | 8.96E−36 | −7.36E−32 | −5.45E−31 | 1.44E−31 | −9.55E−33 |
| C8 | −2.90E−40 | 1.12E−35 | 1.66E−35 | −6.05E−36 | −7.20E−37 |

| | SRF | | |
|---|---|---|---|
| | 37 | 40 | 43 |
| K | 0 | 0 | 0 |
| C1 | −5.26E−08 | −3.16E−08 | 7.85E−10 |
| C2 | 1.78E−13 | 1.40E−12 | 6.39E−13 |
| C3 | 6.38E−17 | −1.09E−17 | −1.45E−17 |
| C4 | 3.79E−21 | 6.35E−21 | 3.10E−21 |
| C5 | −1.89E−25 | −5.33E−25 | 3.20E−25 |
| C6 | −3.40E−31 | 2.59E−29 | −5.68E−29 |
| C7 | 1.88E−35 | −6.08E−34 | 3.00E−33 |
| C8 | 1.27E−39 | 8.73E−40 | −3.92E−38 |

TABLE 17

| Fig. | λ | NA | Yobj | OAL1/mm | OAL3/mm | MG |
|---|---|---|---|---|---|---|
| 2 | 193 | 1.2 | 66 | 430.04 | 548.46 | 0.78 |
| 4 | 193 | 1.2 | 66 | 450.79 | 582.74 | 0.77 |
| 7 | 193 | 1.2 | 66 | 466.38 | 574.00 | 0.81 |
| 9 | 193 | 1.2 | 66 | 460.81 | 591.60 | 0.78 |
| 10 | 193 | 1.2 | 66 | 500.44 | 518.13 | 0.97 |
| 11 | 193 | 1.2 | 66 | 489.34 | 534.12 | 0.92 |
| 12 | 193 | 1.3 | 66 | 425.56 | 613.66 | 0.69 |
| 13 | 193 | 1.3 | 65 | 472.62 | 544.26 | 0.87 |
| 14 | 193 | 1.3 | 65 | 513.08 | 498.55 | 1.03 |
| 15 | 193 | 1.3 | 65 | 521.66 | 502.53 | 1.04 |
| 16 | 193 | 1.35 | 65 | 492.88 | 541.56 | 0.91 |

TABLE 18

| Fig. | λ | NA | Yobj | $R_{LL}$/mm | $T_{LL}$/mm | $DIA_{LL}$/mm | LL1 | LL2 |
|---|---|---|---|---|---|---|---|---|
| 2 | 193 | 1.2 | 66 | 49.61 | 31.48 | 75.96 | 0.63 | 1.53 |
| 4 | 193 | 1.2 | 66 | 50.00 | 29.33 | 73.75 | 0.59 | 1.48 |
| 7 | 193 | 1.2 | 66 | 87.43 | 40.06 | 100.36 | 0.46 | 1.15 |
| 9 | 193 | 1.2 | 66 | 77.07 | 38.57 | 95.24 | 0.50 | 1.24 |
| 10 | 193 | 1.2 | 66 | 72.15 | 41.29 | 96.69 | 0.57 | 1.34 |
| 11 | 193 | 1.2 | 66 | 67.79 | 39.96 | 92.98 | 0.59 | 1.37 |
| 12 | 193 | 1.3 | 66 | 61.19 | 42.23 | 98.47 | 0.69 | 1.61 |
| 13 | 193 | 1.3 | 65 | 55.44 | 36.91 | 89.08 | 0.67 | 1.61 |
| 14 | 193 | 1.3 | 65 | 55.90 | 33.21 | 85.45 | 0.59 | 1.53 |
| 15 | 193 | 1.3 | 65 | 53.88 | 33.81 | 84.84 | 0.63 | 1.57 |
| 16 | 193 | 1.35 | 65 | 52.29 | 34.42 | 87.11 | 0.66 | 1.67 |

TABLE 19

| Fig. | λ | NA | Yobj | COMP1 | COMP2 | COMP3 | N1AS | N2AS | ASR |
|---|---|---|---|---|---|---|---|---|---|
| 2 | 193 | 1.2 | 66 | 9.18 | 138 | 46 | 0 | 1 | 0 |
| 4 | 193 | 1.2 | 66 | 9.29 | 149 | 50 | 0 | 1 | 0 |
| 7 | 193 | 1.2 | 66 | 10.6 | 244 | 81 | 2 | 5 | 0.40 |
| 9 | 193 | 1.2 | 66 | 10.6 | 232 | 77 | 1 | 5 | 0.20 |
| 10 | 193 | 1.2 | 66 | 9.52 | 219 | 73 | 0 | 5 | 0 |
| 11 | 193 | 1.2 | 66 | 9.34 | 215 | 72 | 3 | 5 | 0.60 |
| 12 | 193 | 1.3 | 66 | 9.70 | 233 | 78 | 2 | 6 | 0.33 |
| 13 | 193 | 1.3 | 65 | 9.08 | 236 | 79 | 4 | 6 | 0.67 |
| 14 | 193 | 1.3 | 65 | 9.03 | 208 | 69 | 4 | 7 | 0.57 |
| 15 | 193 | 1.3 | 65 | 8.94 | 214 | 72 | 4 | 7 | 0.57 |
| 16 | 193 | 1.35 | 65 | 9.11 | 218 | 73 | 4 | 7 | 0.57 |

TABLE 20

| Fig. | β2 | β3 | f3(L1...2)/mm | f3(L1...2)/mm | AS-IS/TT | CRA(M)/° |
|---|---|---|---|---|---|---|
| 2 | 0.868 | 0.168 | −150.018 | | 0.172 | 61.23 |
| 4 | 0.942 | 0.166 | −212.248 | | 0.104 | 62.77 |
| 7 | 0.869 | 0.171 | | −441.036 | 0.146 | 61.08 |
| 9 | 0.969 | 0.168 | | −388.381 | 0.123 | 62.95 |
| 10 | 0.960 | 0.154 | | −274.736 | 0.128 | 62.27 |
| 11 | 1.009 | 0.147 | | −249.046 | 0.137 | 64.57 |
| 12 | 1.286 | 0.122 | | −247.036 | 0.118 | 70.75 |
| 13 | 1.190 | 0.117 | | −712.866 | 0.100 | 68.88 |
| 14 | 1.045 | 0.126 | −114.534 | | 0.097 | 69.2 |
| 15 | 1.044 | 0.129 | −368.766 | | 0.101 | 69.3 |
| 16 | 0.991 | 0.134 | −430.318 | | 0.095 | 71.21 |

TABLE 21

| Fig. | K7 | K7a | $DIA_{31}/DIA_{AS}$ | K9 | K10 | K11 | CBA1/° | CBA3/° | $DIA_{AS}/DIA_{P1}$ |
|---|---|---|---|---|---|---|---|---|---|
| 2 | Y | Y | 0.833 | Y | Y | N | 4.62 | 7.45 | 2.135 |
| 4 | Y | Y | 1.050 | Y | Y | N | 2.17 | 7.17 | 1.448 |
| 7 | N | Y | 0.709 | Y | Y | Y | 1.08 | 0.88 | 3.349 |
| 9 | N | Y | 0.792 | Y | Y | Y | 1.32 | 1.04 | 2.837 |
| 10 | N | Y | 0.746 | Y | Y | N | 3.49 | 1.68 | 2.539 |
| 11 | N | Y | 0.789 | Y | Y | N | 3.25 | 1.09 | 2.534 |
| 12 | N | Y | 0.746 | Y | Y | Y | 7.11 | 1.42 | 3.086 |
| 13 | N | Y | 0.758 | Y | Y | Y | 5.29 | 1.62 | 2.188 |
| 14 | Y | Y | 0.667 | Y | Y | Y | 4.04 | 4.75 | 2.007 |
| 15 | Y | Y | 0.695 | Y | Y | Y | 5.28 | 2.80 | 2.353 |
| 16 | Y | Y | 0.722 | Y | Y | Y | 6.60 | 2.29 | 1.950 |

The invention claimed is:

1. A catadioptric projection objective for imaging a pattern provided in an object plane of the projection objective onto an image plane of the projection objective comprising:
   a first objective part to image the pattern provided in the object plane to a first intermediate image, wherein all of the elements in the first objective part having optical power to image the pattern provided in the object plane to the first intermediate image are refractive elements;
   a second objective part that comprises at least one concave mirror to image the first intermediate image to a second intermediate image; and
   a third objective part to image the second intermediate image to the image plane, wherein all of the elements in the third objective part having optical power to image the second intermediate image to the image plane are refractive elements;
   wherein the third objective part comprises at least two negative lenses,
   wherein two of the negative lenses each have a concave surface facing the image plane,
   wherein an aperture stop is positioned in the third objective part,
   wherein there are no more than four lenses in the third objective part between the aperture stop and the image plane, and
   wherein the projection objective has an image-side numerical aperture NA of at least 1.2 when water is used as an immersion fluid between the third objective part and the image plane.

2. The catadioptric projection objective of claim 1, wherein all of the lenses in the third objective part between the aperture stop and the image plane are positive lenses.

3. The catadioptric projection objective of claim 1, wherein the two negative lenses each having the concave surface facing the image plane are adjacent one another.

4. The catadioptric projection objective of claim 1, wherein the third objective part comprises three negative lenses.

5. The catadioptric projection objective of claim 1, wherein there are no more than three lenses between the aperture stop and the image plane.

6. The catadioptric projection objective of claim 1, wherein the projection objective is configured for use at 193 nm.

7. The catadioptric projection objective of claim 1, wherein the third objective part comprises a double asphere formed by adjacent aspheric surfaces on consecutive lenses in the third objective part.

8. The catadioptric projection objective of claim 1, wherein the projection objective has an image-side numerical aperture NA of at least 1.3 when water is used as an immersion fluid between the third objective part and the image plane.

9. The catadioptric projection objective of claim 1, wherein the second objective part comprises two concave mirrors.

10. A catadioptric projection exposure system for microlithography comprising an illumination system and the projection objective as claimed in claim 1.

11. A catadioptric projection objective for imaging a pattern provided in an object plane of the projection objective onto an image plane of the projection objective comprising:
   a first objective part to image the pattern provided in the object plane to a first intermediate image, wherein all of the elements in the first objective part having optical power to image the pattern provided in the object plane to the first intermediate image are refractive elements;
   a second objective part that comprises at least one concave mirror to image the first intermediate image to a second intermediate image, wherein each concave mirror has a continuous surface positioned for imaging the first intermediate image to the second intermediate image without a pupil obscuration; and
   a third objective part to image the second intermediate image to the image plane, wherein all of the elements in the third objective part having optical power to image the second intermediate image to the image plane are refractive elements;

wherein the catadioptric projection objective comprises a double asphere formed by adjacent aspheric surfaces on consecutive lenses, and wherein the projection objective has an image-side numerical aperture NA of at least 1.2 when water is used as an immersion fluid between the third objective part and the image plane.

12. The catadioptric projection objective according to claim 11, wherein an axial distance between the adjacent aspheric surfaces is smaller than an axial thickness of a thinner of the two consecutive lenses forming the double asphere.

13. The catadioptric projection objective according to claim 11, wherein the double asphere is in the third objective part.

14. The catadioptric projection objective of claim 13, wherein the double asphere is positioned optically between the second intermediate image and the pupil surface of the third objective part.

15. The catadioptric projection objective of claim 11, wherein the double asphere is in the first objective part.

16. The catadioptric projection objective of claim 11, further comprising a second double asphere formed by adjacent aspheric surfaces on another pair of consecutive lenses.

17. The catadioptric projection objective of claim 16, wherein the first double asphere is in the third objective part and the second double asphere is in the first objective part.

18. The catadioptric projection objective of claim 11, wherein the projection objective has an image-side numerical aperture NA of at least 1.3 when water is used as an immersion fluid between the third objective part and the image plane.

19. A catadioptric projection exposure system for microlithography comprising an illumination system and the projection objective as claimed in claim 11.

20. The catadioptric projection objective of claim 1, wherein the first and third objectives share a common optical axis.

21. The catadioptric projection objective of claim 20, wherein the concave mirror has a continuous surface positioned on one side of the common optical axis.

22. A catadioptric projection objective of claim 1, wherein each concave mirror has a continuous surface positioned for imaging the first intermediate image to the second intermediate image without a pupil obscuration.

23. A catadioptric projection objective for imaging a pattern provided in an object plane of the projection objective onto an image plane of the projection objective comprising:

a first objective part to image the pattern provided in the object plane to a first intermediate image, wherein all of the elements in the first objective part having optical power to image the pattern provided in the object plane to the first intermediate image are refractive elements;

a second objective part that comprises at least one concave mirror to image the first intermediate image to a second intermediate image; and a third objective part to image the second intermediate image to the image plane, wherein all of the elements in the third objective part having optical power to image the second intermediate image to the image plane are refractive elements;

wherein the third objective part comprises at least three negative lenses, and wherein two of the negative lenses in the third objective part are adjacent one another, and wherein the projection objective has an image-side numerical aperture NA of at least 1.2 when water is used as an immersion fluid between the third objective part and the image plane.

24. The catadioptric projection objective of claim 23, wherein the two negative lenses that are adjacent one another each have a concave surface facing the image plane.

25. The catadioptric projection objective of claim 24, wherein an aperture stop is positioned in the third objective part, and wherein there are no more than four lenses in third objective part between the aperture stop and the image plane.

26. The catadioptric projection objective of claim 25, wherein all of the lenses in the third objective part between the aperture stop and the image plane are positive lenses.

27. The catadioptric projection objective of claim 26, wherein the projection objective is configured for use at 193 nm and has an image-side numerical aperture NA of at least 1.3 at 193 nm when water is used as an immersion fluid between the third objective part and the image plane.

28. A catadioptric projection objective of claim 27, wherein each concave mirror has a continuous surface positioned for imaging the first intermediate image to the second intermediate image without a pupil obscuration.

29. The catadioptric projection objective of claim 28, wherein the first and third objectives share a common optical axis, wherein the continuous surface of each concave mirror is positioned on one side of the common optical axis for imaging the first intermediate image to the second intermediate image without a pupil obscuration.

30. A catadioptric projection exposure system for microlithography comprising an illumination system and the projection objective as claimed in claim 29.

* * * * *

UNITED STATES PATENT AND TRADEMARK OFFICE
CERTIFICATE OF CORRECTION

PATENT NO. : 8,908,269 B2
APPLICATION NO. : 14/143060
DATED : December 9, 2014
INVENTOR(S) : David R. Shafer et al.

It is certified that error appears in the above-identified patent and that said Letters Patent is hereby corrected as shown below:

On the Title Page, References Cited

Page 7

Column 1 (Other Publications), Line 15, delete "thermanl" and insert -- thermal --

Column 2 (Other Publications), Line 27, delete "Microlithogtaphy,"" and insert -- Microlithography," --

Column 2 (Other Publications), Line 43, delete "(2002," and insert -- (2002), --

Column 2 (Other Publications), Line 62, delete "Curcuit Appel" and insert -- Circuit Appeal --

Page 8

Column 1 (Other Publications), Line 38, delete "Relatred" and insert -- Related --

Column 1 (Other Publications), Line 45, delete "Stanidng" and insert -- Standing --

Page 12

Column 1 (Other Publications), Line 62, delete "tiled" and insert -- filed --

Column 2 (Other Publications), Line 6, delete "1PR2013" and insert -- IPR2013 --

Column 2 (Other Publications), Line 26, delete "1PR2013" and insert -- IPR2013 --

Page 13

Column 1 (Other Publications), Line 3, delete "1PR2013" and insert -- IPR2013 --

Column 1 (Other Publications), Line 28, delete "C.P.R." and insert -- C.F.R. --

In the Specification

Column 1

Line 23 (Approx.), delete "2003," and insert -- 2004, --

Column 2

Line 49 (Approx.), delete "2002/00241" and insert -- 2002/0024741 --

Signed and Sealed this
Twenty-first Day of April, 2015

Michelle K. Lee
*Director of the United States Patent and Trademark Office*

Column 3

Line 65, delete "(so-callles" and insert -- (so-called --

Column 7

Line 51, delete "$N1_L<5$" and insert -- $N1_L \leq 5$ --

Column 8

Line 51, delete "surface" and insert -- surface. --

Column 9

Line 37-38 (Approx.), delete "invention;" and insert -- invention; and --

Column 10

Line 54, delete "piano-convex" and insert -- plano-convex --

Column 14

Line 10, delete "doublett" and insert -- doublet --

Line 23, delete "doublett" and insert -- doublet --

Line 29, delete "doublett" and insert -- doublet --

Column 15

Line 56, delete "7aspheric" and insert -- 7 aspheric --

Column 16

Line 25, delete "piano-convex" and insert -- plano-convex --

Column 18

Line 3, delete "on" and insert -- one --

Line 21, delete "OP 3" and insert -- OP3 --

Lines 66-67, delete the paragraph "This condition is fulfilled for … K10 in table 21." and insert the same on Col. 18, Line 65, as the continuation of the same paragraph Column 31

Line 6 (Approx.), Table 11, delete "H20" and insert -- H2O --